(12) United States Patent
Berdan et al.

(10) Patent No.: US 12,164,981 B2
(45) Date of Patent: Dec. 10, 2024

(54) COMPUTATION SYSTEM WITH A PLURALITY OF COMPARATORS AND A GLOBAL CIRCUIT

(71) Applicant: Kioxia Corporation, Tokyo (JP)

(72) Inventors: Radu Berdan, Shinagawa (JP); Daisuke Miyashita, Kawasaki (JP); Jun Deguchi, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 945 days.

(21) Appl. No.: 17/198,448

(22) Filed: Mar. 11, 2021

(65) Prior Publication Data

US 2022/0083846 A1  Mar. 17, 2022

(30) Foreign Application Priority Data

Sep. 16, 2020 (JP) ................. 2020-155449

(51) Int. Cl.
*G06G 7/16* (2006.01)
*G06F 7/544* (2006.01)

(52) U.S. Cl.
CPC ............ *G06G 7/16* (2013.01); *G06F 7/5443* (2013.01)

(58) Field of Classification Search
CPC .. G06G 7/16–163; G06G 7/19; G06G 7/1928; G06G 7/22; G06F 7/5443; G06F 9/3893; G06F 2207/4806–4808; G06F 2207/4814
See application file for complete search history.

(56) References Cited

U.S. PATENT DOCUMENTS

| | | | |
|---|---|---|---|
| 10,312,932 B2 * | 6/2019 | Nakamura | ............ H03M 1/462 |
| 2015/0347896 A1 | 12/2015 | Roy et al. | |
| 2017/0169327 A1 | 6/2017 | Nestler et al. | |
| 2021/0271959 A1 * | 9/2021 | Chettuvetty | .......... G06F 7/5443 |
| 2022/0066740 A1 * | 3/2022 | Radhadevi | ............... G06G 7/16 |
| 2022/0276835 A1 * | 9/2022 | Yang | ...................... H03M 1/466 |
| 2022/0351761 A1 * | 11/2022 | Yang | ...................... H03M 1/468 |
| 2023/0185529 A1 * | 6/2023 | Berdan | .................... G06F 7/523 |
| | | | 708/200 |
| 2023/0315388 A1 * | 10/2023 | Singh | ...................... G06F 17/16 |
| | | | 708/523 |

FOREIGN PATENT DOCUMENTS

| | | |
|---|---|---|
| JP | 2019-504400 A | 2/2019 |
| JP | 2019-047339 A | 3/2019 |
| JP | 2019-086464 A | 6/2019 |
| WO | WO 2017/106464 A1 | 6/2017 |

* cited by examiner

*Primary Examiner* — Matthew D Sandifer
(74) *Attorney, Agent, or Firm* — Oblon, McClelland, Maier & Neustadt, L.L.P.

(57) ABSTRACT

According to one embodiment, in a processing circuit of a computation system, a plurality of comparators corresponds to the respective columns, each including a first input node, a second input node, and an output node, the first input node receiving any one of the second signals, the second input node receiving a signal corresponding to a global reference signal provided to each second input node, the output node outputting a local signal. A global circuit is provided common to the plurality of comparators, the global circuit generating a global signal according to a plurality of the local signals, the global circuit generating the global reference signal by an SAR method according to the global signal. The processing circuit disables some of the plurality of comparators according to the local signals and the global signal.

20 Claims, 30 Drawing Sheets

COMPUTATION SYSTEM WITH A PLURALITY OF COMPARATORS AND A GLOBAL CIRCUIT

CROSS-REFERENCE TO RELATED APPLICATIONS

This application is based upon and claims the benefit of priority from Japanese Patent Application No. 2020-155449, filed on Sep. 16, 2020; the entire contents of which are incorporated herein by reference.

FIELD

Embodiments described herein relate generally to a computation system.

BACKGROUND

A computation system using a neural network may be configured by using a product-sum computation circuit using a plurality of resistive random access memories and a circuit that processes an output of the product-sum computation circuit. At this time, it is desirable to reduce a circuit area and power consumption.

DETAILED DESCRIPTION

In general, according to one embodiment, there is provided a computation system including a plurality of multiplication elements, a plurality of addition elements, and a processing circuit. The plurality of multiplication elements is configured to arrange so as to form a plurality of rows and a plurality of columns, and to multiply a plurality of first signals by weights to generate a plurality of calculation results. The plurality of addition elements is configured to calculate a sum of calculation results of each column among the plurality of calculation results for each of the plurality of columns to generate a plurality of second signals. The processing circuit is configured to receive the plurality of second signals generated by the addition elements and to extract values corresponding to some of the plurality of second signals. The processing circuit includes a plurality of comparators, and a global circuit. The plurality of comparators corresponds to the respective columns, each including a first input node, a second input node, and an output node, the first input node receiving any one of the second signals, the second input node receiving a signal corresponding to a global reference signal provided to each second input node, the output node outputting a local signal. The global circuit is provided common to the plurality of comparators, the global circuit generating a global signal according to a plurality of the local signals, the global circuit generating the global reference signal by an SAR (Successive Approximation Register) method according to the global signal. The processing circuit disables some of the plurality of comparators according to the local signals and the global signal.

Exemplary embodiments of a computation system will be explained below in detail with reference to the accompanying drawings. The present invention is not limited to the following embodiments.

First Embodiment

Figure 1:
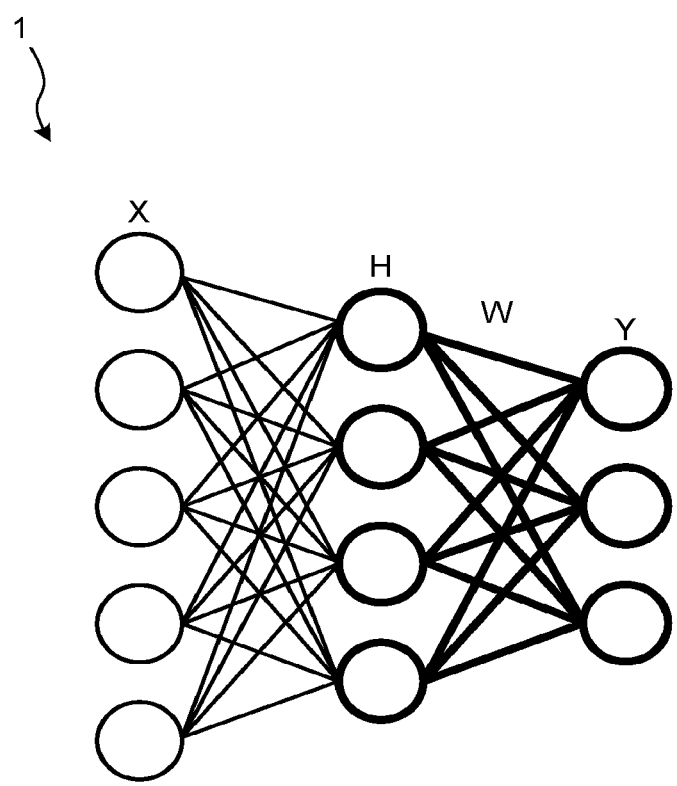
FIG. 1 is a diagram illustrating a schematic configuration of a neural network according to a first embodiment.

A computation system 1 according to a first embodiment includes, for example, a circuit that performs a part of processing of a neural network. As illustrated in FIG. 1, the neural network includes a plurality of intermediate layers H between an input layer X and an output layer Y. FIG. 1 is a diagram illustrating a schematic configuration of the neural network of which a part of the processing is performed by the computation system 1. In FIG. 1, the intermediate layer H is illustrated as one layer for simplification. As illustrated in FIG. 1, signals from a plurality of neurons in the intermediate layer H (all neurons in FIG. 1) are input to each neuron in the output layer Y, and processings are performed. The processings in the respective neurons are performed in parallel. A specific computation performed in the series of processings is performed to obtain, for example, a product of a vector and a matrix. Further, in the neural network, the maximum value computation may be performed to search for the maximum value among values calculated by a plurality of neurons in a certain layer.

Figure 2:
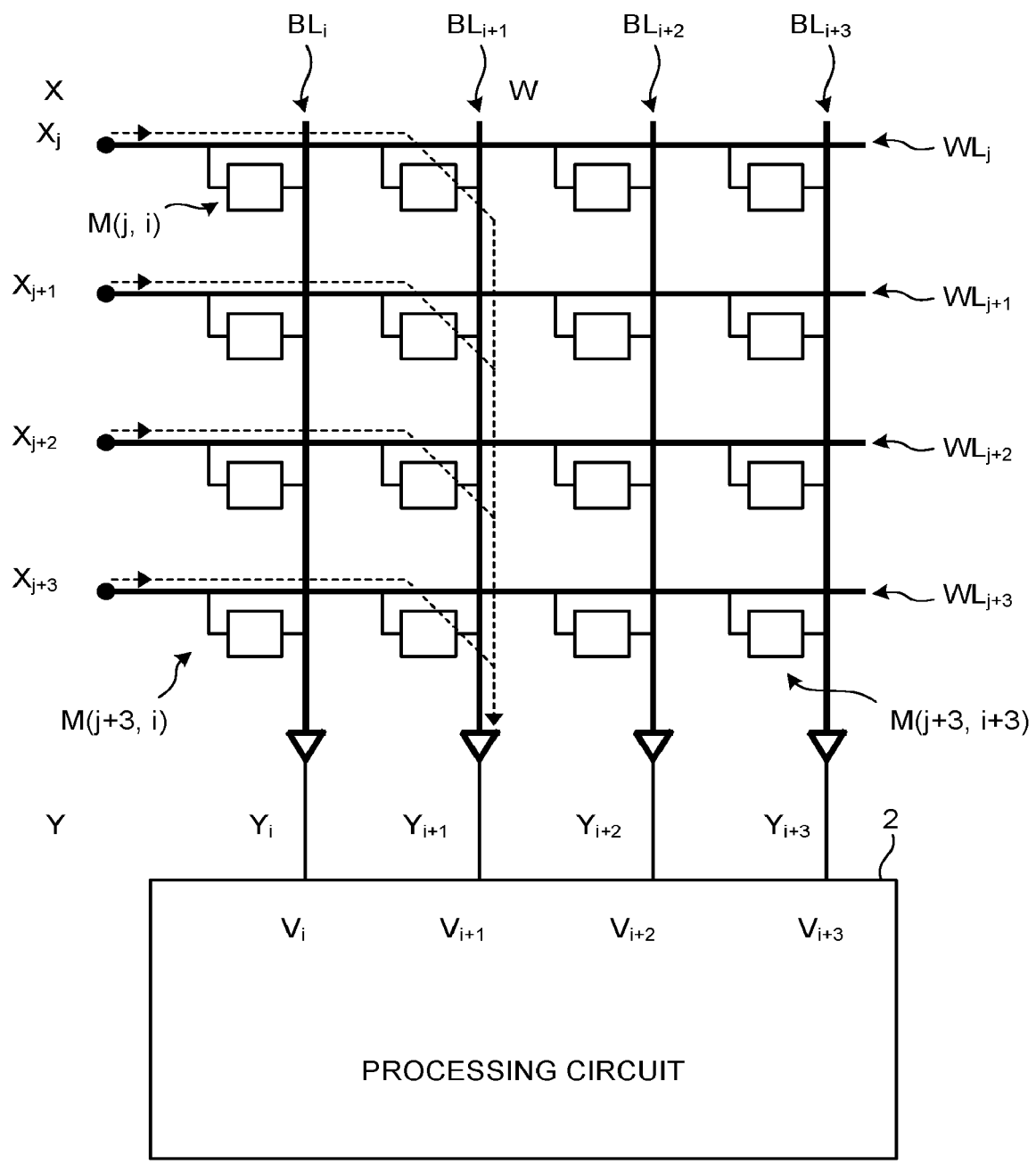
FIG. 2 is a diagram illustrating a specific configuration of a computation system according to the first embodiment.

FIG. 2 is a diagram illustrating a specific configuration of the computation system 1 according to the present embodiment. The computation system 1 according to the present embodiment performs calculations in a plurality of neurons in a certain layer in the neural network in parallel, and performs processing of searching for a value satisfying a certain condition among the calculated values. The calculations in a plurality of neurons in a certain layer in the neural network can be implemented by a crossbar array of a plurality of multiplication elements as illustrated in FIG. 2, and activation of neuron data can be computed with a physical signal.

In the computation system 1 illustrated in FIG. 2, a plurality of resistive random access memories $M(j,i)$ to $M(j+3,i+3)$ are disposed at positions where a plurality of word lines WLj to WLj+3 and a plurality of bit lines BLi to BLi+3 intersect. Note that FIG. 2 illustrates four rows and four columns, which are only a part of an array including more than four rows and four columns. Here, i and j are arbitrary natural numbers, and i to i+3 rows and j to j+3 columns are illustrated. The respective resistive random access memories $M(j,i)$ to $M(j+3,i+3)$ function as multiplication elements that multiply received signals by weights $W_{j,i}$ to $W_{j+3,i+3}$ to generate multiplication result signals. Each of the resistive random access memories $M(j,i)$ to $M(j+3,i+3)$ has one end connected to the word line WL and the other end connected to the bit line BL, and resistance states of the resistive random access memories $M(j,i)$ to $M(j+3,i+3)$ may be set to resistance values corresponding to the weights $W_{j,i}$ to $W_{i+3,i+3}$, respectively. A weight matrix W may be regarded as a matrix having the weight $W_{j,i}$ as an element. Although a case where the multiplication element is a resistive random access memory is illustrated in FIG. 2, the multiplication element may be any memory element (for example, a bit cell of a static random access memory (SRAM)) that is capable of multiplying a signal by a weight.

As indicated by a dotted arrow in FIG. 2, word line voltages $X=(X_j, X_{j+1}, X_{j+2}, $ and $X_{j+3})$ are applied as input activation signals to the plurality of resistive random access memories $M(j,i)$ to $M(j+3,i+3)$ in parallel. Bit line currents $Y=(Y_i, Y_{i+1}, Y_{i+2}, $ and $Y_{i+3})$ obtained by multiplying the word line voltages $X=(X_j, X_{j+1}, X_{j+2}, $ and $X_{j+3})$ by the weights W and summing the products for each column are supplied to a processing circuit 2. The respective bit lines BLi to BLi+3 function as addition elements that add signals of a plurality of resistive random access memories M arranged in a column direction. A resistance value is written in the resistive random access memory M according to a voltage (set voltage or reset voltage) applied across the resistive random access memory M in advance. The weight W depends on the resistance value written in the resistive random access memory M in advance. The vector Y represents a product-sum computation result of the vector X×the matrix W (Y=X*W). The bit line currents Y as the product-sum computation results correspond to analog voltages $V=(V_i, V_{i+1}, V_{i+2}, $ and $V_{i+3})$ stored in input nodes for the processing circuit 2. In the processing circuit 2, the analog voltage V is AD-converted to a digital value in the processing circuit 2 for each column. A result of the AD conversion is computed so as to search for the maximum value among activation values of the respective columns.

In the computation system having such a configuration, as an implementation for the processing circuit, the following implementation using an AD converter for each column may be considered.

In a neural network in which weights are represented by a matrix of memory elements, an input vector X represents an activation value of an input. An output vector Y represents an output neuron activation value. For example, in the final layer of a classification task, the purpose is to search for a maximum activation value among a plurality of activation values in the output. As another example, in a configuration called an attention mechanism, the purpose is to search for the maximum value or top K values among a plurality of activation values in the output. These examples are usually implemented by digitizing each output neuron activation value and searching for the maximum value or top K values among the plurality of digitized values.

Such an implementation has, for example, the following problems (1) and (2).

(1) Since signals of each column are AD-converted with high resolution by a large number of AD converters, a large amount of power may be consumed. In addition, a maximum value calculation unit is required to search for the maximum value and top K values.

(2) A large circuit area may be occupied by a large number of AD converters. Usually, a number of AD converters are disposed around a memory array having a smaller circuit area, and it is difficult to implement the AD converters in a compact area.

On the other hand, as an implementation for the processing circuit, an implementation using a winner-take-all (WTA) circuit may be considered. Such processing circuit searches for the maximum value in an analog domain via the WTA circuit. The implementation using the WTA circuit may simplify the circuit configuration and reduce the circuit area as compared with the implementation using the AD converter for each column, but the resolution and operation speed tend to be low.

Further, as an implementation for the processing circuit, an implementation using a single-slope (SS) type AD converter may be considered. The implementation using the SS type AD converter may simplify the circuit configuration and reduce the circuit area as compared with the implementation using the AD converter for each column, but there is a great restriction in timing for searching for the maximum value, and the operation speed tends to be low.

In a computation system, it is desirable to implement a processing circuit that may reduce the circuit area and power consumption and increase the operation speed.

Therefore, in the present embodiment, the processing circuit 2 of the computation system 1 may be configured to perform a plurality of SAR type AD conversion processings while using a common DA conversion unit and disabling some of the plurality of comparators according to an AD conversion result. As a result, the circuit area and power consumption may be reduced and the operation speed may be increased.

Specifically, the processing circuit 2 of the computation system 1 performs a selective AD conversion operation, in which the number of comparators to be operated is gradually reduced while generating a common reference voltage by using a common DA conversion unit from the vectors such as electric signals (voltage or current), and searches for the maximum value, top K electric signals, the minimum value, or bottom K electric signals. That is, since the common DA conversion unit is used, the circuit configuration may be simplified and the circuit area may be reduced as compared with the implementation using the AD converter for each column. In addition, since the number of comparators to be operated is gradually reduced, and the selective AD conversion operation is performed, power consumption may be reduced as compared with the implementation using the AD converter for each column. In addition, since the processing circuit 2 of the computation system 1 performs a plurality of SAR type AD conversion processings in parallel on a plurality of input signals from resistive random access memories of a plurality of columns by applying binary search, to search for the maximum value, top K values, the minimum value, or bottom K values in parallel, it is possible to easily increase the operation speed. Therefore, the circuit area and power consumption may be reduced and the operation speed can be increased.

Figure 3:
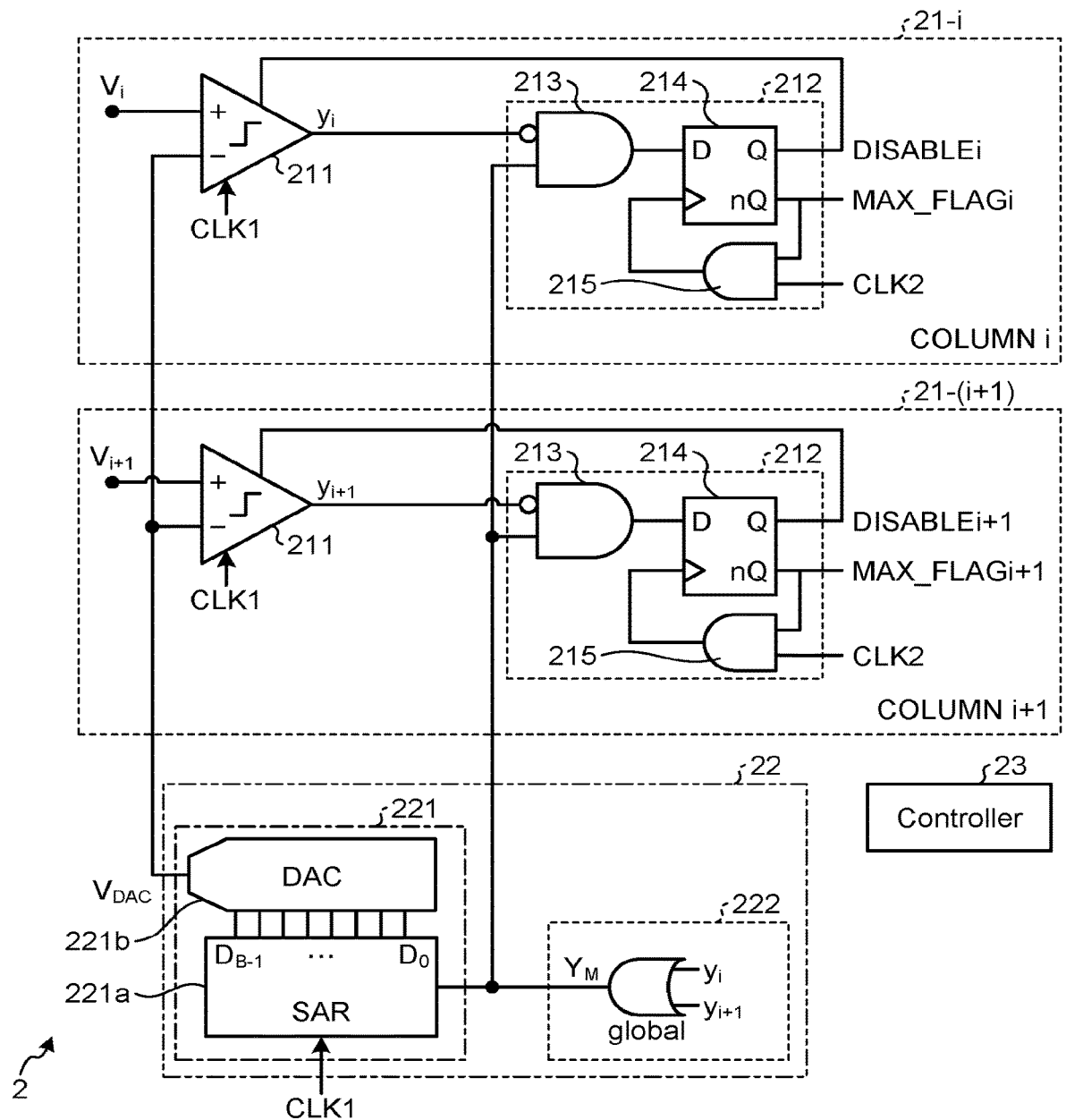
FIG. 3 is a circuit diagram illustrating a configuration of a processing circuit (SARMAX circuit) in the first embodiment.

More specifically, the processing circuit 2 of the computation system 1 can be configured as illustrated in FIG. 3. The processing circuit 2 is a circuit that searches for the maximum value while performing the SAR type AD conversion processing, and may be called a SARMAX circuit. FIG. 3 is a circuit diagram illustrating a configuration of the processing circuit (SARMAX circuit) 2 in the first embodiment.

The processing circuit 2 performs a plurality of SAR type AD conversion processings in parallel on signals corresponding to product-sum calculation results of a plurality of columns received from a plurality of product-sum computation circuits, to search for a signal with the maximum level among the signals in parallel. The processing circuit 2 has a configuration in which a bit string to be converted is converted to the maximum value by a logic circuit implemented for each column, and a configuration in which a DA conversion unit is shared for a plurality of columns.

FIG. 3 illustrates a basic concept of the processing circuit 2. The processing circuit 2 includes a plurality of local circuits 21-$i$ and 21-($i$+1), a global circuit 22, and a controller 23. The global circuit 22 includes a global SAR DAC 221 and a global OR gate 222.

FIG. 3 illustrates, for simplification of illustration, the local circuit 21-$i$ in an i-th column and the local circuit 21-($i$+1) in an i+1 column, but the processing circuit 2 may include an arbitrary number of local circuits, the number of which corresponds to the number of columns of the array of the multiplication elements M.

The local circuit 21 of each column includes a comparator 211 and a logic circuit 212. The logic circuit 212 includes an AND gate 213, a flip-flop 214, and an AND gate 215. The local circuit 21 of each column has the same configuration.

The comparator 211 compares an input signal $V_i$ or $V_{i+1}$ with a global reference signal $V_{DAC}$ supplied by the global SAR DAC 221. The comparator 211 outputs a binarized (L/H or 0/1) local signal $y_i$ or $y_{i+1}$ as a comparison result according to a clock CLK1.

The AND gate 213 computes the logical product of a signal obtained by logically inverting the local signal $y_i$ or $y_{i+1}$ and a global signal $Y_M$, and outputs the computation result to the flip-flop 214. The AND gate 215 computes the logical product of a maximum value flag MAX_FLAG$_i$ or MAX_FLAG$_{i+1}$ and a clock CLK2, and outputs the computation result as a clock signal to the flip-flop 214. The flip-flop 214 receives the computation result of the AND gate 213 at a data input terminal D, and receives the computation result of the AND gate 215 at a clock input terminal.

The flip-flop 214 outputs, from an inverting output terminal nQ, the maximum value flag MAX_FLAG$_i$ or MAX_FLAG$_{i+1}$ indicating whether or not the signal $V_i$ or $V_{i+1}$ of a corresponding column among input signals of a plurality of columns is a signal candidate with the maximum level. The flip-flop 214 may be a latch circuit. In a case where the signal $V_i$ or $V_{i+1}$ of the corresponding column is not a signal with the maximum level, the flip-flop 214 outputs a disable signal DISABLE$_i$ or DISABLE$_{i+1}$ for disabling the comparator 211 from a non-inverting output terminal Q. The disable signals DISABLE$_i$ and DISABLE$_{i+1}$ may be used to limit (power gating) power consumed by the plurality of comparators 211 during SAR operation performed by the processing circuit 2.

The flip-flop 214 is operated in synchronization with the clock signal output from the AND gate 215. The AND gate 215 is provided to limit (clock gating) the clock CLK2 so as not to change the state of the disable signal DISABLE$_i$ or DISABLE$_{i+1}$ in a case where the maximum value flag MAX_FLAG$_i$ or MAX_FLAG$_{i+1}$ is at an L level. That is, in a case where a maximum value flag MAX_FLAG of a flip-flop 214 of a column in which the comparator 211 is disabled is at the L level, the clock signal received at the clock input terminal is fixed at the L level. Therefore, disable signal DISABLE is maintained at an H level, and the maximum value flag MAX_FLAG is maintained at the L level.

Inverting input terminals (−) of the comparators 211 in the respective columns are driven in parallel by the global SAR DAC 221, and signals are sequentially processed from the most significant bit (MSB) to the least significant bit (LSB) according to an SAR algorithm. The global SAR DAC 221 includes a global SAR register 221$a$ and a global DAC 221$b$. The global SAR register 221$a$ is a shift register including a plurality of stages of registers (for example, B stages, in which B is an arbitrary integer of 1 or more), and shifts an input value and a value of each stage in synchronization with the clock CLK1. The global SAR register 221a is configured to store "1" as an initial value in a register of the highest stage at the time of activation. The global DAC 221b receives the value of each stage of the shift register, performs DA conversion, and outputs, as the global reference signal $V_{DAC}$, an analog voltage after the conversion.

An input that determines SAR transition in the global SAR register 221a is driven by the global OR gate 222. The global OR gate 222 uses the local signals $y_i$ and $y_{i+1}$ output from the comparators 211 of the respective columns as inputs to compute the logical sum of the local signals $y_i$ and $y_{i+1}$ of the respective columns, generates the global signal $Y_M$ as a computation result, and supplies the global signal $Y_M$ to the global SAR register 221a and the AND gate 213 of each column.

The controller 23 may be a local controller individually provided in each column, or may be a global controller provided common to the respective columns. FIG. 3 illustrates a case where the controller 23 is a global controller. The controller 23 controls processing related to timing, reset, and state transition. For example, the controller 23 generates the clock CLK1 and supplies the clock CLK1 to the comparator 211 of each column and the global SAR register 221a. The controller 23 generates the clock CLK2 and supplies the clock CLK2 to the AND gate 215 of each column. The clock CLK2 is a clock obtained by logically inverting the clock CLK1.

Figure 4:
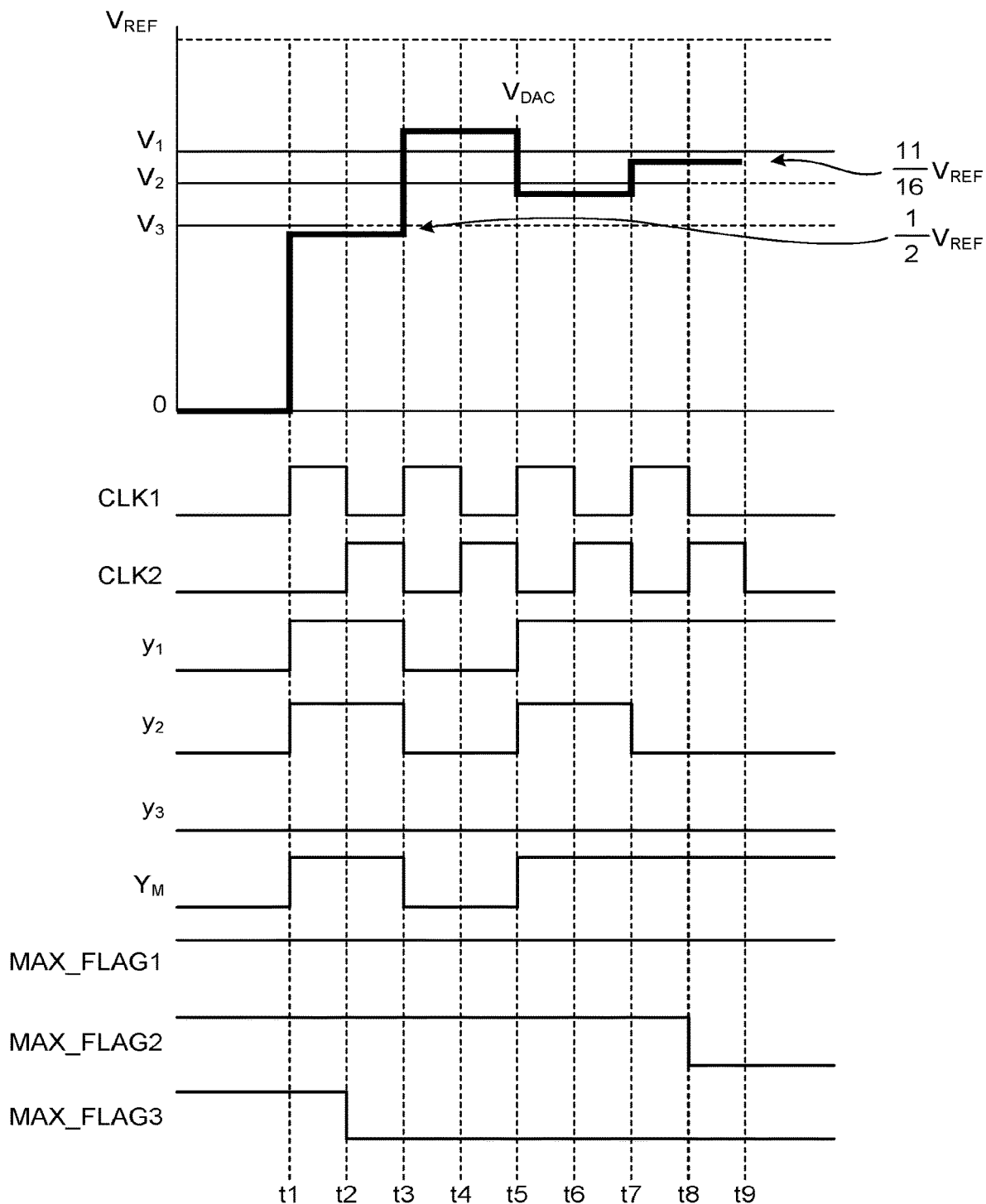
FIG. 4 is a waveform diagram illustrating an operation of the processing circuit (SARMAX circuit) in the first embodiment.

Next, an operation of the processing circuit 2 will be described with reference to FIG. 4. FIG. 4 is a waveform diagram illustrating the operation of the processing circuit 2. FIG. 4 illustrates an operation in which the processing circuit 2 that receives signals $V_1$ to $V_3$ of first to third columns searches for the maximum value while performing AD conversion with a precision of four bits. The waveform of a bold line illustrated at the top of FIG. 4 indicates a change of the global reference signal $V_{DAC}$ over time, and a vertical axis represents the magnitude of the voltage. FIG. 4 illustrates a case where the minimum value of the global reference signal $V_{DAC}$ is 0 and the maximum value of the global reference signal $V_{DAC}$ is $V_{REF}$.

In a period before a timing t1, the flip-flops 214 of the respective columns (first to third columns) are in a reset state, and output, as initial values, the maximum value flag MAX_FLAG$_i$=1 and DISABLE$_i$=0 (i=1 to 3).

A word D={0} is loaded to the registers of the respective stages (first to B-th stages) of the global SAR register 221a, and the global reference voltage $V_{DAC}$ =0 is output. In this state, the computation operation of the processing circuit 2 is started.

Here, the comparator 211 of each column individually compares the signal $V_i$ (i=1 to 3) with the global reference voltage $V_{DAC}$ from the global SAR DAC 221. In the comparator 211 of each column, a non-inverting input terminal (+) is connected to the bit line BL (see FIG. 2), the inverting input terminal (−) is connected to the global SAR DAC 221, and an output terminal is connected to the AND gate 213 and the global OR gate 222. The comparator 211 of each column receives the signal $V_i$ at the non-inverting input terminal (+) and receives the global reference voltage $V_{DAC}$ at the inverting input terminal (−), and thus, in a case where the signal $V_i$ is higher than the global reference voltage $V_{DAC}$, the local signal $y_i$=1 is output, and in a case where the signal $V_i$ is lower than the global reference voltage $V_{DAC}$, the local signal $y_i$=0 is output. The global OR gate 222 generates and outputs the global signal $Y_M$ according to the local signals $y_i$ from all active comparators 211. The global OR gate 222 outputs $Y_M$=1 in a case where at least one local signal $y_i$ is 1, and outputs $Y_M$=0 in a case where all local signals $y_i$ are 0.

At the rising edge timing t1 of the clock CLK1, the global SAR register 221a is activated, "1" is stored in the register of the first stage, and "0" is stored in the registers of the second to last stages. The global DAC 221b performs SAR DA conversion shown in Math. 1, and generates the global reference voltage $V_{DAC}$=$V_{REF}$/2 corresponding to a case where the most significant bit $D_{B-1}$ is 1 ($D_{B-1}$=1) and other bits $D_{B-2}$ to $D_0$ are all 0. In Math. 1, B is a parameter indicating which cycle the present cycle is. The present cycle is the first cycle, and in a case where B=1 in Math. 1, SAR(D)=$V_{REF}$/2. The global reference voltage $V_{DAC}$=$V_{REF}$/2 is an intermediate value between the minimum value of 0 and the maximum value of $V_{REF}$ in a fluctuation range of the global reference voltage. The comparators 211 of the respective columns compare the signals $V_1$, $V_2$, and $V_3$ with the reference voltage $V_{DAC}$=$V_{REF}$/2. Since the levels of the signals $V_1$ and $V_2$ of the first and second columns are both higher than $V_{REF}$/2, the comparators 211 of the first and second columns output the local signals $y_1$=1 and $y_2$=1 as the comparison results. Since the level of the signal $V_3$ of the third column is lower than $V_{REF}$/2, the comparator 211 of the third column outputs the local signal $y_3$=0 as the comparison result. Accordingly, the global OR gate 222 outputs the global signal $Y_M$=1.

$$SAR(D) = V_{REF} \sum_{b=0}^{B-1} \frac{1}{2^{(B-b)}} D_b \qquad \text{Math. 1}$$

Here, in the local circuit 21 of each column, the local signal $y_i$=1 output from the comparator 211 and the global signal $Y_M$=1 mean that the signal $V_i$ of the corresponding column may be the maximum value among the plurality of signals $V_1$ to $V_3$ to be compared. Accordingly, in the logic circuit 212, the flip-flop 214 maintains the output thereof at the original state at the next rising edge timing of the clock CLK2. That is, in a case where the maximum value flag MAX_FLAG$_i$=H (or 1), the flip-flop 214 maintains MAX_FLAG$_i$=H (or 1), and in a case where the disable signal DISABLE$_i$=L (or 0), the flip-flop 214 maintains the disable signal DISABLE$_i$=L (or 0).

Alternatively, in the local circuit 21 of each column, the local signal $y_i$=0 output from the comparator 211 and the global signal $Y_M$=1 mean that the signal $V_i$ of the corresponding column is clearly not the maximum value among the plurality of signals $V_1$ to $V_3$ to be compared. Accordingly, in the logic circuit 212, the flip-flop 214 changes the output thereof from the original state at the next rising edge timing of the clock CLK2. That is, in a case where the maximum value flag MAX_FLAG$_i$=H (or 1), the flip-flop 214 changes the maximum value flag to MAX_FLAG$_i$=L (or 0), and in a case where the disable signal DISABLE$_i$=L (or 0), the flip-flop 214 changes the disable signal to DISABLE$_i$=H (or 1). In a case where the maximum value flag MAX_FLAG$_i$=L (or 0), the clock CLK2 is not gated by the AND gate 215, and thus, each of a value of the maximum value flag MAX_FLAG$_i$ and a value of the disable signal DISABLE$_i$ is maintained. As a result, the comparator 211 receives the disable signal DISABLE$_i$=H (or 1), and the operation thereof is disabled, and power consumption by the comparator 211 is stopped (power gating) for the rest of the remaining conversion cycles.

Alternatively, in the local circuit 21 of each column, the local signal $y_i=0$ output from the comparator 211 and the global signal $Y_M=0$ mean that the signals are all lower than the global reference signal VDAC. In this case, whether or not the signal $V_i$ of the corresponding column is the maximum value among the plurality of signals $V_1$ to $V_3$ is difficult to be determined, and thus, the determination is suspended. Accordingly, in the logic circuit 212, the flip-flop 214 maintains the output thereof at the original state at the next rising edge timing of the clock CLK2. That is, in a case where the maximum value flag $MAX\_FLAG_i=H$ (or 1), the flip-flop 214 maintains $MAX\_FLAG_i=H$ (or 1), and in a case where the disable signal $DISABLE_i=L$ (or 0), the flip-flop 214 maintains the disable signal $DISABLE_i=L$ (or 0). That is, the local circuit 21 suspends the determination of whether or not the signal $V_i$ of the corresponding column is the maximum value, and waits for making the determination until the next bit conversion timing. Further, in a case where the maximum value flag $MAX\_FLAG_i=L$ (or 0), the flip-flop 214 maintains $MAX\_FLAG_i=L$ (or 0), and in a case where the disable signal $DISABLE_i=H$ (or 1), the flip-flop 214 maintains the disable signal $DISABLE_i=H$ (or 1). As a result, the operation of the comparator 211 continues to be disabled.

At a rising edge timing t2 of the clock CLK2, in the local circuits 21 of the first and second columns, since the local signals $y_1$ and $y_2$ output from the comparators 211 are 1 ($y_1=1$ and $y_2=1$) and the global signal $Y_M$ is 1 ($Y_M=1$), the flip-flops 214 maintain the outputs thereof at the original state. That is, the flip-flop 214 of the first column maintains the maximum value flag at $MAX\_FLAG_1=H$ (or 1) and maintains the disable signal at DISABLE=L (or 0). The flip-flop 214 of the second column maintains the maximum value flag at $MAX\_FLAG_2=H$ (or 1) and maintains the disable signal at $DISABLE_2=L$ (or 0). Meanwhile, in the local circuit 21 of the third column, since the local signal $y_3$ output from the comparator 211 is 0 ($y_3=0$) and the global signal $Y_M$ is 1 ($Y_M=1$), the flip-flop 214 changes the output thereof from the original state. That is, the flip-flop 214 changes the maximum value flag from $MAX\_FLAG_3=H$ (or 1) to $MAX\_FLAG_3=L$ (or 0) and changes the disable signal from $DISABLE_3=L$ (or 0) to $DISABLE_3=H$ (or 1).

As a result, after the timing t2, the comparator 211 of the third column receives the disable signal $DISABLE_i=H$ (or 1) and the operation thereof is disabled, and as indicated by a dotted line for the waveform of $V_3$ in FIG. 4, power consumption by the comparator 211 is stopped (power gating).

This cycle is repeated from the most significant bit MSB to the least significant bit LSB for the number of bits B (B=four bits in a case of FIG. 4) according to the precision of the conversion required in an application. That is, the same processings as those at the timings t1 and t2 are performed at timings t3 and t4, at timings t5 and t6, and at timings t7 and t8.

For example, at the rising edge timing t7 of the clock CLK1, the comparators 211 of the first and second columns compare the signals $V_1$ and $V_2$ with the reference voltage $V_{DAC}=11/16V_{REF}$. Since the level of the signal $V_1$ of the first column is higher than $11/16V_{REF}$, the comparator 211 of the first column outputs the local signal $y_1=1$ as the comparison result. Since the level of the signal $V_2$ of the second column is lower than $11/16V_{REF}$, the comparator 211 of the second column outputs the local signal $y_2=0$ as the comparison result. Accordingly, the global OR gate 222 outputs the global signal $Y_M=1$, and "1011" is stored in the global SAR register 221a. The global DAC 221b performs the SAR DA conversion shown in Math. 1 and maintains the global reference voltage $V_{DAC}=11/16V_{REF}$ corresponding to "1011".

At the rising edge timing t8 of the clock CLK2, in the local circuit 21 of the first column, since the local signal $y_1$ output from the comparator 211 is 1 ($y_1=1$) and the global signal $Y_M$ is 1 ($Y_M=1$), the flip-flop 214 maintains the output thereof at the original state. That is, the flip-flop 214 maintains the maximum value flag at $MAX\_FLAG_1=H$ (or 1) and maintains the disable signal at DISABLE=L (or 0). Meanwhile, in the local circuit 21 of the second column, since the local signal $y_2$ output from the comparator 211 is 0 ($y_2=0$) and the global signal $Y_M$ is 1 ($Y_M=1$), the flip-flop 214 changes the output thereof from the original state. That is, the flip-flop 214 changes the maximum value flag from $MAX\_FLAG_2=H$ (or 1) to $MAX\_FLAG_2=L$ (or 0) and changes the disable signal from $DISABLE_2=L$ (or 0) to $DISABLE_2=H$ (or 1). In the local circuit 21 of the third column, since the local signal $y_3$ is 0 ($y_3=0$), the global signal $Y_M$ is 1 ($Y_M=1$), and the maximum value flag $MAX\_FLAG_3$ is 0 ($MAX\_FLAG_3=0$), each of the value of the maximum value flag $MAX\_FLAG_i$ and the value of the disable signal $DISABLE_i$ is maintained.

As a result, after the timing t8, the comparator 211 of the second column receives the disable signal $DISABLE_2=H$ (or 1) and the operation thereof is disabled, and as indicated by a dotted line for the waveform of $V_2$ in FIG. 4, power consumption by the comparator 211 is stopped (power gating).

In a case where the number of bits according to the precision of the conversion is B, at a timing t9 after B cycles (four cycles in FIG. 4), the global SAR register 221a contains a digital value for a signal corresponding to the maximum value among the signals of all columns. The processing circuit 2 outputs ($MAX\_FLAG_1$, $MAX\_FLAG_2$, and $MAX\_FLAG_3$)=(H, L, and L) (or (1, 0, and 0)) as a maximum value search result. In this example, the maximum value search result indicates that the signal $V_1$ of the first column is found to be the maximum value among the signals $V_1$ to $V_3$ of the first to third columns.

Figure 5:
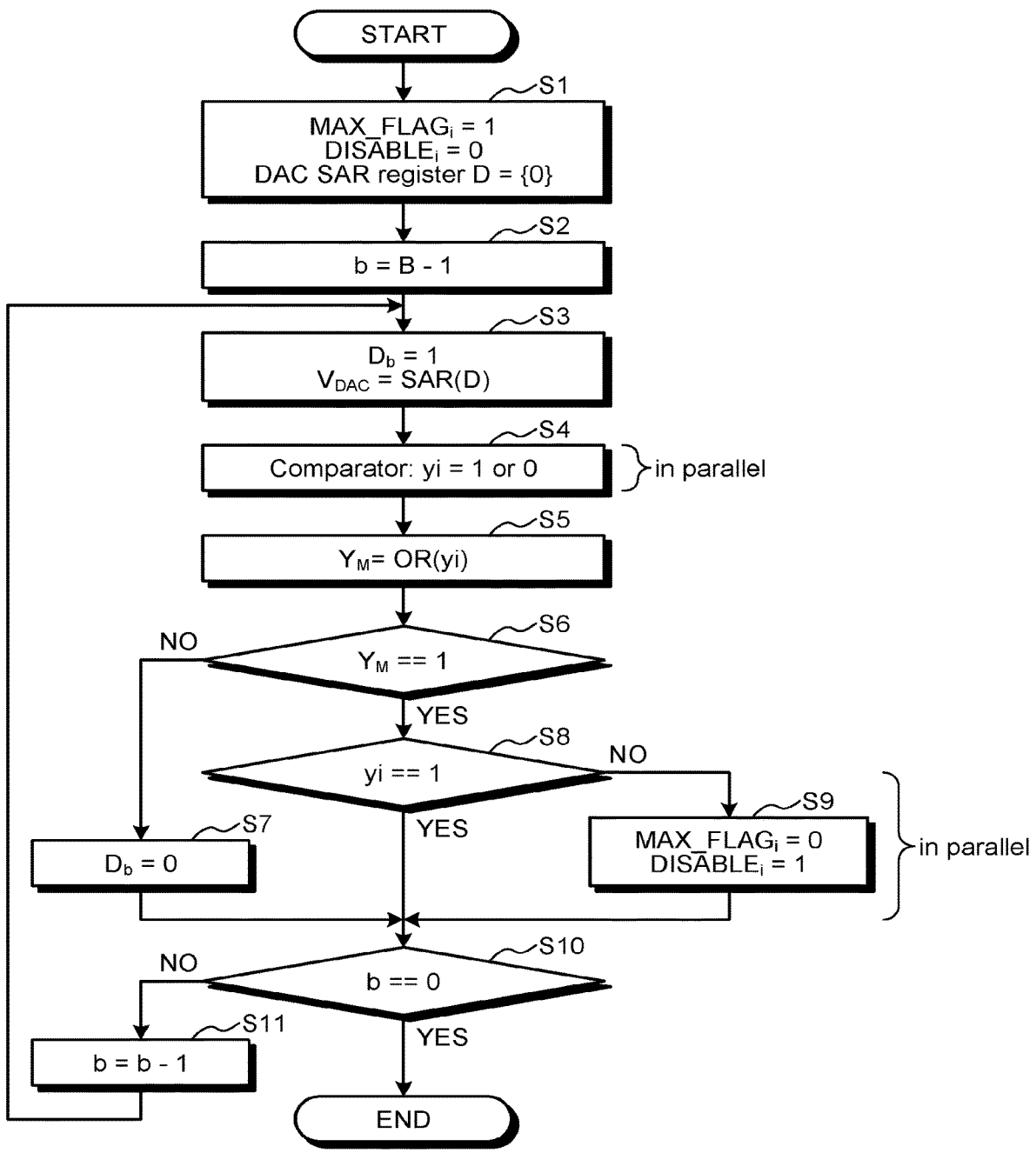
FIG. 5 is a flowchart illustrating the operation of the processing circuit (SARMAX circuit) in the first embodiment.

In the processing circuit 2, power consumption of a local comparator of a column whose signal is found not to be the maximum value in a process of performing AD conversion on signals of a plurality of columns in parallel is stopped (power gating), and thus, it is possible to greatly reduce the power consumption. This algorithm will be described with reference to FIG. 5. FIG. 5 is a flowchart illustrating the operation of the processing circuit 2.

The processing circuit 2 performs initial setting (S1). The processing circuit 2 initially sets the maximum value flag to $MAX\_FLAG_i=H$ (or 1) and the disable signal of each column to $DISABLE_i=L$ (or 0), as the output of the flip-flop 214 of each column. The processing circuit 2 loads the word D={0} to the registers of the respective stages (first to B-th stages) of the global SAR register 221a.

The processing circuit 2 sets a parameter b indicating a position of a bit to be processed to an initial value B−1 indicating the most significant bit (S2). The processing circuit 2 sets a parameter Db indicating a bit value to 1, and the global SAR DAC 221 performs the DA conversion processing shown in Math. 1 and supplies the global reference voltage $V_{DAC}=SAR(D)$ to the comparator 211 of each column (S3). The comparators 211 of the respective columns that are not disabled compare the signals $V_i$ with the global reference voltage $V_{DAC}$ in parallel. In a case where the signal $V_i$ is higher than the global reference voltage $V_{DAC}$, the comparator 211 of each column outputs the local signal $y_i=1$, and in a case where the signal $V_i$ is lower than the global reference voltage $V_{DAC}$, the comparator 211 of each column outputs the local signal $y_i=0$ (S4). The global OR gate 222 computes the logical sum of the local signals $y_i$ of the respective columns and outputs the global signal $Y_M$ as the computation result (S5). The local circuit 21 of each column sets Db to 0 in a case where the global signal $Y_M$ is 0 (NO in S6) (S7). In a case where the global signal $Y_M$ is 1 (YES in S6) and the local signal $y_i$ is 0 (NO in S8), the local circuit 21 of each column changes the maximum value flag from MAX_FLAG$_1$=H (or 1) to MAX_FLAG$_1$=L (or 0) and changes the disable signal from DISABLE$_i$=L (or 0) to DISABLE$_i$=H (or 1) (S9). In a case where the global signal $Y_M$ is 1 (YES in S6) and the local signal $y_i$ is 1 (YES in S8), the local circuit 21 of each column skips S9.

The processing circuit 2 decrements b (S11) and repeats the processings of performing S3 to S9 until b becomes 0 (b=0) (least significant bit) (NO in S10), and ends the processing once b becomes 0 (b=0) (YES in S10).

As described above, in the first embodiment, the processing circuit (SARMAX circuit) 2 of the computation system 1 is configured to perform a plurality of SAR type AD conversion processings while using the common global SAR DAC 221 and disabling some of the plurality of comparators 211 according to an AD conversion result. That is, since the common global SAR DAC 221 is used, the circuit configuration may be simplified and the circuit area may be reduced as compared with the implementation using the AD converter for each column. In addition, since the number of comparators 211 to be operated is gradually reduced, and the selective AD conversion operation is performed, power consumption may be reduced as compared with the implementation using the AD converter for each column. In addition, since the processing circuit 2 performs a plurality of SAR type AD conversion processings in parallel on input signals of a plurality of columns by applying binary search, to search for the maximum value in parallel, it is possible to easily increase the operation speed. Therefore, the circuit area and power consumption may be reduced and the operation speed may be increased.

Note that although FIG. 3 illustrates a configuration using the global SAR DAC 221 that is common to the product-sum computation circuits of all columns in the processing circuit (SARMAX circuit) 2, in a case where the product-sum computation circuits of all columns are grouped into a plurality of groups in a unit of one or more columns, the processing circuit (SARMAX circuit) 2 may have a configuration in which a plurality of common global SAR DACs 221 are used for each group.

(Modified Example of First Embodiment)

Figure 6:
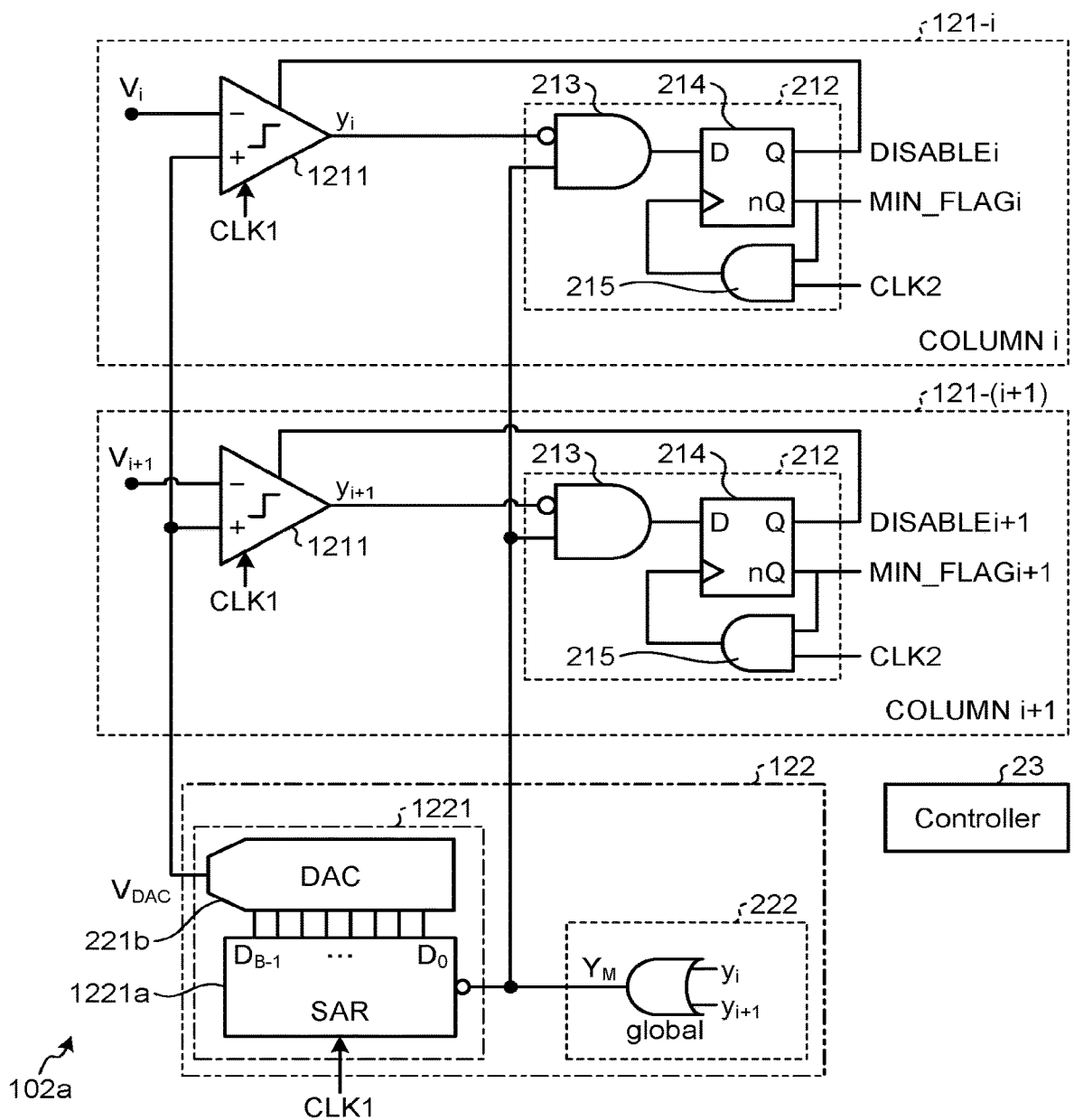
FIG. 6 is a circuit diagram illustrating a configuration of a processing circuit (SARMIN circuit) in a modified example of the first embodiment.

Alternatively, as illustrated in FIG. 6, a processing circuit 102a configured to search for the minimum value may be used. The processing circuit 102a is a circuit that searches for the minimum value while performing the SAR type AD conversion processing, and may be called a SARMIN circuit. FIG. 6 is a circuit diagram illustrating a configuration of the processing circuit (SARMIN circuit) 102a in the modified example of the first embodiment.

Local circuits 121-$i$ and 121-($i$+1) of the respective columns each have a comparator 1211 in which two input terminals of the comparator 211 (see FIG. 3) are reversed. The comparator 1211 receives a signal $V_i$ at a non-inverting input terminal (+) and receives a global reference signal $V_{DAC}$ at an inverting input terminal (−). A global SAR DAC 1221 of a global circuit 122 includes a global SAR register 1221a that logically inverts and receives a global signal $Y_M$ from a global OR gate 222.

Figure 7:
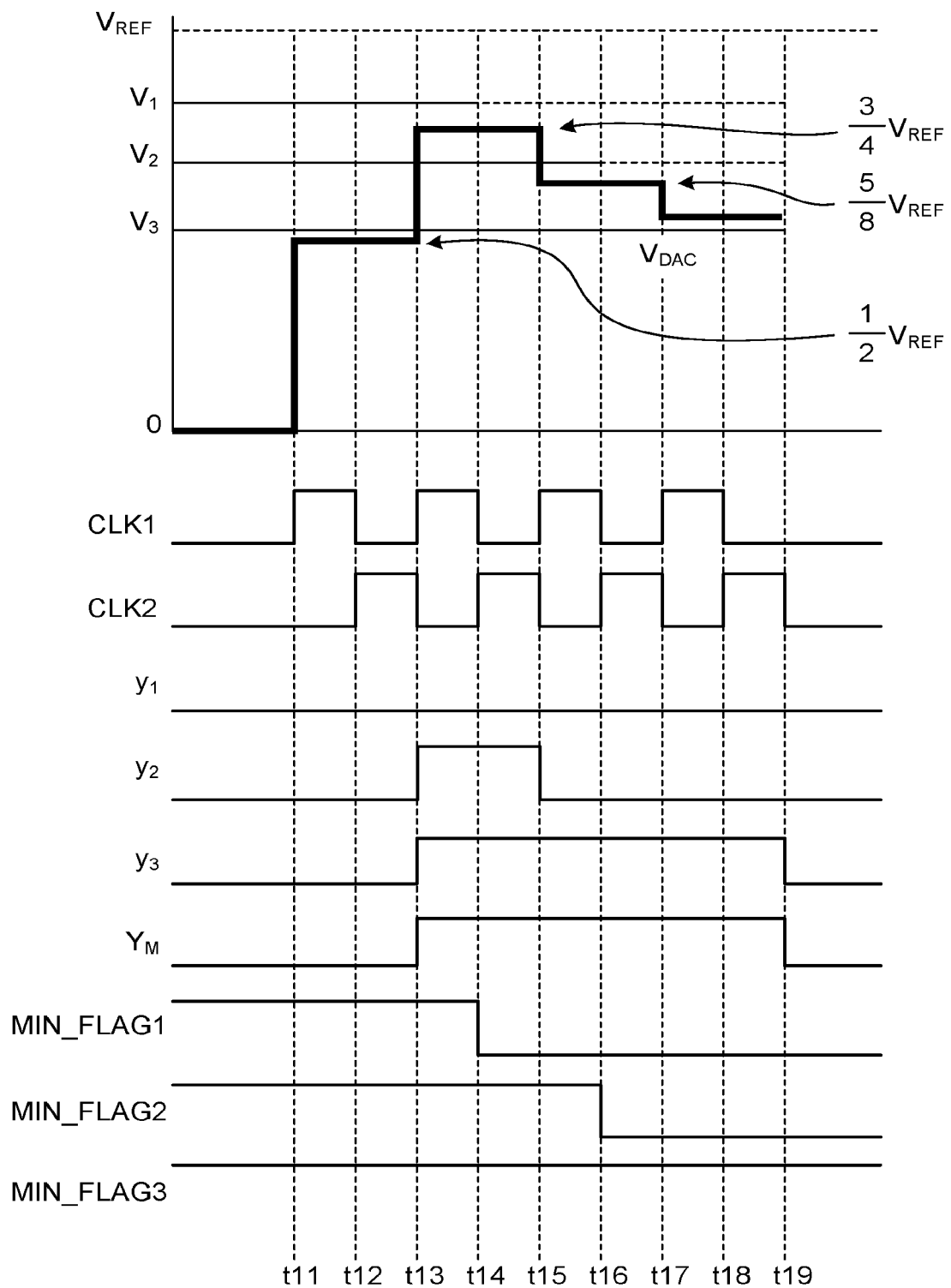
FIG. 7 is a waveform diagram illustrating an operation of the processing circuit (SARMIN circuit) in the modified example of the first embodiment.

With this configuration, as illustrated in FIG. 7, the processing circuit 102a searches for the minimum value while performing the SAR type AD conversion processing. FIG. 7 is a waveform diagram illustrating an operation of the processing circuit (SARMIN circuit) 102a in the modified example of the first embodiment.

The comparator 1211 of each column receives the signal $V_i$ at the inverting input terminal (−) and receives the global reference voltage $V_{DAC}$ at the non-inverting input terminal (+), and thus, in a case where the signal $V_i$ is lower than the global reference voltage $V_{DAC}$, a local signal $y_i=1$ is output, and in a case where the signal $V_i$ is higher than the global reference voltage $V_{DAC}$, the local signal $y_i=0$ is output.

For example, at a rising edge timing t13 of a clock CLK1, "1" obtained by logically inverting the global signal $Y_M$="0" is stored in a register of the first stage of the global SAR register 1221a, "1" is stored in a register of the second stage, and "0" is stored in registers of the third to last stages. A global DAC 221b performs the DA conversion shown in Math. 1, generates the global reference voltage $V_{DAC}=3/4V_{REF}$, and supplies the global reference voltage $V_{DAC}=3/4V_{REF}$ to the comparator 1211 of each column. The comparators 1211 of the respective columns compare signals $V_1$, $V_2$, and $V_3$ with the reference voltage $V_{DAC}=3/4V_{REF}$. Since the level of the signal $V_1$ of the first column is higher than $3/4V_{REF}$, the comparator 211 of the first column outputs the local signal $y_1=0$ as the comparison result. Since the levels of the signals $V_2$ and $V_3$ of the second and third columns are lower than $3/4V_{REF}$, the comparators 211 of the second and third columns output the local signals $y_2=1$ and $y_3=1$ as the comparison results. Accordingly, the global OR gate 222 outputs the global signal $Y_M=1$.

At a rising edge timing t14 of a clock CLK2, in the local circuits 121 of the second and third columns, since the local signals $y_2$ and $y_3$ output from the comparators 1211 are 1 ($y_2=1$ and $y_3=1$) and the global signal $Y_M$ is 1 ($Y_M=1$), flip-flops 214 maintain the outputs thereof at the original state. That is, the flip-flop 214 of the second column maintains a minimum value flag at MIN_FLAG$_2$=H (or 1) and maintains a disable signal at DISABLE$_2$=L (or 0). The flip-flop 214 of the third column maintains the minimum value flag at MIN_FLAG$_S$=H (or 1) and maintains the disable signal at DISABLE$_3$=L (or 0). Meanwhile, in the local circuit 121 of the first column, since the local signal $y_1$ output from the comparator 1211 is 0 ($y_1=0$) and the global signal $Y_M$ is 1 ($Y_M=1$), the flip-flop 214 changes the output thereof from the original state. That is, the flip-flop 214 changes the minimum value flag from MIN_FLAG$_1$=H (or 1) to MIN_FLAG$_1$=L (or 0) and changes the disable signal from DISABLE$_1$=L (or 0) to DISABLE$_1$=H (or 1).

As a result, after the timing t14, the comparator 211 of the first column receives the disable signal DISABLE$_1$=H (or 1) and the operation thereof is disabled, and as indicated by a dotted line for the waveform of $V_1$ in FIG. 7, power consumption by the comparator 211 is stopped (power gating).

At a rising edge timing t15 of the clock CLK1, "0" obtained by logically inverting the global signal $Y_M$="1" is stored in the register of the first stage of the global SAR register 1221a, "1" is stored in the registers of the second and third stages, and "0" is stored in registers of the fourth to last stages. The global DAC 221b performs the DA conversion shown in Math. 1, generates the global reference voltage $V_{DAC}=5/8V_{REF}$, and supplies the global reference voltage $V_{DAC}=5/8V_{REF}$ to the comparator 211 of each column. The comparators 1211 of the second and third columns compare the signals $V_2$ and $V_3$ with the reference voltage $V_{DAC}=5/8V_{REF}$. Since the level of the signal $V_2$ is higher than $5/8V_{REF}$, the comparator 1211 of the second column outputs the local signal $y_2=0$ as the comparison result, and since the level of the signal $V_3$ is lower than $5/8V_{REF}$, the comparator 211 of the third column outputs the local signal $y_3=1$ as the comparison result. Accordingly, the global OR gate 222 outputs the global signal $Y_M=1$.

At a rising edge timing t16 of the clock CLK2, in the local circuits 121 of the second and third columns that are not disabled, the local signals $y_2$ and $y_3$ output from the comparators 1211 are 0 and 1, respectively ($y_2=0$ and $y_3=1$). In the local circuit 121 of the third column, since the local signal $y_3$ is 1 ($y_3=1$) and the global signal $Y_M$ is 1, ($Y_M=1$), the flip-flop 214 maintains the output thereof at the original state. That is, the flip-flop 214 of the third column maintains the minimum value flag at MIN_FLAG$_3$=H (or 1) and maintains the disable signal at DISABLE$_3$=L (or 0). Meanwhile, in the local circuit 121 of the second column, since the local signal $y_2$ is 0 ($y_2=0$) and the global signal $Y_M$ is 1, ($Y_M=1$), the flip-flop 214 changes the output thereof from the original state. That is, the flip-flop 214 changes the minimum value flag from MIN_FLAG$_2$=H (or 1) to MIN_FLAG$_2$=L (or 0) and changes the disable signal from DISABLE$_2$=L (or 0) to DISABLE$_2$=H (or 1).

As a result, after the timing t16, the comparator 1211 of the second column receives the disable signal DISABLE$_2$=H (or 1) and the operation thereof is disabled, and as indicated by a dotted line for the waveform of $V_2$ in FIG. 7, power consumption by the comparator 1211 is stopped (power gating).

In a case where the number of bits according to the precision of the conversion is B, at a timing t19 after B cycles (four cycles in FIG. 4), the processing circuit 102a outputs (MIN_FLAG$_1$, MIN_FLAG$_2$, and MIN_FLAG$_3$)= (L, L, and H) (or (0, 0, and 1)) as a minimum value search result. In this example, the minimum value search result indicates that the signal $V_3$ of the third column is searched for as the minimum value among the signals $V_1$ to $V_3$ of the first to third columns.

Figure 8:
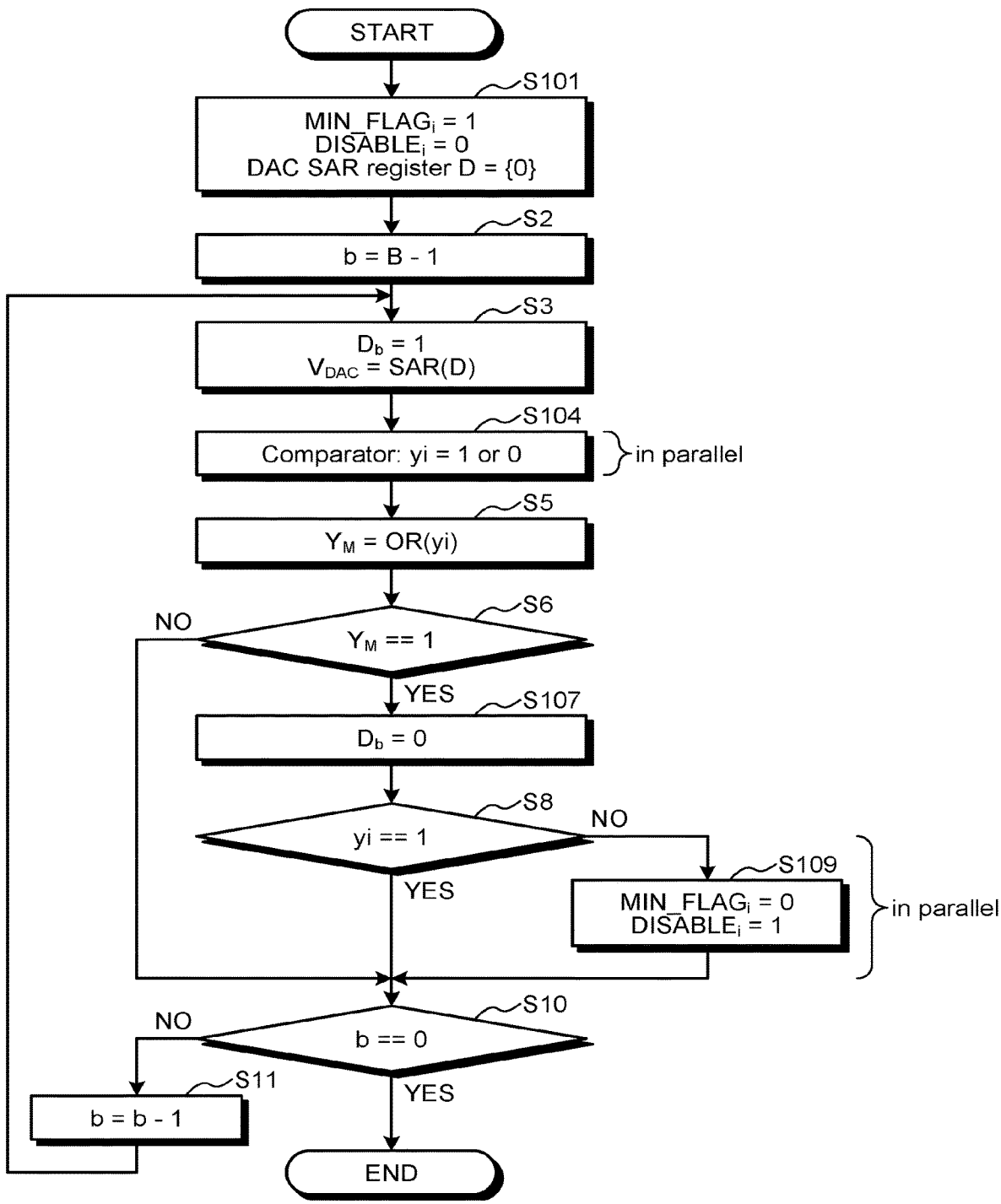
FIG. 8 is a flowchart illustrating the operation of the processing circuit (SARMIN circuit) in the modified example of the first embodiment.

Further, in the processing circuit 102a, as illustrated in FIG. 8, an algorithm different from that of the embodiment in regard to the following points is executed. FIG. 8 is a flowchart illustrating the operation of the processing circuit (SARMIN circuit) 102a in the modified example of the first embodiment. Since some of processings illustrated in FIG. 8 are the same as the processings in FIG. 5, processing different from those in FIG. 5 will be described.

The processing circuit 102a sets the minimum value flag, which is the output of the flip-flop 214 of each column, to MIN_FLAG$_1$=H (or 1) as the initial setting (S101). The other parts are similar to those in S1.

Further, in the processing circuit 102a, the comparator 211 of each column that is not disabled compares the signal Vi with the global reference voltage $V_{DAC}$, outputs the local signal $y_i=1$ in a case where the signal Vi is lower than the global reference voltage $V_{DAC}$, and outputs the local signal $y_i=0$ in a case where the signal Vi is higher than the global reference voltage $V_{DAC}$ (S104). That is, the correspondence between the magnitude relationship between the signal Vi and the global reference voltage $V_{DAC}$ and a value of the local signal $y_i$ is reverse to that of S4.

In a case where the global signal $Y_M$ is 0 (NO in S6), the processing circuit 102a proceeds to S10.

In a case where the global signal $Y_M$ is 1 (YES in S6), the processing circuit 102a sets Db to 0 (S107). In a case where $y_i$ is 0 (NO in S8), the processing circuit 102a changes the minimum value flag from MIN_FLAG$_1$=H (or 1) to MIN_FLAG$_1$=L (or 0) and changes the disable signal from DISABLE$_i$=L (or 0) to DISABLE$_i$=H (or 1) (S109). In a case where $y_i$ is 1 (YES in S8), the processing circuit 102a skips S109.

Also with such a configuration, the processing circuit (SARMIN circuit) 102a uses the common global SAR DAC 1221, and thus, the circuit configuration may be simplified and the circuit area may be reduced as compared with the implementation using the AD converter for each column. In addition, since the number of comparators 1211 to be operated is gradually reduced, and the selective AD conversion operation is performed, power consumption may be reduced as compared with the implementation using the AD converter for each column. In addition, since the processing circuit 102a performs a plurality of SAR type AD conversion processings in parallel on a plurality of input signals from resistive random access memories of a plurality of columns by applying binary search, to search for the minimum value in parallel, it is possible to easily increase the operation speed. Therefore, the circuit area and power consumption may be reduced and the operation speed may be increased.

Second Embodiment

Next, a computation system 1 according to a second embodiment will be described. In the following, the parts different from the first embodiment will be mainly described.

In the first embodiment, a case where the processing circuit 2 searches for the maximum value while performing the SAR type AD conversion processing has been described by way of example. In the second embodiment, a processing circuit 302 that searches for top K values (K is an arbitrary integer of 2 or more) while performing the SAR type AD conversion processing is used.

Figure 9:
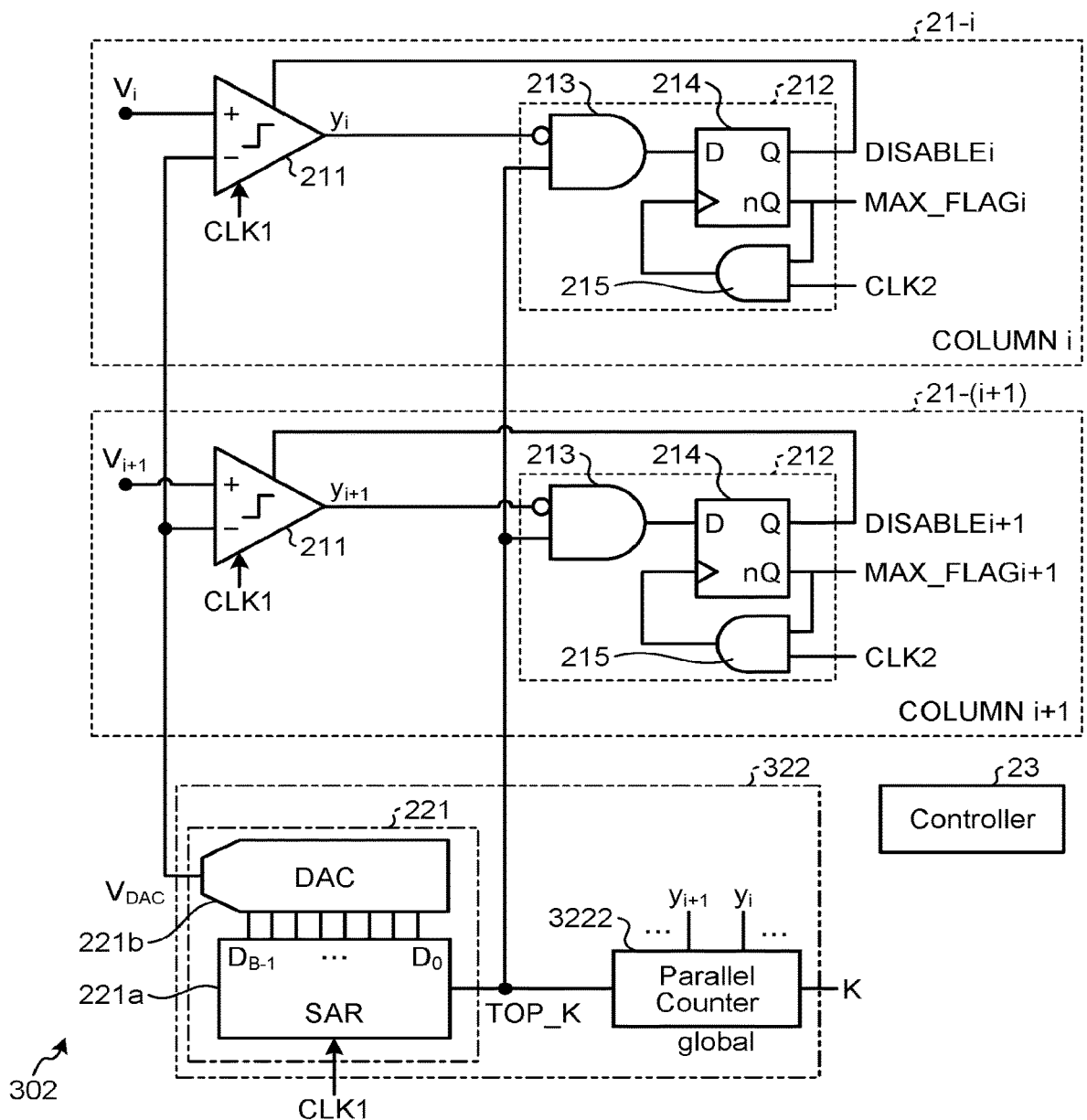
FIG. 9 is a circuit diagram illustrating a configuration of a processing circuit (SARMAXK circuit) in a second embodiment.

Specifically, the processing circuit 302 can be configured as illustrated in FIG. 9. The processing circuit 302 is a circuit that searches for top K values while performing the SAR type AD conversion processing, and can be called a SAR-MAXK circuit. FIG. 9 is a circuit diagram illustrating a configuration of the processing circuit (SARMAXK circuit) 302 in the second embodiment.

The processing circuit 302 is basically the same as the processing circuit 2 (see FIG. 3), but is different from the processing circuit 2 in that the processing circuit 302 searches for top K values. Although the processing circuit 302 still performs the SAR type AD conversion processing, the global OR gate 222 (see FIG. 3) is replaced with a parallel counter 3222 in a global circuit 322.

The parallel counter 3222 counts how many of local signals $y_i$ and $y_{i+1}$ output from comparators 211 of respective columns are at the H level (or 1) for each DA conversion cycle, and outputs a global signal TOP_K to an AND gate 213 of each column and a global SAR register 221a according to the count value. Once the global signal TOP_K is supplied, the global SAR register 221a stores a value of the global signal TOP_K in a register of the first stage and shifts a value held in the register of each stage.

When searching for top K values, in a case where the count value is K or more, the parallel counter 3222 outputs the global signal TOP_K=H level (or 1), and in a case where the count value is less than K, the parallel counter 3222 outputs the global signal TOP_K=L level (or 0). The specific configuration of the parallel counter 3222 may be implemented by a digital circuit or an analog circuit.

Figure 10:
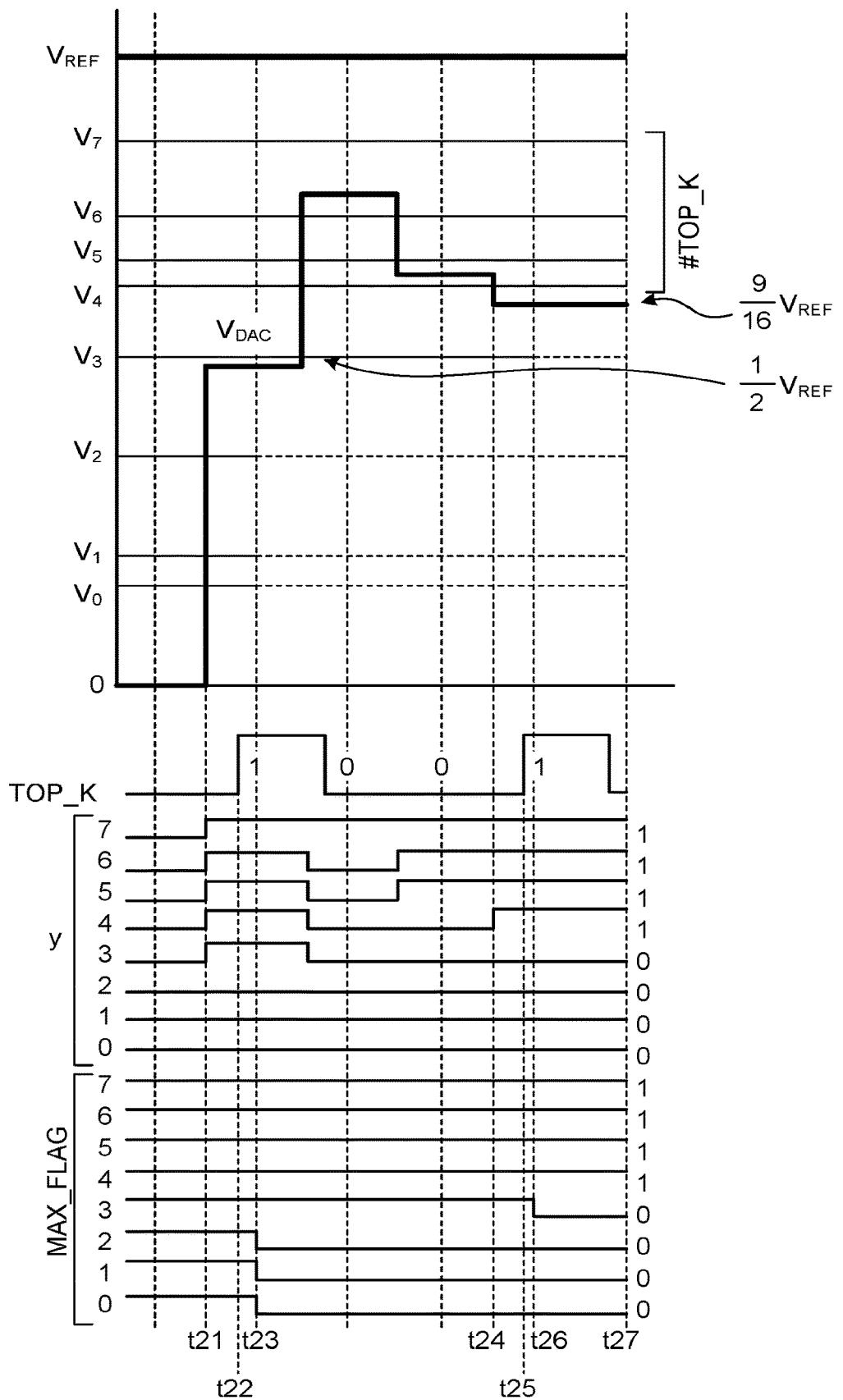
FIG. 10 is a waveform diagram illustrating an operation of the processing circuit (SARMAXK circuit) in the second embodiment.

For example, the processing circuit 302 is operated as illustrated in FIG. 10. FIG. 10 is a waveform diagram illustrating an operation of the processing circuit (SAR-MAXK circuit) 302 in the second embodiment. FIG. 10 illustrates an operation in which the processing circuit 302 that receives signals $V_0$ to $V_7$ of zeroth to seventh columns searches for top K values (K=4) while performing the AD conversion with a precision of four bits.

At a timing t21, a global SAR DAC 221 sets a global reference voltage $V_{DAC}$ to $V_{REF}/2$ ($V_{DAC}=V_{REF}/2$). The comparators 211 of the respective columns (zeroth to seventh columns) compare the signals $V_0$ to $V_7$ with the global reference voltage $V_{DAC}=V_{REF}/2$, and output local signals ($y_0$, $y_1$, $y^2$, $y^3$, $y^4$, $y_5$, $y_6$, and $y_7$)=(0, 0, 0, 1, 1, 1, 1, and 1) as the comparison results.

At a timing t22, the parallel counter 3222 counts the number of local signals having a value of 1, and when the count value reaches five which is equal to or more than K (K=4), the parallel counter 3222 changes the level of the global signal TOP_K from the L level (or 0) to the H level (or 1).

At a timing t23, in a case of logic circuits 212 of the zeroth to second columns (i=0 to 2), the local signal $y_i$=0 and the global signal TOP_K=1, and this means that there is no possibility that the signal $V_i$ is one of top K signals. Therefore, the logic circuits 212 of the zeroth to second columns each change a maximum value flag from MAX_FLAG$_i$=H (or 1) to MAX_FLAG$_i$=L (or 0) and change a disable signal from DISABLE$_i$=L (or 0) to DISABLE$_i$=H (or 1). As a result, as indicated by dotted lines for the waveforms of the signals $V_i$, the comparators 211 of the zeroth to second columns receive the disable signal DISABLE$_i$=H (or 1) and the operations thereof are disabled, and power consumption by the comparators 211 is stopped (power gating).

On the other hand, in a case of logic circuits 212 of the third to seventh columns (i=3 to 7), the local signal $y_i$=1 and the global signal TOP_K=1, and this means that the signal $V_i$ may be one of top K signals. Therefore, the logic circuits 212 of the third to seventh columns each maintain the maximum value flag at MAX_FLAG$_i$=H (or 1) and maintain the disable signal at DISABLE$_i$=L (or 0).

At a timing t24, the global SAR DAC 221 sets the global reference voltage $V_{DAC}$ to $9/16 V_{REF}$ ($V_{DAC}=9/16V_{REF}$). The comparators 211 of the respective columns (third to seventh columns) that are not disabled compare the signals $V_3$ to $V_7$ with the global reference voltage $V_{DAC}=9/16V_{REF}$, and output the local signals ($y_3$, $y_4$, $y_5$, $y_6$, and $y_7$)=(0, 1, 1, 1, and 1) as the comparison results.

At a timing t25, the parallel counter 3222 counts the number of local signals having a value of 1, and when the count value reaches four which is equal to or more than K (K=4), the parallel counter 3222 changes the level of the global signal TOP_K from the L level (or 0) to the H level (or 1).

At a timing t26, in a case of the logic circuit 212 of the third column (i=3), the local signal $y_i$=0 and the global signal TOP_K=1, and this means that there is no possibility that the signal $V_i$ is one of top K signals. Therefore, the logic circuit 212 of the third column changes the maximum value flag from MAX_FLAG$_i$=H (or 1) to MAX_FLAG$_i$=L (or 0) and changes the disable signal from DISABLE$_i$=L (or 0) to DISABLE$_i$=H (or 1). As a result, as indicated by dotted lines for the waveform of the signal $V_i$, the comparator 211 of the third column receives the disable signal DISABLE$_i$=H (or 1) and the operation thereof is disabled, and power consumption by the comparator 211 is stopped (power gating).

On the other hand, in a case of the logic circuits 212 of the fourth to seventh columns (i=4 to 7), the local signal $y_i$=1 and the global signal TOP_K=1, and this means that the signal $V_i$ may be one of top K signals. Therefore, the logic circuits 212 of the fourth to seventh columns each maintain the maximum value flag at MAX_FLAG$_i$=H (or 1) and maintain the disable signal at DISABLE$_i$=L (or 0).

In a case where the number of bits according to the precision of the conversion is B, at a timing t27 after B cycles (B=4), the processing circuit 302 outputs (MAX_FLAG$_0$, MAX_FLAG$_1$, MAX_FLAG$_2$, MAX_FLAG$_3$, MAX_FLAG$_4$, MAX_FLAG$_5$, MAX_FLAG$_6$, and MAX_FLAG$_7$)=(L, L, L, L, H, H, H, and H) (or (0, 0, 0, 0, 1, 1, 1, and 1)) as a result of searching for top K values. In this example, the search result indicates that the signals $V_4$ to $V_7$ of the fourth to seventh columns are found as top K values among the signals $V_0$ to $V_7$ of the zeroth to seventh columns.

Figure 11:
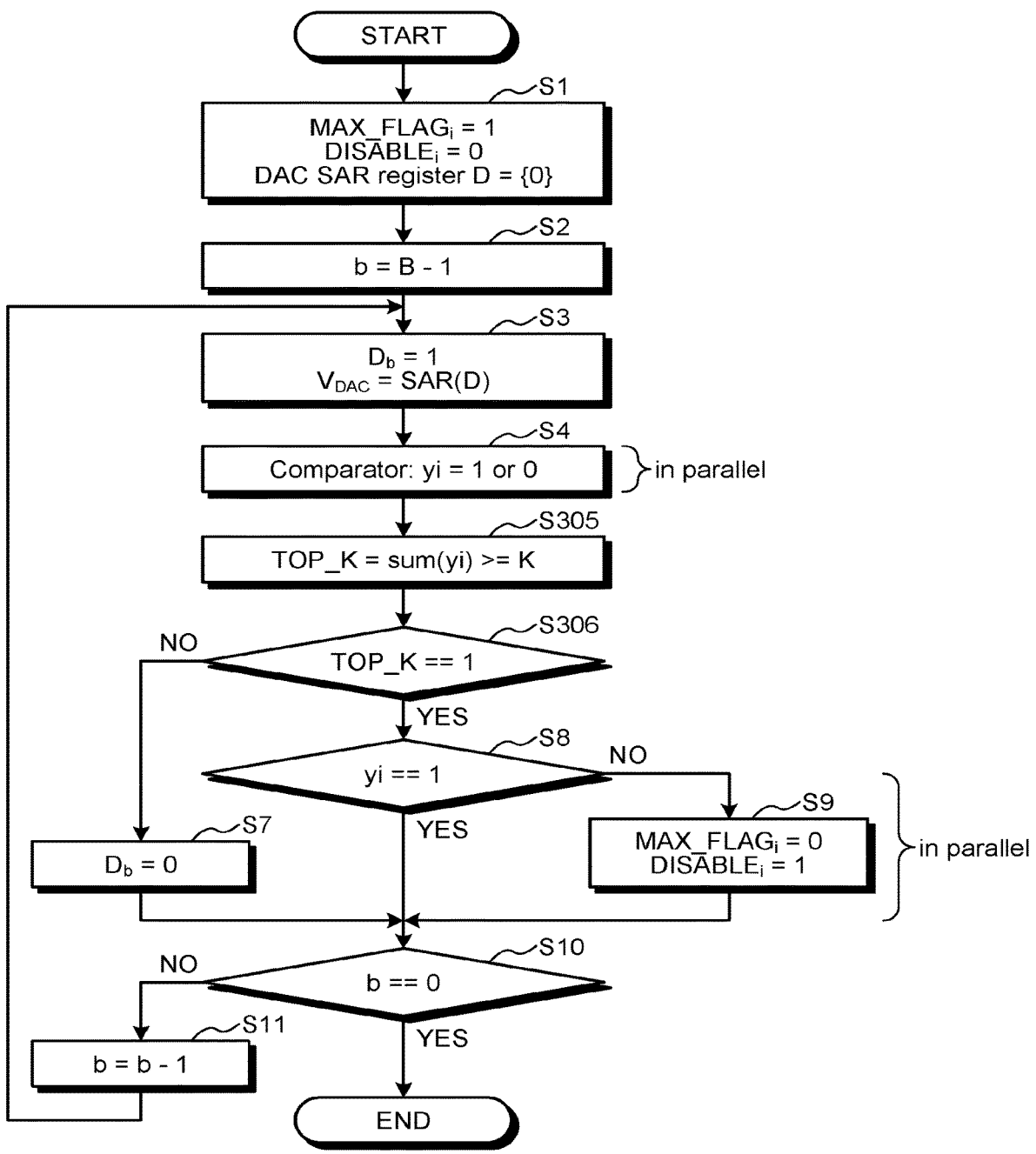
FIG. 11 is a flowchart illustrating the operation of the processing circuit (SARMAXK circuit) in the second embodiment.

Further, in the processing circuit 302, as illustrated in FIG. 11, an algorithm different from that of the first embodiment in regard to the following points is executed. FIG. 11 is a flowchart illustrating the operation of the processing circuit (SARMAXK circuit) 302 in the second embodiment. Since some of processings illustrated in FIG. 11 are similar to the processings in FIG. 5, processing different from those in FIG. 5 will be described.

In the processing circuit 302, the parallel counter 3222 counts how many of the local signals $y_i$ output from the comparator 211 of the respective columns are at the H level (or 1), and outputs the global signal TOP_K according to the count value (S305). In a case where the count value is K or more, the parallel counter 3222 outputs the global signal TOP_K=H level (or 1), and in a case where the count value is less than K, the parallel counter 3222 outputs the global signal TOP_K=L level (or 0). The local circuit 21 of each column sets Db to 0 in a case where the global signal TOP_K is 0 (NO in S306). In a case where the global signal TOP_K is 1 (YES in S306) and the local signal $y_i$ is 0 (NO in S8), the local circuit 21 of each column changes the maximum value flag from MAX_FLAG$_1$=H (or 1) to MAX_FLAG$_1$=L (or 0) and changes the disable signal from DISABLE$_i$=L (or 0) to DISABLE$_i$=H (or 1) (S9). In a case where the global signal TOP_K is 1 (YES in S306) and the local signal $y_i$ is 1 (YES in S8), the local circuit 21 of each column skips S9.

As described above, in the second embodiment, the processing circuit (SARMAXK circuit) 302 of the computation system 1 is configured to perform a plurality of SAR type AD conversion processings while using the common global SAR DAC 221 and disabling some of the plurality of comparators 211 according to an AD conversion result. That is, since the common global SAR DAC 221 is used, the circuit configuration may be simplified and the circuit area may be reduced as compared with the implementation using the AD converter for each column. In addition, since the number of comparators 211 to be operated is gradually reduced, and the selective AD conversion operation is performed, power consumption may be reduced as compared with the implementation using the AD converter for each column. In addition, since the processing circuit 302 performs a plurality of SAR type AD conversion processings in parallel on a plurality of input signals from a plurality of columns by applying binary search, to search for top K values in parallel, it is possible to easily increase the operation speed. Therefore, the circuit area and power consumption may be reduced and the operation speed may be increased.

(Modified Example of Second Embodiment)

Figure 12:
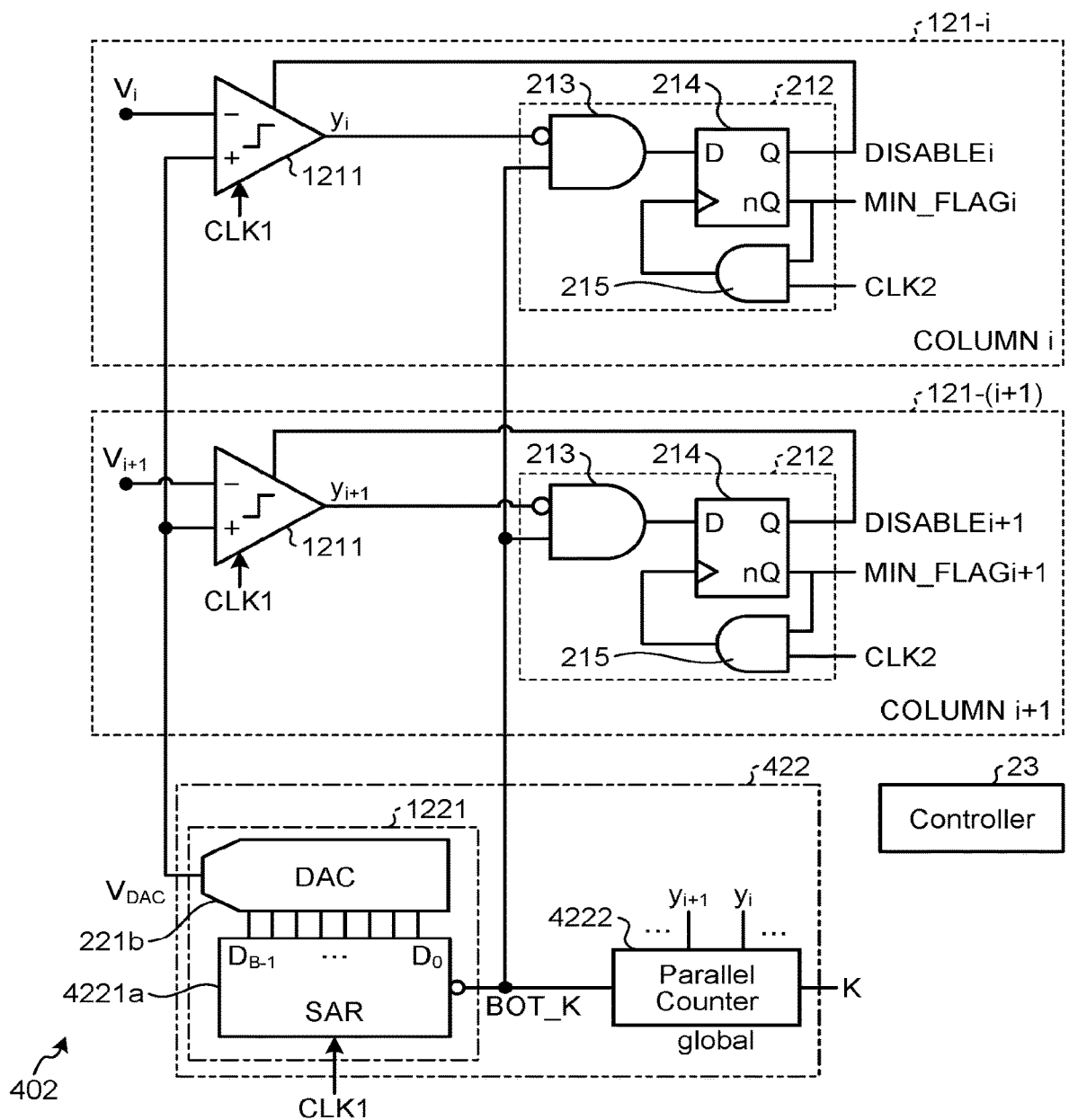
FIG. 12 is a circuit diagram illustrating a configuration of a processing circuit (SARMINK circuit) in a modified example of the second embodiment.

Alternatively, as illustrated in FIG. 12, a processing circuit 402 configured to search for bottom K values may be used. The processing circuit 402 is a circuit that searches for bottom K values while performing the SAR type AD conversion processing, and may be called a SARMINK circuit. FIG. 12 is a circuit diagram illustrating a configuration of the processing circuit (SARMINK circuit) 402 in a modified example of the second embodiment.

Local circuits 121-$i$ and 121-$(i+1)$ of the respective columns each have a comparator 1211 in which two input terminals of the comparator 211 (see FIG. 3) are reversed. The comparator 1211 receives signals $V_i$ and $V_{i+1}$ at a non-inverting input terminal (+) and receives a global reference signal $V_{DAC}$ at an inverting input terminal (−).

In a global circuit 422, a parallel counter 4222 counts how many of local signals $y_i$ and $y_{i+1}$ output from comparators 1211 of respective columns are at the H level (or 1) for each DA conversion cycle, and outputs a global signal BOT_K to an AND gate 213 of each column and a global SAR register 4221$a$ according to the count value. When searching for bottom K values, in a case where the count value is K or more, the parallel counter 4222 outputs the global signal BOT_K=H level (or 1), and in a case where the count value is less than K, the parallel counter 4222 outputs the global signal BOT_K=L level (or 0). Once the global signal BOT_K is supplied, the global SAR register 4221$a$ stores a value obtained by logically inverting a value of the global signal BOT_K in a register of the first stage and shifts a value held in the register of each stage.

Figure 13:
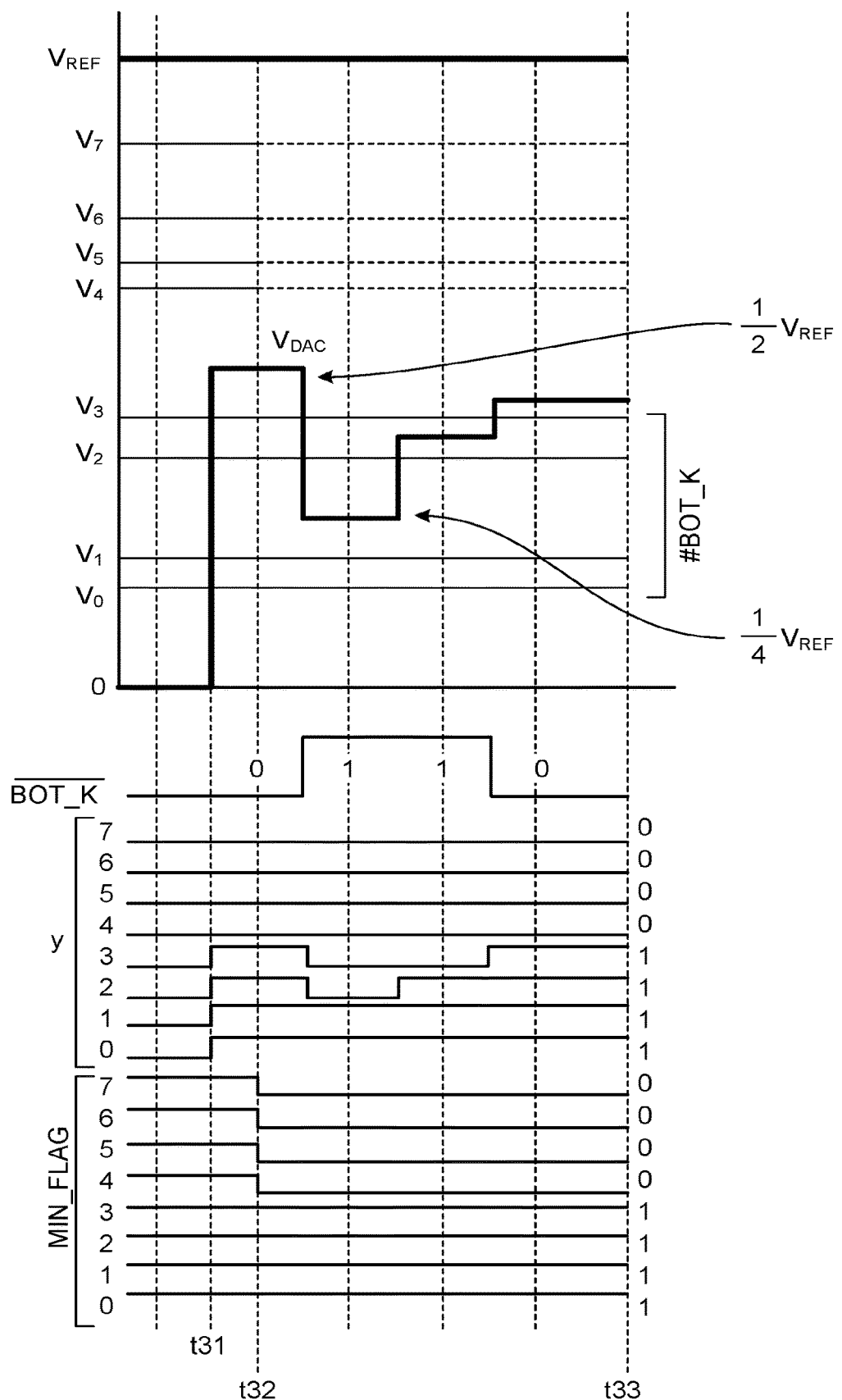
FIG. 13 is a waveform diagram illustrating an operation of the processing circuit (SARMINK circuit) in the modified example of the second embodiment.

With this configuration, as illustrated in FIG. 13, the processing circuit 402 searches for bottom K values while performing the SAR type AD conversion processing. FIG. 13 is a waveform diagram illustrating an operation of the processing circuit (SARMINK circuit) 402 in the modified example of the second embodiment. FIG. 13 illustrates a case where K=4.

The comparator 1211 of each column receives the signal $V_i$ at the inverting input terminal (−) and receives the global reference voltage $V_{DAC}$ at the non-inverting input terminal (+), and thus, in a case where the signal $V_i$ is lower than the global reference voltage $V_{DAC}$, a local signal $y_i=1$ is output, and in a case where the signal $V_i$ is higher than the global reference voltage $V_{DAC}$, the local signal $y_i=0$ is output.

For example, at a timing t31, a global SAR DAC 1221 sets the global reference voltage $V_{DAC}$ to $V_{REF}/2$ ($V_{DAC}=V_{REF}/2$). The comparators 1211 of the respective columns compare signals $V_0$ to $V_7$ with the global reference voltage $V_{DAC}=V_{REF}/2$, and output local signals ($y_0$, $y_1$, $y_2$, $y_3$, $y_4$, $y_5$, $y_6$, and $y_7$)=(1, 1, 1, 1, 0, 0, 0, and 0) as the comparison results. Accordingly, the parallel counter 4222 counts the number of local signals $y_i$ having a value of 1, and when the count value reaches four which is equal to or more than K (K=4), the level of the global signal BOT_K becomes the H level (or 1), and the level of an inverted signal BOT_K$^-$ becomes the L level (or 0). FIG. 13 illustrates the level of the inverted signal BOT_K$^-$.

At a timing t32, in the local circuits 121 of the zeroth to third columns (i=0 to 3), since the local signals $y_i$ output from the comparators 1211 is 1 ($y_i=1$) and the global signal BOT_K is 1 (BOT_K=1), a flip-flop 214 maintains the output thereof at the original state. That is, the flip-flop 214 of the second column maintains a minimum value flag at MIN_FLAG$_i$=H (or 1) and maintains a disable signal at DISABLE$_i$=L (or 0). Meanwhile, in the local circuits 121 of the fourth to seventh columns (i=4 to 7), since the local signals $y_i$ output from the comparators 1211 is 0 ($y_i=0$) and the global signal BOT_K is 1 (BOT_K=1), the flip-flops 214 change the outputs thereof from the original state. That is, the flip-flops 214 change the minimum value flag from MIN_FLAG$_i$=H (or 1) to MIN_FLAG$_i$=L (or 0) and change the disable signal from DISABLE$_i$=L (or 0) to DISABLE$_i$=H (or 1).

As a result, after the timing t32, the comparators 1211 of the fourth to seventh columns (i=4 to 7) receive the disable signal DISABLE$_i$=H (or 1) and the operations thereof are disabled, and as indicated by dotted lines for the waveforms of $V_i$ in FIG. 13, power consumption by the comparators 1211 is stopped (power gating).

In a case where the number of bits according to the precision of the conversion is B, at a timing t33 after B cycles (B=4), the processing circuit 402 outputs (MIN_FLAG$_0$, MIN_FLAG$_1$, MIN_FLAG$_2$, MIN_FLAG$_3$, MIN_FLAG$_4$, MIN_FLAG$_5$, MIN_FLAG$_6$, and MIN_FLAG$_7$)=(H, H, H, H, L, L, L, and L) (or (1, 1, 1, 1, 0, 0, 0, and 0)) as a result of searching for bottom K values. In this example, the result of searching for bottom K values indicates that the signals $V_0$ to $V_3$ of the zeroth to third columns are searched for as bottom K values among the signals $V_0$ to $V_7$ of the zeroth to seventh columns.

Figure 14:
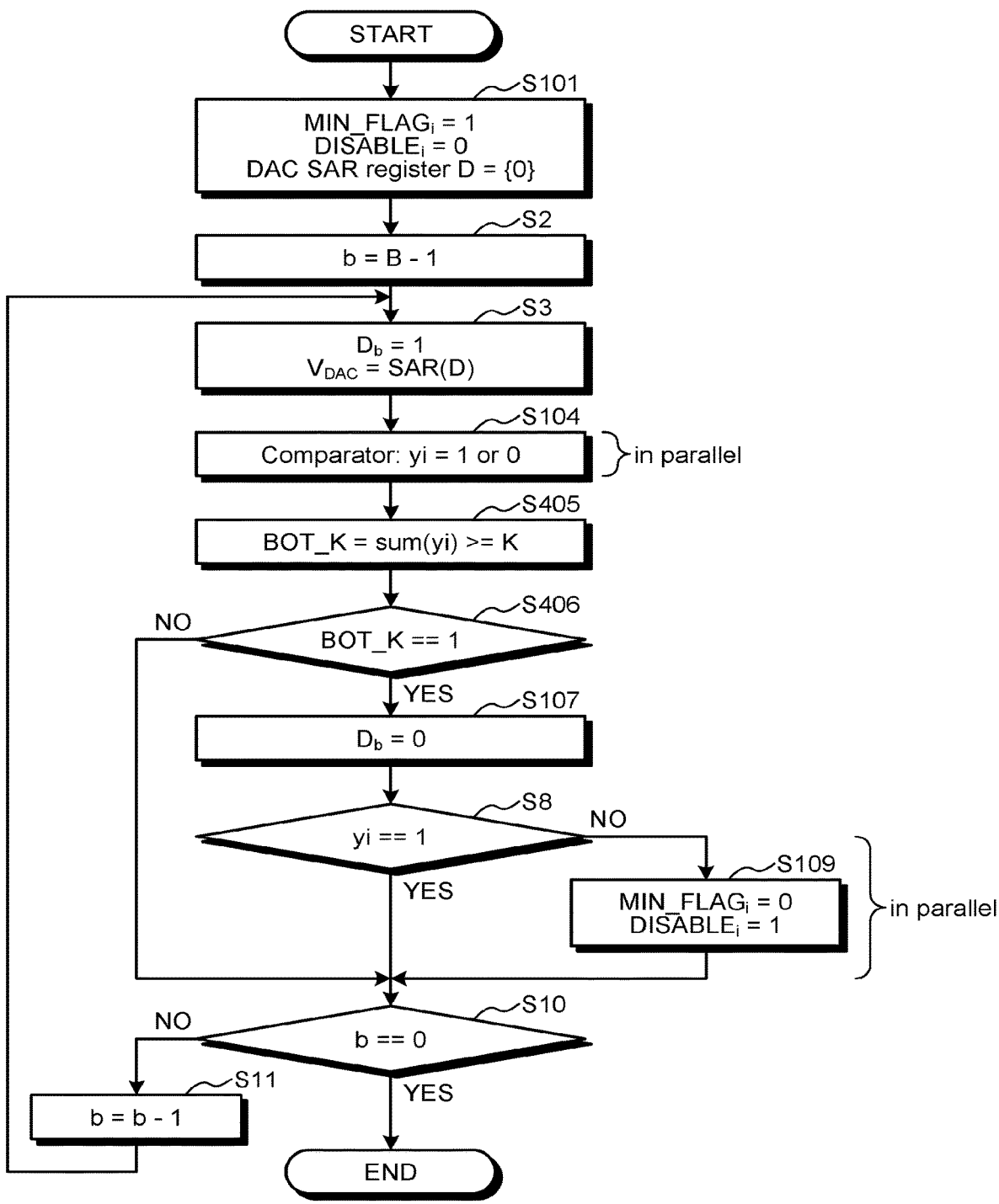
FIG. 14 is a flowchart illustrating the operation of the processing circuit (SARMINK circuit) in the modified example of the second embodiment.

Further, in the processing circuit 402, as illustrated in FIG. 14, an algorithm different from that of the embodiment in regard to the following points is executed. FIG. 14 is a flowchart illustrating the operation of the processing circuit (SARMINK circuit) 402 in the modified example of the second embodiment. Since some of processings illustrated in FIG. 14 are similar to the processings in FIGS. 5 and 8, processing different from those in FIGS. 5 and 8 will be described.

The processing circuit 402 sets the minimum value flag, which is the output of the flip-flop 214 of each column, to MIN_FLAG$_i$=H (or 1) as the initial setting (S101). The other parts are similar to those in S1.

Further, in the processing circuit 402, the comparator 211 of each column that is not disabled compares the signal $V_i$ with the global reference voltage $V_{DAC}$, outputs the local signal $y_i=1$ in a case where the signal $V_i$ is lower than the global reference voltage $V_{DAC}$, and outputs the local signal $y_i=0$ in a case where the signal $V_i$ is higher than the global reference voltage $V_{DAC}$ (S104). That is, the correspondence between the magnitude relationship between the signal Vi and the global reference voltage $V_{DAC}$ and a value of the local signal $y_i$ is reverse to that of S4.

In the processing circuit 402, the parallel counter 4222 counts how many of the local signals $y_i$ output from the comparator 1211 of the respective columns are at the H level (or 1), and outputs the global signal BOT_K according to the count value (S405). In a case where the count value is K or more, the parallel counter 4222 outputs the global signal BOT_K=H level (or 1), and in a case where the count value is less than K, the parallel counter 4222 outputs the global signal BOT_K=L level (or 0). The local circuit 121 of each column proceeds to S10 in a case where the global signal BOT_K is 0 (NO in S406). The local circuit 121 of each column sets Db to 0 in a case where the global signal BOT_K is 1 (YES in S406) (S107). In a case where $y_i$ is 0 (NO in S8), the processing circuit 402 changes the minimum value flag from MIN_FLAG$_1$=H (or 1) to MIN_FLAG$_1$=L (or 0) and changes the disable signal from DISABLE$_i$=L (or 0) to DISABLE$_i$=H (or 1) (S109). In a case where $y_i$ is 1 (YES in S8), the processing circuit 402 skips S109.

Also with such a configuration, the processing circuit (SARMINK circuit) 402 uses the common global SAR DAC 1221, and thus, the circuit configuration may be simplified and the circuit area may be reduced as compared with the implementation using the AD converter for each column. In addition, since the number of comparators 1211 to be operated is gradually reduced, and the selective AD conversion operation is performed, power consumption may be reduced as compared with the implementation using the AD converter for each column. In addition, since the processing circuit 402 performs a plurality of SAR type AD conversion processings in parallel on a plurality of input signals from a plurality of columns by applying binary search, to search for bottom K values in parallel, it is possible to easily increase the operation speed. Therefore, the circuit area and power consumption may be reduced and the operation speed may be increased.

Third Embodiment

Next, a computation system 1 according to a third embodiment will be described. In the following, the parts different from the first and second embodiments will be mainly described.

In the second embodiment, the processing circuit 302 searches for top K values (K is an arbitrary integer of 2 or more). In the third embodiment, a processing circuit 502 that performs single-slope (SS) type AD conversion processing to obtain a digital value of each of top K values after searching for top K values is used.

Figure 15:
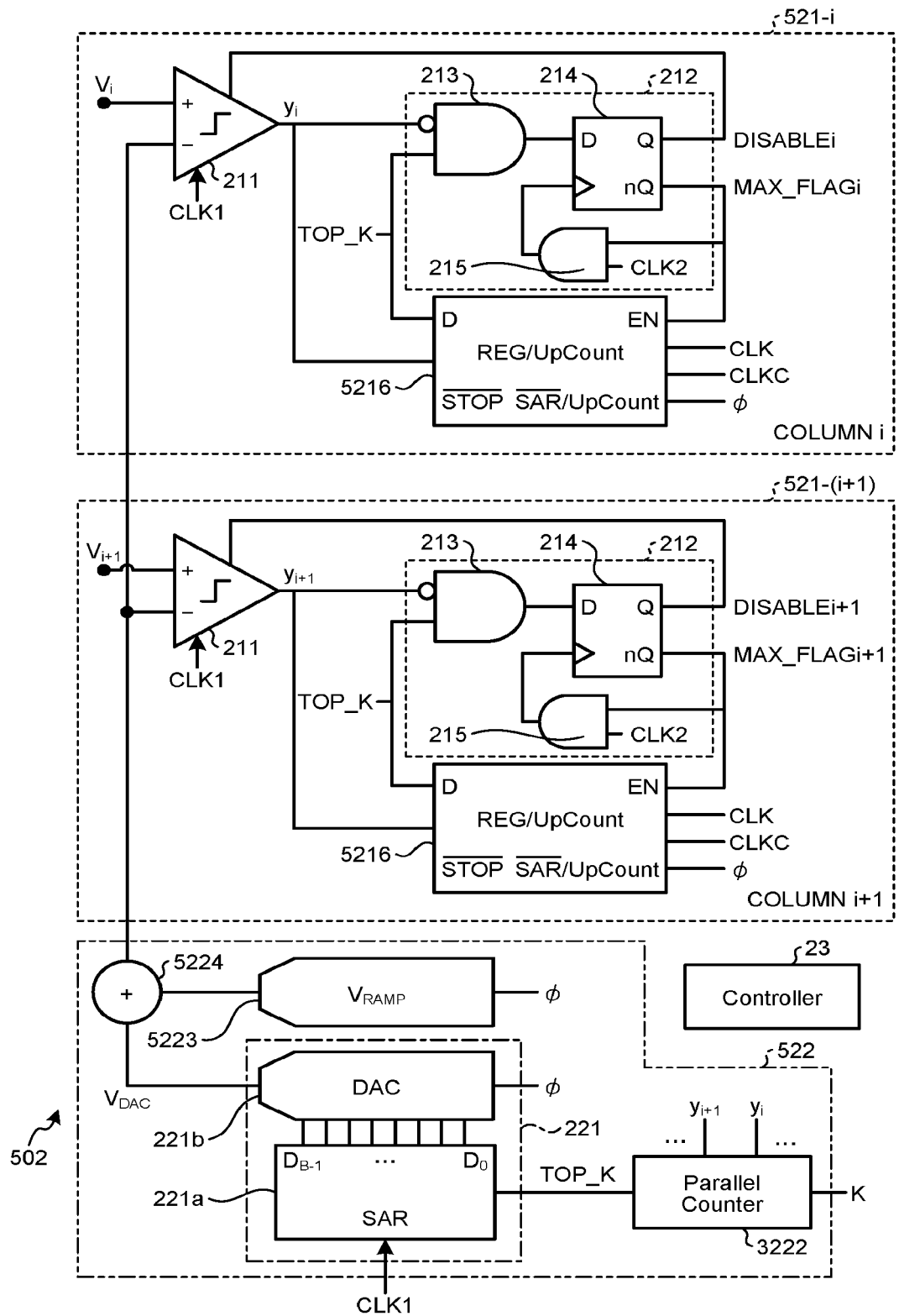
FIG. 15 is a circuit diagram illustrating a configuration of a processing circuit (SARMAXKM circuit) in a third embodiment.

Specifically, the processing circuit 502 may be configured as illustrated in FIG. 15. The processing circuit 502 is a circuit that searches for top K values while performing the SAR type AD conversion processing, and then generates a digital value, and can be called a SARMAXKM circuit. FIG. 15 is a circuit diagram illustrating a configuration of the processing circuit (SARMAXKM circuit) 502 in the third embodiment.

The processing circuit (SARMAXKM circuit) 502 illustrated in FIG. 15 is a circuit extended from the processing circuit (SARMAXK circuit) 302 (see FIG. 9) so as to further obtain a digital value of each of top K values.

The processing circuit 502 is different from the processing circuit 302 in regard to the following points.

A local circuit 521 of each column additionally includes a shift register 5216 having a bit width (or the number of register stages) that is substantially equal to a bit width (or the number of register stages) of the global SAR register 221a. The shift register 5216 is operated as an up counter.

In the local circuit 521 of each column, a terminal nQ that outputs a maximum value flag MAX_FLAG$_i$ or MAX_FLAG$_{i+1}$ of a flip-flop 214 is connected to an enable terminal EN of the shift register 5216.

The shift register 5216 of each column includes two clock input terminals, receives a clock CLK at a first clock input terminal, and receives a faster counter clock CLKC at a second clock input terminal. The clock CLK and the counter clock CLKC may be supplied from a controller 23.

The shift register 5216 of each column includes a data input terminal D that receives a global signal TOP_K. The global signal TOP_K may be supplied from a parallel counter 3222.

The local circuit 521 of each column includes a stop terminal STOP⁻ that receives a local signal $y_i$ or $y_{i+1}$. The local signal $y_i$ or $y_{i+1}$ may be supplied from a comparator 211. The stop terminal STOP⁻ is a low-active terminal.

A global circuit 522 additionally includes a ramp voltage generation circuit 5223 and an adder 5224. The ramp voltage generation circuit 5223 may be implemented by an analog circuit such as an operational amplifier capable of gradually increasing its output voltage. The adder 5224 adds up an output $V_{DAC}$ of a global DAC 221b and an output $V_{RAMP}$ of the ramp voltage generation circuit 5223, and supplies, to the comparator 211 of each column, the addition result as a global reference signal.

A global SAR DAC 221, the ramp voltage generation circuit 5223, and the shift register 5216 of each column each include a synchronization terminal that receives a global synchronization signal φ. The synchronization terminal of the global SAR DAC 221 is a high-active terminal, and each of the synchronization terminals of the ramp voltage generation circuit 5223 and the shift register 5216 of each column is a low-active terminal.

Figure 16:
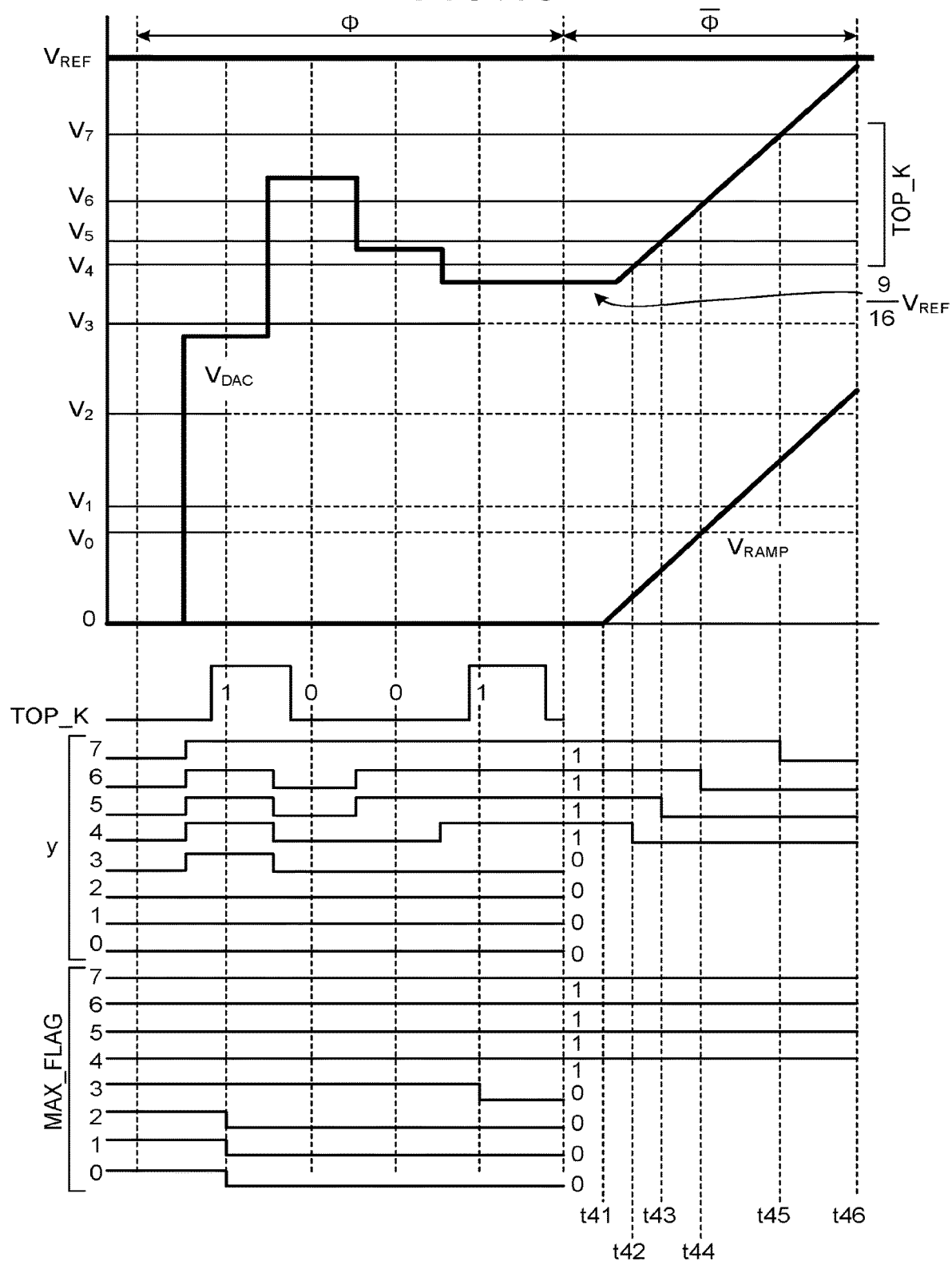
FIG. 16 is a waveform diagram illustrating an operation of the processing circuit (SARMAXKM circuit) in the third embodiment.

For example, the processing circuit 502 is operated as illustrated in FIG. 16. FIG. 16 is a waveform diagram illustrating an operation of the processing circuit (SARMAXKM circuit) 502 in the third embodiment. FIG. 16 illustrates an operation in which the processing circuit 502 that receives signals $V_0$ to $V_7$ of zeroth to seventh columns searches for top K values (K=4) while performing the AD conversion with a precision of four bits, and then generates digital values of top K values.

The global synchronization signal φ illustrated in FIG. 16 divides the AD conversion operation performed by the processing circuit 502 into two phases.

In a first phase indicated by φ, the global synchronization signal φ is maintained at the H level. Accordingly, the processing circuit 502 is operated in the same manner as the processing circuit 302, in which the global SAR DAC 221 is active and the ramp voltage generation circuit 5223 and the shift register 5216 of each column are non-active. The processing circuit 502 performs an operation similar to the operation illustrated in FIG. 10 and performs an operation of searching for top K values among the signals $V_0$ to $V_7$ of the zeroth to seventh columns. At the time of the completion of the first phase, a slightly smaller bit value corresponding to the magnitude of the K-th highest signal $V_i$ is stored in the global SAR register 1221a, and maximum value flags MAX_FLAG$_i$ of columns (i=4 to 7) corresponding to top K values are respectively at the H level (or 1).

In a second phase indicated by φ⁻, the global synchronization signal φ is maintained at the L level. Accordingly, in the processing circuit 502, the global SAR DAC 221 is non-active and the ramp voltage generation circuit 5223 and the shift register 5216 of each column are active. The output of the global DAC 221b maintains the level thereof at the time of the completion of the first phase (in this case, $V_{DAC}=9/16V_{REF}$). This operation may be configured so that the global SAR register 221a adaptively holds the bit value according to the global synchronization signal φ that is at the L level, or may be implemented by adding another register for holding the bit value.

At a timing t41, the shift register 5216 of each column starts an operation of counting the number of counter clocks CLKC, and the ramp voltage generation circuit 5223 starts to linearly increase the amplitude of the voltage $V_{RAMP}$ output therefrom from 0. Accordingly, the adder 5224 starts to linearly increase a global reference signal output therefrom from the value at the time of the completion of the first phase (for example, 9/16$V_{REF}$).

At this time, the comparators 211 of the columns (fourth to seventh columns) corresponding to top K values are selectively operated, and the comparators 211 of the columns (zeroth to third columns) that are disabled are stopped.

In addition, the shift registers 5216 of the columns (i=4 to 7) corresponding to top K values are enabled with the maximum value flags MAX_FLAGi=1 and selectively operated, and the shift registers 5216 of the other columns (i=0 to 3) are disabled and stopped with the maximum value flags MAX_FLAG$_i$=0.

At a timing t42, in a case of the comparator 211 of the fourth column corresponding to the K-th value among top K values, the level of the local signal y$_4$ is changed from the H level to the L level according to the level of the signal V$_4$ lower than the level of the global reference signal. Accordingly, the shift register 5216 of the fourth column stops the counting operation. As a result, the count value is held in the shift register 5216 of the fourth column as a digital value according to the level of the signal V$_4$.

At a timing t43, in a case of the comparator 211 of the fifth column corresponding to the (K−1)-th value among top K values, the level of the local signal y$_5$ is changed from the H level to the L level according to the level of the signal V$_5$ lower than the level of the global reference signal. Accordingly, the shift register 5216 of the fifth column stops the counting operation. As a result, the count value is held in the shift register 5216 of the fifth column as a digital value according to the level of the signal V$_5$.

At a timing t44, in a case of the comparator 211 of the sixth column corresponding to the (K−2)-th value among top K values, the level of the local signal y$_6$ is changed from the H level to the L level according to the level of the signal V$_6$ lower than the level of the global reference signal. Accordingly, the shift register 5216 of the sixth column stops the counting operation. As a result, the count value is held in the shift register 5216 of the sixth column as a digital value according to the level of the signal V$_6$.

At a timing t45, in a case of the comparator 211 of the seventh column corresponding to the (K−3)-th value (in this case, the highest value) among top K values, the level of the local signal y$_7$ is changed from the H level to the L level according to the level of the signal V$_7$ lower than the level of the global reference signal. Accordingly, the shift register 5216 of the seventh column stops the counting operation. As a result, the count value is held in the shift register 5216 of the seventh column as a digital value according to the level of the signal V$_7$.

At a timing t46 when the second phase is completed, the processing circuit 502 outputs the result of searching for top K values, and the digital values of top K values are also output from the shift registers 5216 of the respective columns corresponding to top K values. In this example, the result of searching top K values indicates that, the signals V$_4$ to V$_7$ of the fourth to seventh columns are searched for as top K values among the signals V$_0$ to V$_7$ of the zeroth to seventh columns, and the respective digital values of top K values indicating the magnitude relationship V$_4$<V$_5$<V$_6$<V$_7$ are generated. For example, in a case where softmax processing is further applied to the respective digital values of top K values, information regarding the certainty of each of top K values can be obtained.

As described above, in the third embodiment, the processing circuit (SARMAXKM circuit) 502 is configured to perform a plurality of additional SS-type AD conversion processings by using the common global SAR DAC 221 and selectively using the comparators 211 and the shift registers 5216 corresponding to top K values. That is, since the common global SAR DAC 221 is used for the plurality of additional SS type AD conversion processings, the circuit configuration may be simplified and the circuit area may be reduced as compared with the implementation using the AD converter for each column. In addition, since the comparators 211 and the shift registers 5216 to be operated are limited to the comparators 211 and the shift registers 5216 corresponding to top K values, and the selective AD conversion operation is performed, power consumption may be reduced as compared with the implementation using the AD converter for each column. In addition, since the processing circuit 502 performs a plurality of SS type AD conversion processings on a plurality of input signals from a plurality of columns in parallel, it is possible to easily increase the operation speed. Therefore, the circuit area and power consumption may be reduced and the operation speed may be increased.

(Modified Example of Third Embodiment)

Figure 17:
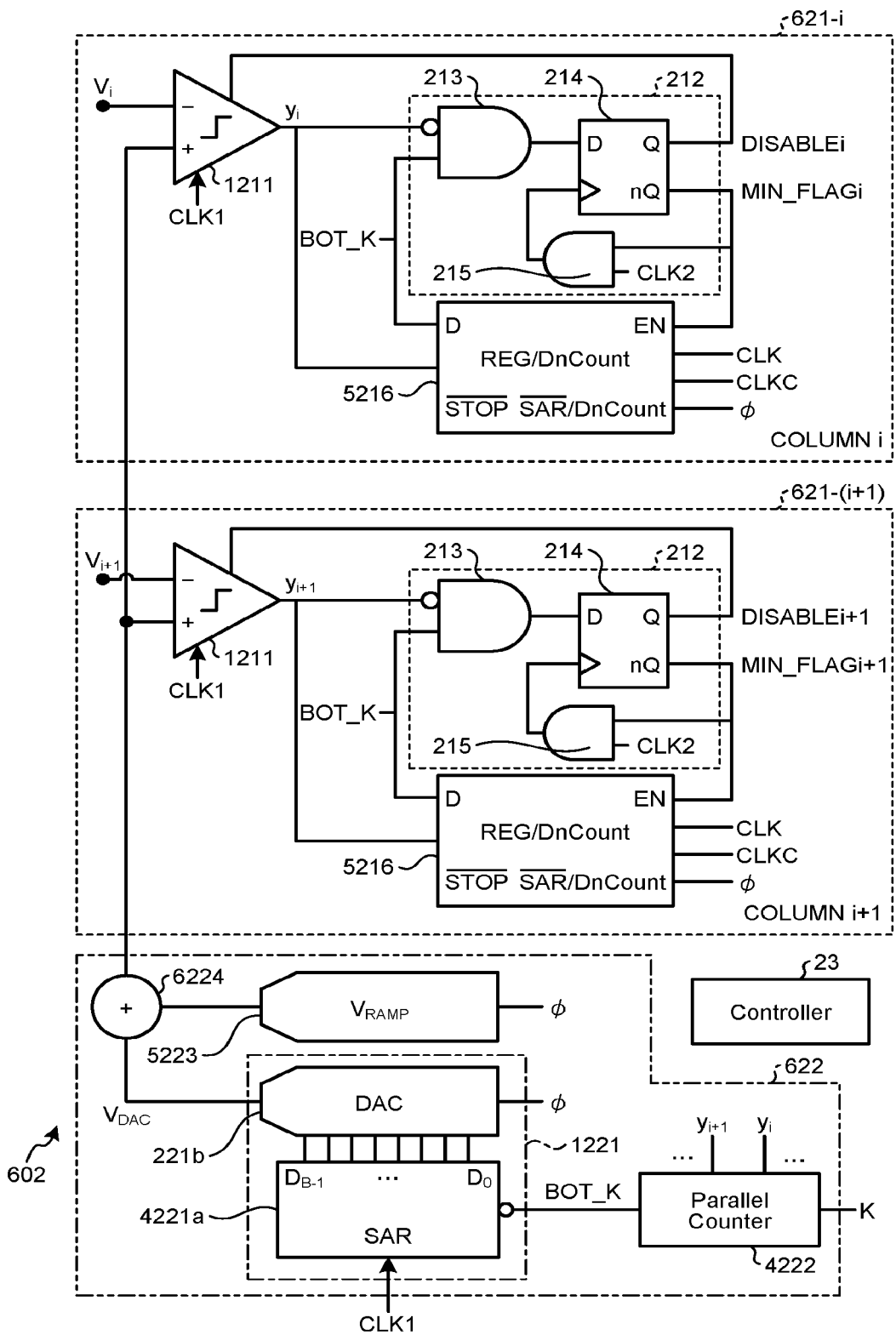
FIG. 17 is a circuit diagram illustrating a configuration of a processing circuit (SARMINKM circuit) in a modified example of the third embodiment.

Alternatively, as illustrated in FIG. 17, a processing circuit 602 configured to perform SS type AD conversion processing to obtain a digital value of each of bottom K values after searching for bottom K values may be used. The processing circuit 602 is a circuit that searches for bottom K values while performing the SAR type AD conversion processing, and then generates a digital value, and can be called a SARMINKM circuit. FIG. 17 is a circuit diagram illustrating a configuration of the processing circuit (SARMINKM circuit) 602 in a modified example of the third embodiment.

Local circuits 621-$i$ and 621-($i$+1) of the respective columns ($i$-th and ($i$+1)-th columns) each have a comparator 1211 in which two input terminals of the comparator 211 (see FIG. 3) are reversed. The comparator 1211 receives signals V$_i$ and V$_{i+1}$ at a non-inverting input terminal (+) and receives a global reference signal V$_{DAC}$ at an inverting input terminal (−).

In a global circuit 622, a parallel counter 4222 counts how many of local signals y$_i$ and y$_{i+1}$ output from comparators 1211 of respective columns are at the H level (or 1) for each DA conversion cycle, and outputs a global signal BOT_K to an AND gate 213 of each column and a global SAR register 4221$a$ according to the count value. When searching for bottom K values, in a case where the count value is K or more, the parallel counter 4222 outputs the global signal BOT_K=H level (or 1), and in a case where the count value is less than K, the parallel counter 4222 outputs the global signal BOT_K=L level (or 0). Once the global signal BOT_K is supplied, the global SAR register 4221$a$ stores a value obtained by logically inverting a value of the global signal BOT_K in a register of the first stage and shifts a value held in the register of each stage.

Further, the global circuit 622 includes a subtractor 6224 instead of the adder 5224 (see FIG. 15). The subtractor 6224 subtracts an output V$_{RAMP}$ of a ramp voltage generation circuit 5223 from an output V$_{DAC}$ of a global DAC 221$b$, and supplies, to the comparator 211 of each column, the subtraction result as a global reference signal.

Figure 18:
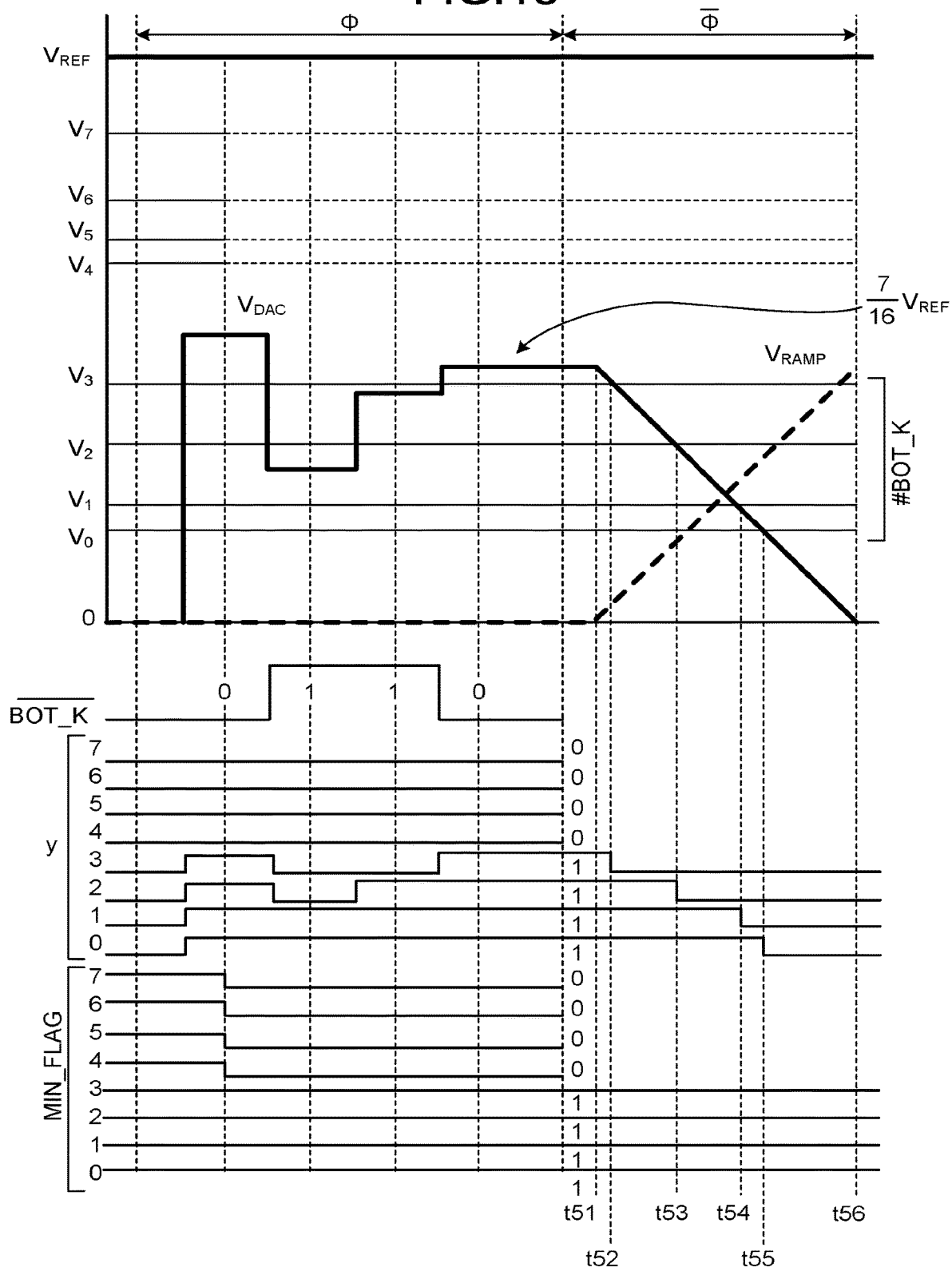
FIG. 18 is a waveform diagram illustrating an operation of the processing circuit (SARMINKM circuit) in the modified example of the third embodiment.

With this configuration, as illustrated in FIG. 18, the processing circuit 602 searches for bottom K values while performing the SAR type AD conversion processing, and then performs the SS type AD conversion processing and generates digital values of bottom K values. FIG. 18 is a waveform diagram illustrating an operation of the processing circuit (SARMINKM circuit) 602 in the modified example of the third embodiment. FIG. 18 illustrates a case where K=4.

In a first phase indicated by φ, the processing circuit 602 performs an operation similar to the operation illustrated in FIG. 13 and performs an operation of searching for bottom K values among signals V$_0$ to V$_7$ of zeroth to seventh columns. At the time of the completion of the first phase, a slightly greater bit value corresponding to the magnitude of the K-th lowest signal V$_i$ is stored in the global SAR register 4221a, and minimum value flags MIN_FLAG$_i$ of columns (i=0 to 3) corresponding to bottom K values are selectively at the H level (or 1).

In a second phase indicated by φ⁻, the output of the global DAC 221b maintains the level at the time of the completion of the first phase (in this case, $V_{DAC}=7/16V_{REF}$).

At a timing t51, a shift register 5216 of each column starts an operation of counting the number of counter clocks CLKC, and the ramp voltage generation circuit 5223 starts to linearly increase the amplitude of the voltage $V_{RAMP}$ output therefrom from 0. Accordingly, the subtractor 6224 starts to linearly decrease a global reference signal output therefrom from the value at the time of the completion of the first phase (for example, $7/16V_{REF}$).

At this time, the comparators 1211 of the columns (zeroth to third columns) corresponding to bottom K values are selectively operated, and the comparators 1211 of the columns (fourth to seventh columns) that are disabled are stopped.

In addition, the shift registers 5216 of the columns (i=0 to 3) corresponding to bottom K values are enabled with the minimum value flags MIN_FLAG$_i$=1 and selectively operated, and the shift registers 5216 of the other columns (i=4 to 7) are disabled and stopped with the minimum value flags MIN_FLAG$_i$=0.

At a timing t52, in a case of the comparator 1211 of the third column corresponding to the K-th value among bottom K values, the level of the local signal $y_3$ is changed from the H level to the L level according to the level of the signal $V_3$ higher than the level of the global reference signal. Accordingly, the shift register 5216 of the third column stops the counting operation. As a result, the count value is held in the shift register 5216 of the third column as a digital value according to the level of the signal $V_3$.

At a timing t53, in a case of the comparator 1211 of the second column corresponding to the (K−1)-th value among bottom K values, the level of the local signal $y_2$ is changed from the H level to the L level according to the level of the signal $V_2$ higher than the level of the global reference signal. Accordingly, the shift register 5216 of the second column stops the counting operation. As a result, the count value is held in the shift register 5216 of the second column as a digital value according to the level of the signal $V_2$.

At a timing t54, in a case of the comparator 1211 of the first column corresponding to the (K−2)-th value among bottom K values, the level of the local signal $y_1$ is changed from the H level to the L level according to the level of the signal $V_1$ higher than the level of the global reference signal. Accordingly, the shift register 5216 of the first column stops the counting operation. As a result, the count value is held in the shift register 5216 of the first column as a digital value according to the level of the signal V.

At a timing t55, in a case of the comparator 1211 of the zeroth column corresponding to the (K−3)-th value (in this case, the lowest value) among bottom K values, the level of the local signal $y_0$ is changed from the H level to the L level according to the level of the signal $V_0$ higher than the level of the global reference signal. Accordingly, the shift register 5216 of the zeroth column stops the counting operation. As a result, the count value is held in the shift register 5216 of the zeroth column as a digital value according to the level of the signal $V_0$.

At a timing t56 when the second phase is completed, the processing circuit 602 outputs the result of searching for bottom K values, and the digital values of bottom K values are also output from the shift registers 5216 of the respective columns corresponding to bottom K values. In this example, the result of searching for bottom K values indicates that, the signals $V_0$ to $V_3$ of the zeroth to third columns are searched for as bottom K values among the signals $V_0$ to $V_7$ of the zeroth to seventh columns, and the respective digital values of bottom K values indicating the magnitude relationship $V_0<V_1<V_2<V_3$ are generated. For example, in a case where the softmax processing is further applied to the respective digital values of bottom K values, information regarding the certainty of each of bottom K values can be obtained.

Also with such a configuration, the processing circuit (SARMAXKM circuit) 502 uses the common global SAR DAC 1221 for the plurality of additional SS type AD conversion processings, and thus, the circuit configuration may be simplified and the circuit area may be reduced as compared with the implementation using the AD converter for each column. In addition, since the comparators 1211 and the shift registers 5216 to be operated are limited to the comparators 1211 and the shift registers 5216 corresponding to bottom K values, and the selective AD conversion operation is performed, power consumption may be reduced as compared with the implementation using the AD converter for each column. In addition, since the processing circuit 602 performs a plurality of SS type AD conversion processings on a plurality of input signals from a plurality of columns in parallel, it is possible to easily increase the operation speed. Therefore, the circuit area and power consumption may be reduced and the operation speed may be increased.

Fourth Embodiment

Next, a computation system 1 according to a fourth embodiment will be described. In the following, the parts different from the first to third embodiments will be mainly described.

For a plurality of multiplication elements forming a plurality of rows and a plurality of columns, it is useful to search for the maximum value or top K values of cosine similarity $S_i$ between an input vector X and a weight vector $W_i$ of each column (i-th column) as shown in the following Math. 2.

$$S_i = \frac{X \cdot W_i}{\|X\|\|W_i\|} \quad \text{Math. 2}$$

The search of the maximum value or top K values of the cosine similarity $S_i$ may be simplified to a search of the maximum value or top K values of $S_i'$ as shown in Math. 3.

$$S_i' = \frac{X \cdot W_i}{\|W_i\|} \quad \text{Math. 3}$$

In Math. 3, 'X·W$_i$' indicates the inner product of the input vector X and the weight vector $W_i$, and $\|W_i\|$ represents an L2 norm of the vector $W_i$. An application in which the input vector X is repeatedly compared with a specific static vector W includes a maximum inner product search (MIPS). The maximum inner product search may be applied for various purposes such as image recognition and document comparison processing.

Figure 19:
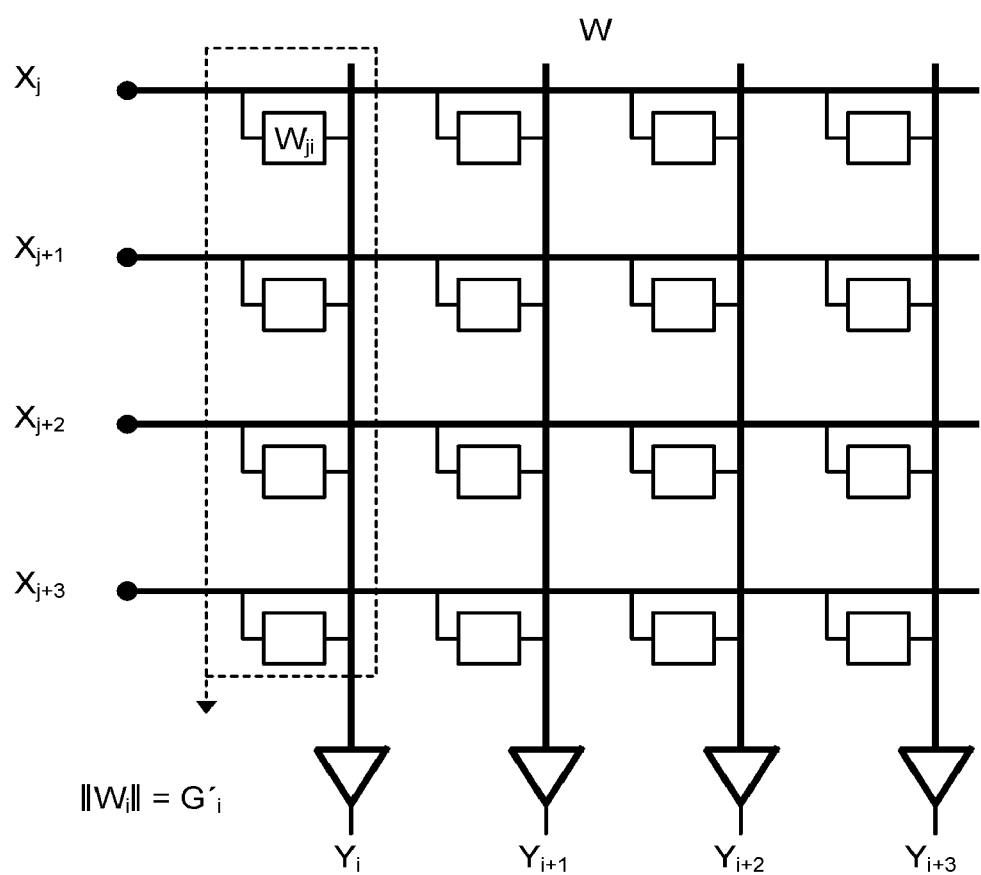
FIG. 19 is a diagram illustrating a first method of searching for the maximum value of cosine similarity.

As a first method of searching for the maximum value of the cosine similarity, an AD converter may be added for each column on the output side of a crossbar array of a plurality of memory elements as illustrated in FIG. 19, and a digital computation circuit (not illustrated) is further added on the output side of the AD converter. FIG. 19 is a diagram illustrating the first method of searching for the maximum value of the cosine similarity. The plurality of multiplication elements can be implemented by the crossbar array of the plurality of memory elements as illustrated in FIG. 19. In this configuration, each column of a weight matrix W constitutes the weight vector. The weight vector $W_i$ of the i-th column indicated by a dotted line in FIG. 19 has an L2 norm as shown in Math. 4, which is pre-computed.

$$\|W_i\|=G_i' \qquad \text{Math. 4}$$

The search of a higher cosine similarity of the weight vector $W_i$ of each column with respect to the input vector X includes the computation of $X \cdot W_i = Y$ in the memory, and the digital computation of $S_i$ with respect to Y and sorting of $S_i$.

Figure 20:
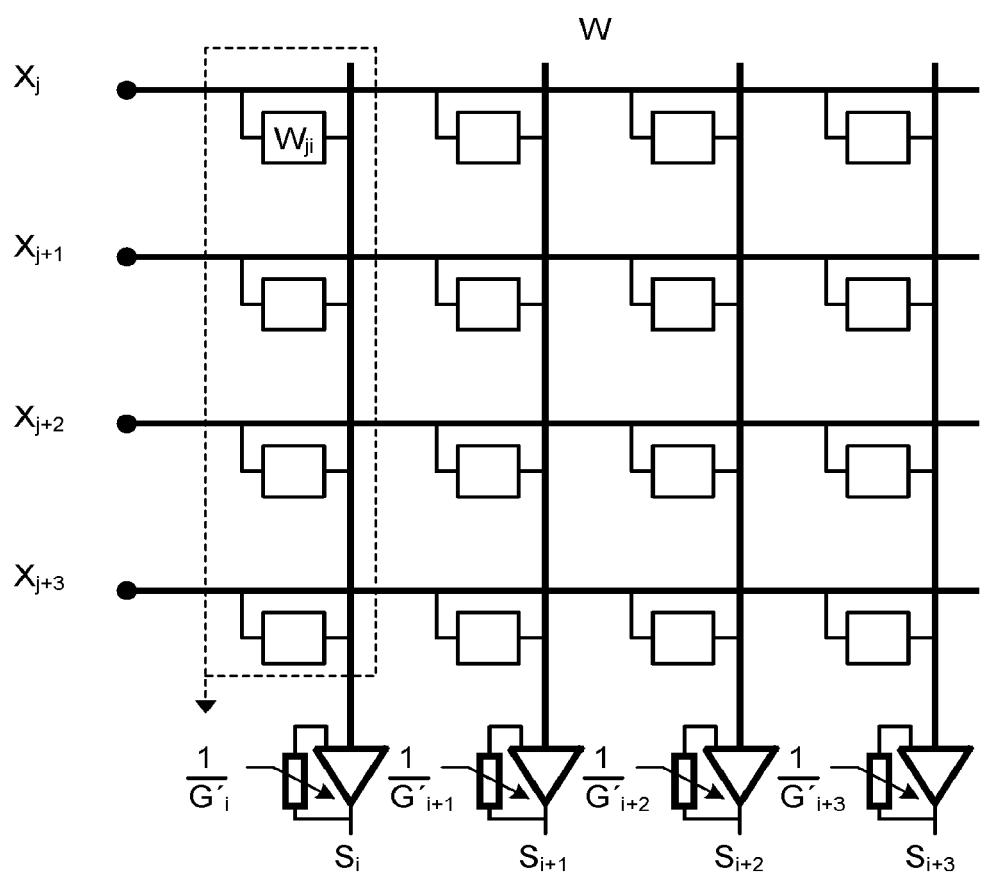
FIG. 20 is a diagram illustrating a second method of searching for the maximum value of the cosine similarity.

Alternatively, as a second method of searching for the maximum value of the cosine similarity, an analog computation circuit may be added on the output side of a crossbar array of a plurality of memory elements as illustrated in FIG. 20. FIG. 20 is a diagram illustrating the second method of searching for the maximum value of the cosine similarity. Since the crossbar array of the plurality of memory elements inherently implements the inner product of the input vector X and the weight vector $W_i$, a signal of each column may be scaled with an L2 norm $G_i'$ of each column that is pre-computed in an analog domain. The L2 norm $G_i'$ may be quantized into a different range of attenuated values to simplify the circuit configuration.

In both the first method illustrated in FIG. 19 and the second method illustrated in FIG. 20, various attenuation stages are provided in each column, and thus, the circuit configuration tends to be complicated and the circuit area tends to increase.

On the other hand, in a case where the signal $V_i$ of each column is scaled, the processing circuit (SARMAX circuit) 2 of the first embodiment searches for the maximum value of the signal $V_i$ after scaling, which can be applied to a search of the maximum cosine similarity.

Here, it is assumed that a vector Y as a result of multiplication of the input vector X and the weight vector $W_i$ is expressed by the following Math. 5.

$$Y = X \cdot W_i = \{Y_0, Y_1, \ldots, Y_{N-1}\} \qquad \text{Math. 5}$$

Further, it is assumed to obtain the maximum cosine similarity expressed by the following Math. 6.

$$S = \left\{ \frac{Y_0}{\|W_0\|}, \frac{Y_1}{\|W_1\|}, \ldots, \frac{Y_{N-1}}{\|W_{N-1}\|} \right\} \qquad \text{Math. 6}$$

The L2 norm of each column
$\|W_i\|$
may be simplified to a gain $G_i'$ as shown in Math. 7 by quantization.

$$\text{quant } i\ \S(\|W_i\|) = G_i' \in G = \{G_0, \ldots, G_{N-1}\} \qquad \text{Math. 7}$$

In this case, as shown in Math. 7, the gain $G_i'$ is selected from predetermined $G_0$ to $G_{N-1}$. As a result, the cosine similarity of each column can be approximated as shown in Math. 8.

$$S' = \left\{ \frac{Y_0}{G_0'}, \frac{Y_1}{G_1'}, \ldots, \frac{Y_{N-1}}{G_{N-1}'} \right\} \qquad \text{Math. 8}$$

Math. 8 shows that the approximate cosine similarity $S_i' = Y_i / G_i'$ is obtained by dividing a product-sum computation result $Y_i$ of each column by the gain $G_i'$.

In the fourth embodiment, the processing circuit (SAR-MAX circuit) 2 of the first embodiment is improved so that, instead of scaling the signal $V_i$ of each column by dividing the signal $V_i$ of each column by the gain $G_i'$, the signal $V_i$ of each column is equivalently scaled by multiplying a global reference signal, which is a comparison target of the signal $V_i$, by the gain $G_i'$.

Figure 21:
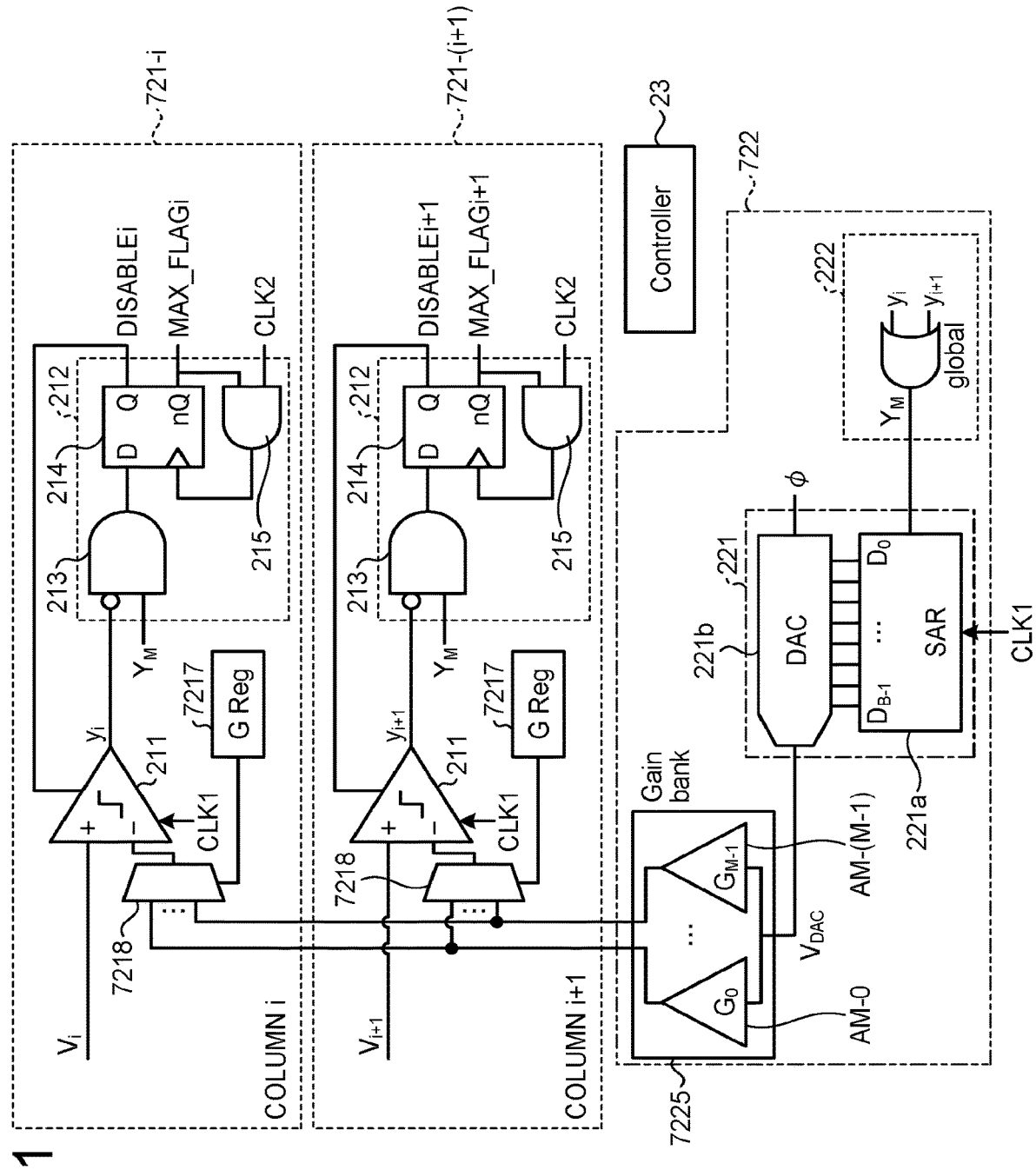
FIG. 21 is a circuit diagram illustrating a configuration of a processing circuit (SARMAXG circuit) in a fourth embodiment.

Specifically, a processing circuit 702 of the computation system 1 can be configured as illustrated in FIG. 21. The processing circuit 702 is a circuit that searches for the maximum cosine similarity by performing scaling with a gain while performing the SAR type AD conversion processing, and may be called a SARMAXG circuit. FIG. 21 is a circuit diagram illustrating a configuration of the processing circuit (SARMAXG circuit) 702 in the fourth embodiment.

In the processing circuit 702, a global circuit 722 performs scaling by outputting a global reference signal $G_m V_{DAC}$ obtained by multiplying $V_{DAC}$ output from a global DAC 221b by a gain $G_m$, passing through a gain bank 7225. The gain bank 7225 includes M gain amplifiers AM-0 to AM-(M−1) on M signal lines connected in parallel between a comparator 211 of each column and the global DAC 221b. The gain amplifiers AM-0, and AM-(M−1) have a gain $G_0, \ldots,$ and $G_{M-1}$, respectively, and input signals are multiplied by the gains $G_0, \ldots,$ and $G_{M-1}$, and output.

In a local circuit 721 of each column, an inverting input terminal (−) of the comparator 211 is connected to the m-th signal line assigned depending on the gain $G_i'$ among M signal lines, and receives the global reference signal $G_m V_{DAC}$. An index m corresponds to a fixed gain $G_m$ □G={G0, ..., and $G_{M-1}$}. The index value m is pre-stored in a register (G Reg) 7217. A selector 7218 selects a signal line corresponding to the index value m stored in the register 7217 among M signal lines and connects the selected signal line to the inverting input terminal (−) of the comparator 211. As a result, the comparator 211 of each column may receive the global reference signal $G_m V_{DAC}$ obtained by performing multiplication by $G_m$ assigned thereto.

Figure 22:
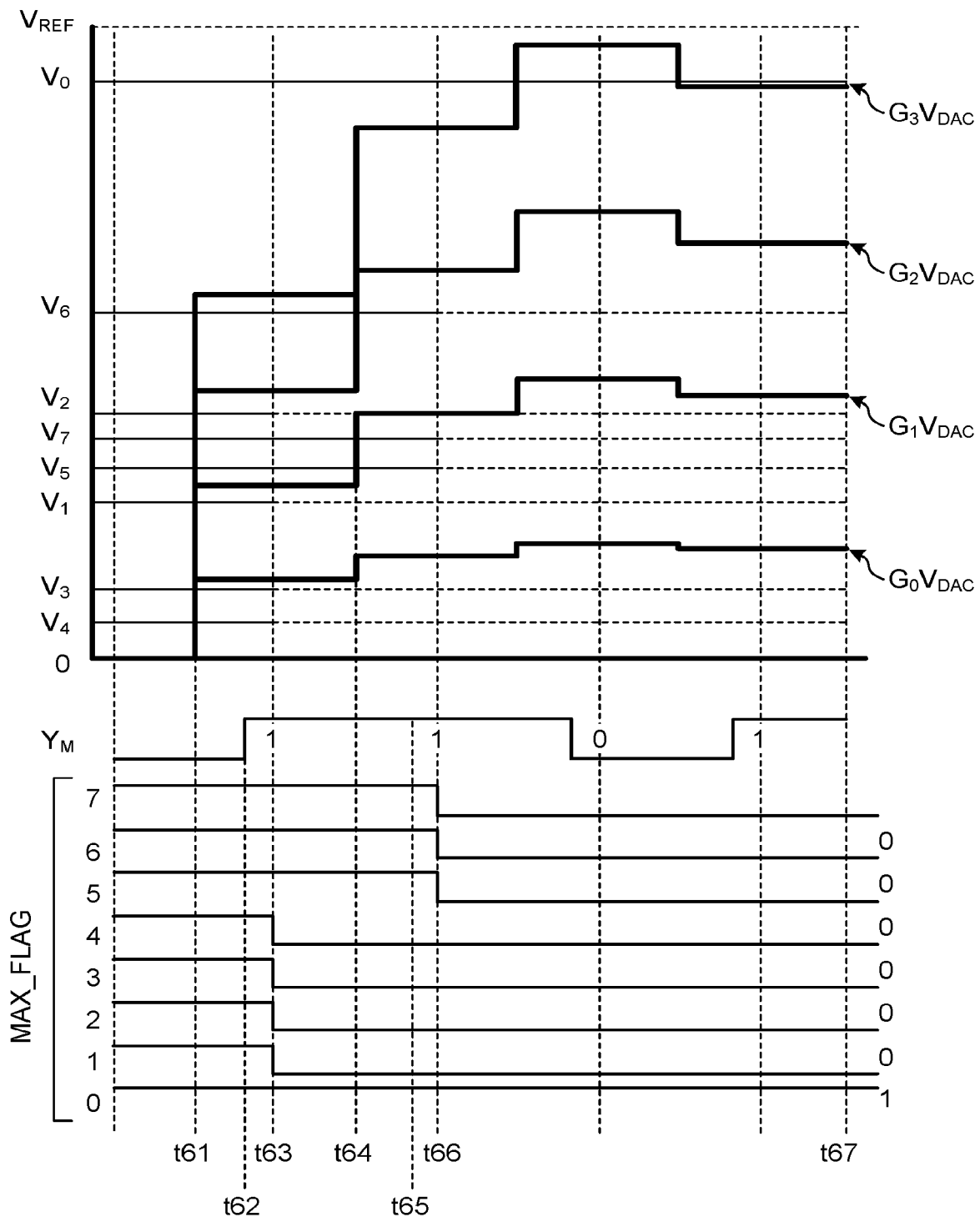
FIG. 22 is a waveform diagram illustrating an operation of the processing circuit (SARMAXG circuit) in the fourth embodiment.

For example, the processing circuit 702 is operated as illustrated in FIG. 22. FIG. 22 is a waveform diagram illustrating an operation of the processing circuit (SAR-MAXG circuit) 702 in the fourth embodiment. FIG. 22 illustrates an operation in which the processing circuit 702 that receives signals $V_0$ to $V_7$ of zeroth to seventh columns searches for the maximum cosine similarity using the scaled global reference signal while performing the AD conversion with a precision of four bits.

In the example of FIG. 22, the gain $G_m$ is assigned as follows. The gain $G_0$ with an index 0 is assigned to the third column. The gain $G_1$ with an index 1 is assigned to the first, fifth, and seventh columns. The gain $G_2$ with an index 2 is assigned to the second, fourth, and sixth columns. The gain $G_3$ with an index 3 is assigned to the zeroth column.

At a timing t61, a global SAR DAC 221 and the gain bank 7225 set a global reference voltage of the third column to $G_0 V_{DAC} = G_0 V_{REF}/2$, set global reference voltages of the first, fifth, and seventh columns to $G_1 V_{DAC} = G_1 V_{REF}/2$, set global reference voltages of the second, fourth, and sixth columns to $G_2 V_{DAC} = G_2 V_{REF}/2$, and set a global reference voltage of the zeroth column to $G_3 V_{DAC} = G_3 V_{REF}/2$. The comparators 211 of the respective columns (zeroth to seventh columns) compare the signals $V_0$ to $V_7$ with the global reference voltages, and output local signals ($y_0$, $y_1$, $y_2$, $y_3$, $y_4$, $y_5$, $y_6$, and $y_7$) (1, 0, 0, 0, 0, 1, 1, and 1) as the comparison results.

At a timing t62, a global OR gate 222 sets a global signal $Y_M$ to the H level (or 1).

At a timing t63, in a case of logic circuits 212 of the first to fourth columns (i=1 to 4), the local signal $y_i$=0 and the global signal $Y_M$=1, and this means that there is no possibility that the signal $V_i$ corresponds to the maximum cosine similarity. Therefore, the logic circuits 212 of the first to fourth columns each change a maximum value flag from MAX_FLAG$_i$=H (or 1) to MAX_FLAG$_i$=L (or 0) and change a disable signal from DISABLE$_i$=L (or 0) to DISABLE$_i$=H (or 1). As a result, as indicated by dotted lines for the waveforms of the signals $V_i$, the comparators 211 of the first to fourth columns receive the disable signal DISABLE$_i$=H (or 1) and the operations thereof are disabled, and power consumption by the comparators 211 is stopped (power gating).

On the other hand, in a case of the logic circuits 212 of the zeroth, and fifth to seventh columns (i=0, and 5 to 7), the local signal $y_i$=1 and the global signal $Y_M$=1, and this means that the signal $V_i$ may correspond to the maximum cosine similarity. Therefore, the logic circuits 212 of the zeroth, and fifth to seventh columns each maintain the maximum value flag at MAX_FLAG$_i$=H (or 1) and maintain the disable signal at DISABLE$_i$=L (or 0).

At a timing t64, the global SAR DAC 221 and the gain bank 7225 set the global reference voltages of the fifth and seventh columns to $G_1 V_{DAC}$=3/4$G_1 V_{REF}$, set the global reference voltage of the sixth column to $G_2 V_{DAC}$=3/4$G_2 V_{REF}$, and set the global reference voltage of the zeroth column to $G_3 V_{DAC}$=3/4$G_3 V_{REF}$. The comparators 211 of the respective columns (i=0, and 5 to 7) compare the signals $V_0$, and $V_5$ to $V_7$ with the global reference voltages, and output the local signals ($y_0$, $y_5$, $y_6$, and $y_7$)=(1, 0, 0, and 0) as the comparison results.

At a timing t65, the global OR gate 222 maintains the global signal $Y_M$ at the H level (or 1).

At a timing t66, in a case of logic circuits 212 of the fifth to seventh columns (i=5 to 7), the local signal $y_i$=0 and the global signal $Y_M$=1, and this means that there is no possibility that the signal $V_i$ corresponds to the maximum cosine similarity. Therefore, the logic circuits 212 of the fifth to seventh columns each change a maximum value flag from MAX_FLAG$_i$=H (or 1) to MAX_FLAG$_i$=L (or 0) and change a disable signal from DISABLE$_i$=L (or 0) to DISABLE$_i$=H (or 1). As a result, as indicated by dotted lines for the waveforms of the signals $V_i$, the comparators 211 of the fifth to seventh columns receive the disable signal DISABLE$_i$=H (or 1) and the operations thereof are disabled, and power consumption by the comparators 211 is stopped (power gating).

On the other hand, in a case of the logic circuit 212 of the zeroth column (i=0), the local signal $y_i$=1 and the global signal $Y_M$=1, and this means that the signal $V_i$ may correspond to the maximum cosine similarity. Therefore, the logic circuit 212 of the zeroth column maintains the maximum value flag at MAX_FLAG$_i$=H (or 1) and maintains the disable signal at DISABLE$_i$=L (or 0).

In a case where the number of bits according to the precision of the conversion is B, at a timing t67 after B cycles (B =4), the processing circuit 702 outputs (MAX_FLAG$_0$, MAX_FLAG$_1$, MAX_FLAG$_2$, MAX_FLAG$_3$, MAX_FLAG$_4$, MAX_FLAG$_5$, MAX_FLAG$_6$, and MAX_FLAG$_7$)=(H, L, L, L, L, L, L, and L) (or (1, 0, 0, 0, 0, 0, 0, and 0)) as a maximum cosine similarity search result. In this example, the maximum cosine similarity search result indicates that the signal $V_0$ of the zeroth column is searched for as a value corresponding to the maximum cosine similarity among the signals $V_0$ to $V_7$ of the zeroth to seventh columns.

As described above, in the fourth embodiment, the processing circuit (SARMAXG circuit) 702 of the computation system 1 uses the common global SAR DAC 221 and the gain bank 7225, and thus, the circuit configuration may be simplified and the circuit area may be reduced as compared with the implementation using the AD converter for each column. In addition, since the number of comparators 211 to be operated is gradually reduced, and the selective AD conversion operation is performed, power consumption may be reduced as compared with the implementation using the AD converter for each column. In addition, since the processing circuit 702 performs a plurality of SAR type AD conversion processings using the scaled global reference signal in parallel on input signals of a plurality of columns by applying binary search, to search for the maximum cosine similarity in parallel, it is possible to easily increase the operation speed. Therefore, the circuit area and power consumption may be reduced and the operation speed may be increased.

(Modified Example of Fourth Embodiment)

Figure 23:
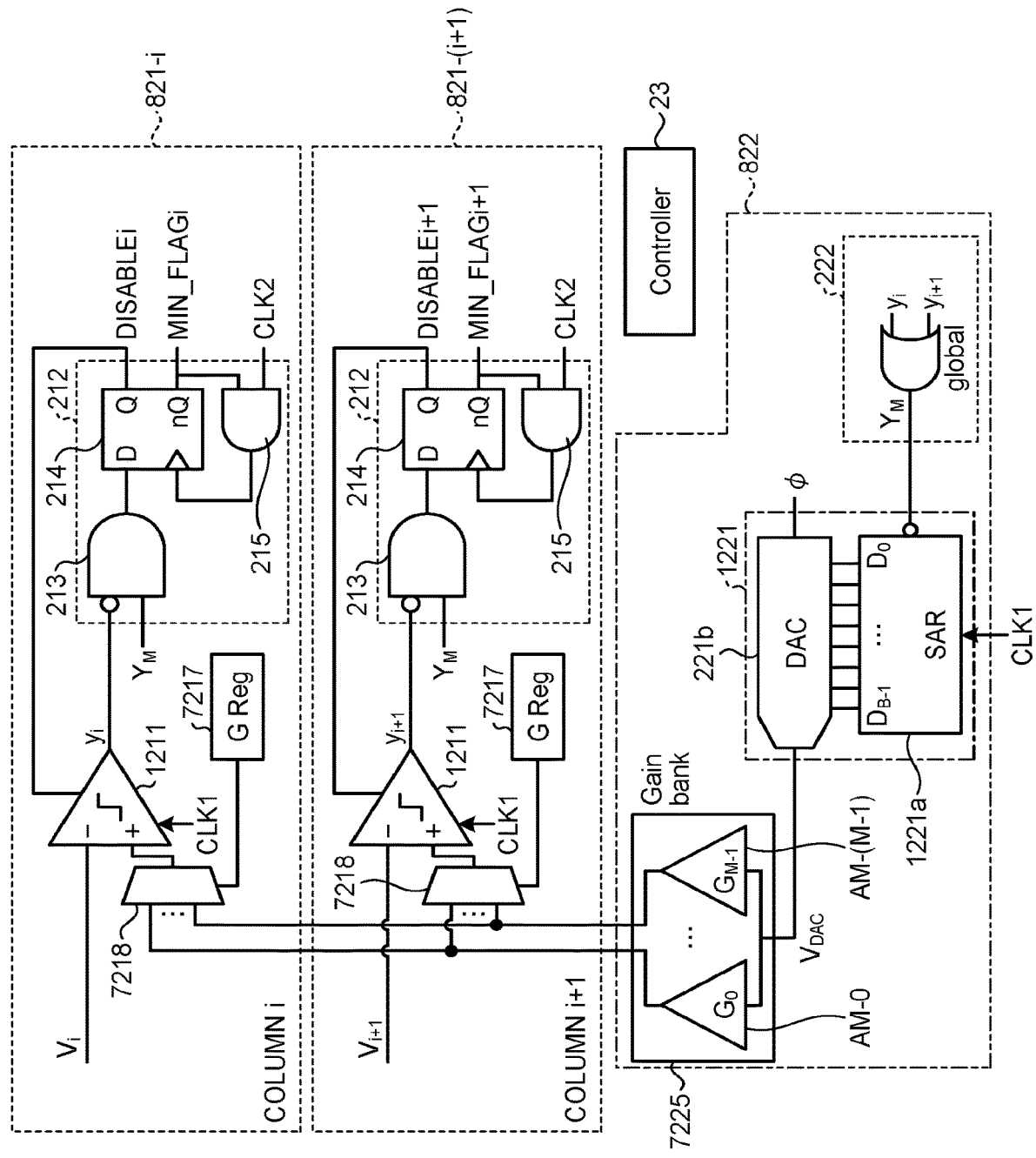
FIG. 23 is a circuit diagram illustrating a configuration of a processing circuit (SARMING circuit) in a modified example of the fourth embodiment.

Alternatively, as illustrated in FIG. 23, a processing circuit 802 configured to search for the minimum cosine similarity may be used. The processing circuit 802 is a circuit that searches for the minimum cosine similarity by performing scaling with a gain while performing the SAR type AD conversion processing, and may be called a SARMING circuit. FIG. 23 is a circuit diagram illustrating a configuration of the processing circuit (SARMING circuit) 702 in a modified example of the fourth embodiment.

Figure 24:
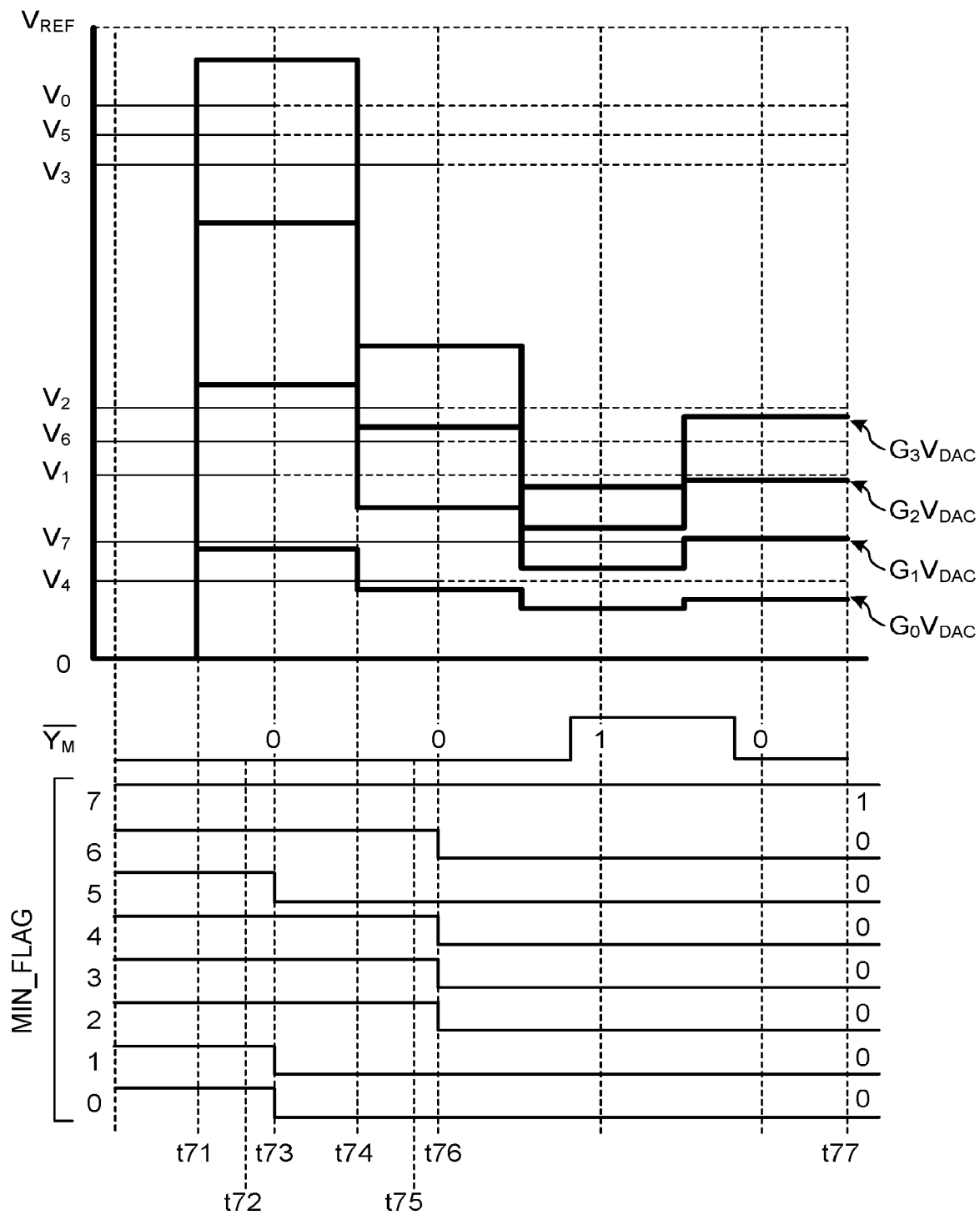
FIG. 24 is a waveform diagram illustrating an operation of the processing circuit (SARMING circuit) in the modified example of the fourth embodiment.

Local circuits 821-$i$ and 821-($i$+1) of the respective columns each have a comparator 1211 in which two input terminals of the comparator 211 (see FIG. 3) are reversed. The comparator 1211 receives a signal $V_i$ at a non-inverting input terminal (+) and receives a global reference signal $V_{DAC}$ at an inverting input terminal (−). A global SAR DAC 1221 of a global circuit 822 includes a global SAR register 1221a that logically inverts and receives a global signal $Y_M$ from a global OR gate 222. With this configuration, as illustrated in FIG. 24, the processing circuit 802 searches for the minimum cosine similarity using the scaled global reference signal while performing the SAR type AD conversion processing. FIG. 24 is a waveform diagram illustrating an operation of the processing circuit (SARMING circuit) 802 in the modified example of the fourth embodiment.

The comparator 1211 of each column receives the signal $V_i$ at the inverting input terminal (−) and receives the global reference voltage $G_i V_{DAC}$ at the non-inverting input terminal (+), and thus, in a case where the signal $V_i$ is lower than the global reference voltage $G_i V_{DAC}$, a local signal $y_i$=1 is output, and in a case where the signal $V_i$ is higher than the global reference voltage $G_i V_{DAC}$, the local signal $y_i$=0 is output.

In the example of FIG. 24, a gain $G_m$ is assigned as follows. A gain $G_0$ with an index 0 is assigned to a fourth column. A gain $G_1$ with an index 1 is assigned to first, sixth, and seventh columns. A gain $G_2$ with an index 2 is assigned to zeroth, second, and fifth columns. A gain $G_3$ with an index 3 is assigned to a third column.

At a timing t71, the global SAR DAC 1221 and a gain bank 7225 set the global reference voltage of the fourth column to $G_0 V_{DAC}$=$G_0 V_{REF}$/2, set the global reference voltages of the first, sixth, and seventh columns to $G_1V_{DAC}=G_1V_{REF}/2$, set the global reference voltages of the zeroth, second, and fifth columns to $G_2V_{DAC}=G_2V_{REF}/2$, and set the global reference voltage of the third column to $G_3V_{DAC}=G_3V_{REF}/2$. The comparators 211 of the respective columns (zeroth to seventh columns) compare signals $V_0$ to $V_7$ with the global reference voltages, and output local signals ($y_0$, $y_1$, $y_2$, $y_3$, $y_4$, $y_5$, $y_6$, and $y_7$)=(0, 0, 1, 1, 1, 0, 1, and 1) as the comparison results.

At a timing t72, the global OR gate 222 sets the global signal $Y_M$ to the H level (or 1). The level of an inverted signal $Y_M^-$ obtained by logically inverting the global signal becomes the L level (or 0).

At a timing t73, in a case of logic circuits 212 of the zeroth, first, and fifth columns (i=0, 1, and 5), the local signal $y_i$=0 and the global signal $Y_M$=1, and this means that there is no possibility that the signal $V_i$ corresponds to the minimum cosine similarity. Therefore, the logic circuits 212 of the zeroth, first, and fifth columns each change a minimum value flag from MIN_FLAG$_i$=H (or 1) to MIN_FLAG$_i$=L (or 0) and change a disable signal from DISABLE$_i$=L (or 0) to DISABLE$_i$=H (or 1). As a result, as indicated by dotted lines for the waveforms of the signals $V_i$, the comparators 211 of the zeroth, first, and fifth columns receive the disable signal DISABLE$_i$=H (or 1) and the operations thereof are disabled, and power consumption by the comparators 211 is stopped (power gating).

On the other hand, in a case of the logic circuits 212 of the second to fourth, sixth, and seventh columns (i=2 to 4, 6, and 7), the local signal $y_i$=1 and the global signal $Y_M$=1, and this means that the signal $V_i$ may correspond to the minimum cosine similarity. Therefore, the logic circuits 212 of the second to fourth, sixth, and seventh columns each maintain the minimum value flag at MIN_FLAG$_i$=H (or 1) and maintain the disable signal at DISABLE$_i$=L (or 0).

At a timing t74, the global SAR DAC 1221 and the gain bank 7225 set the global reference voltage of the fourth column to $G_0V_{DAC}=G_0V_{REF}/4$, set the global reference voltages of the sixth and seventh columns to $G_1V_{DAC}=G_1V_{REF}/4$, set the global reference voltage of the second column to $G_2V_{DAC}=G_2V_{REF}/4$, and set the global reference voltage of the third column to $G_3V_{DAC}=G_3V_{REF}/4$. The comparators 211 of the respective columns (i=2 to 4, 6, and 7) compare the signals $V_2$ to $V_4$, $V_6$, and $V_7$ with the global reference voltages, and output the local signals ($y_2$, $y_3$, $y_4$, $y_6$, and $y_7$)=(0, 0, 0, 0, and 1) as the comparison results.

At a timing t75, the global OR gate 222 maintains the global signal $Y_M$ at the H level (or 1). The inverted signal $Y_M^-$ obtained by logically inverting the global signal is maintained at the L level (or 0).

At a timing t76, in a case of the logic circuits 212 of the second to fourth, and sixth columns (i=2 to 4, and 6), the local signal $y_i$=0 and the global signal $Y_M$=1, and this means that there is no possibility that the signal $V_i$ corresponds to the minimum cosine similarity. Therefore, the logic circuits 212 of the second to fourth, and sixth columns each change a minimum value flag from MIN_FLAG$_i$=H (or 1) to MIN_FLAG$_i$=L (or 0) and change a disable signal from DISABLE$_i$=L (or 0) to DISABLE$_i$=H (or 1). As a result, as indicated by dotted lines for the waveforms of the signals $V_i$, the comparators 211 of the second to fourth, and sixth columns receive the disable signal DISABLE$_i$=H (or 1) and the operations thereof are disabled, and power consumption by the comparators 1211 is stopped (power gating).

On the other hand, in a case of the logic circuit 212 of the seventh column (i=7), the local signal $y_i$=1 and the global signal $Y_M$=1, and this means that the signal $V_i$ may correspond to the minimum cosine similarity. Therefore, the logic circuit 212 of the seventh column maintains the minimum value flag at MIN_FLAG$_i$=H (or 1) and maintains the disable signal at DISABLE$_i$=L (or 0).

In a case where the number of bits according to the precision of the conversion is B, at a timing t77 after B cycles (B=4), the processing circuit 802 outputs (MIN_FLAG$_0$, MIN_FLAG$_1$, MIN_FLAG$_2$, MIN_FLAG$_3$, MIN_FLAG$_4$, MIN_FLAG$_5$, MIN_FLAG$_6$, and MIN_FLAG$_7$)=(L, L, L, L, L, L, L, and H) (or (0, 0, 0, 0, 0, 0, 0, and 1)) as a minimum cosine similarity search result. In this example, the minimum cosine similarity search result indicates that the signal $V_7$ of the seventh column is searched for as a value corresponding to the minimum cosine similarity among the signals $V_0$ to $V_7$ of the zeroth to seventh columns.

Also with such a configuration, the processing circuit (SARMING circuit) 802 uses the common global SAR DAC 1221, and thus, the circuit configuration can be simplified and the circuit area can be reduced as compared with the implementation using the AD converter for each column. In addition, since the number of comparators 1211 to be operated is gradually reduced, and the selective AD conversion operation is performed, power consumption can be reduced as compared with the implementation using the AD converter for each column. In addition, since the processing circuit 802 performs a plurality of SAR type AD conversion processings using the scaled global reference signal in parallel on input signals of a plurality of columns by applying binary search, to search for the minimum cosine similarity in parallel, it is possible to easily increase the operation speed. Therefore, the circuit area and power consumption can be reduced and the operation speed can be increased.

Fifth Embodiment

Next, a computation system 1 according to a fifth embodiment will be described. In the following, the parts different from the first to fourth embodiments will be mainly described.

In the fourth embodiment, a case where the processing circuit 702 searches for the maximum cosine similarity while performing the SAR type AD conversion processing is illustrated. However, in the fifth embodiment, a case where a processing circuit 902 searches for top K cosine similarities while performing the SAR type AD conversion processing is illustrated.

Figure 25:
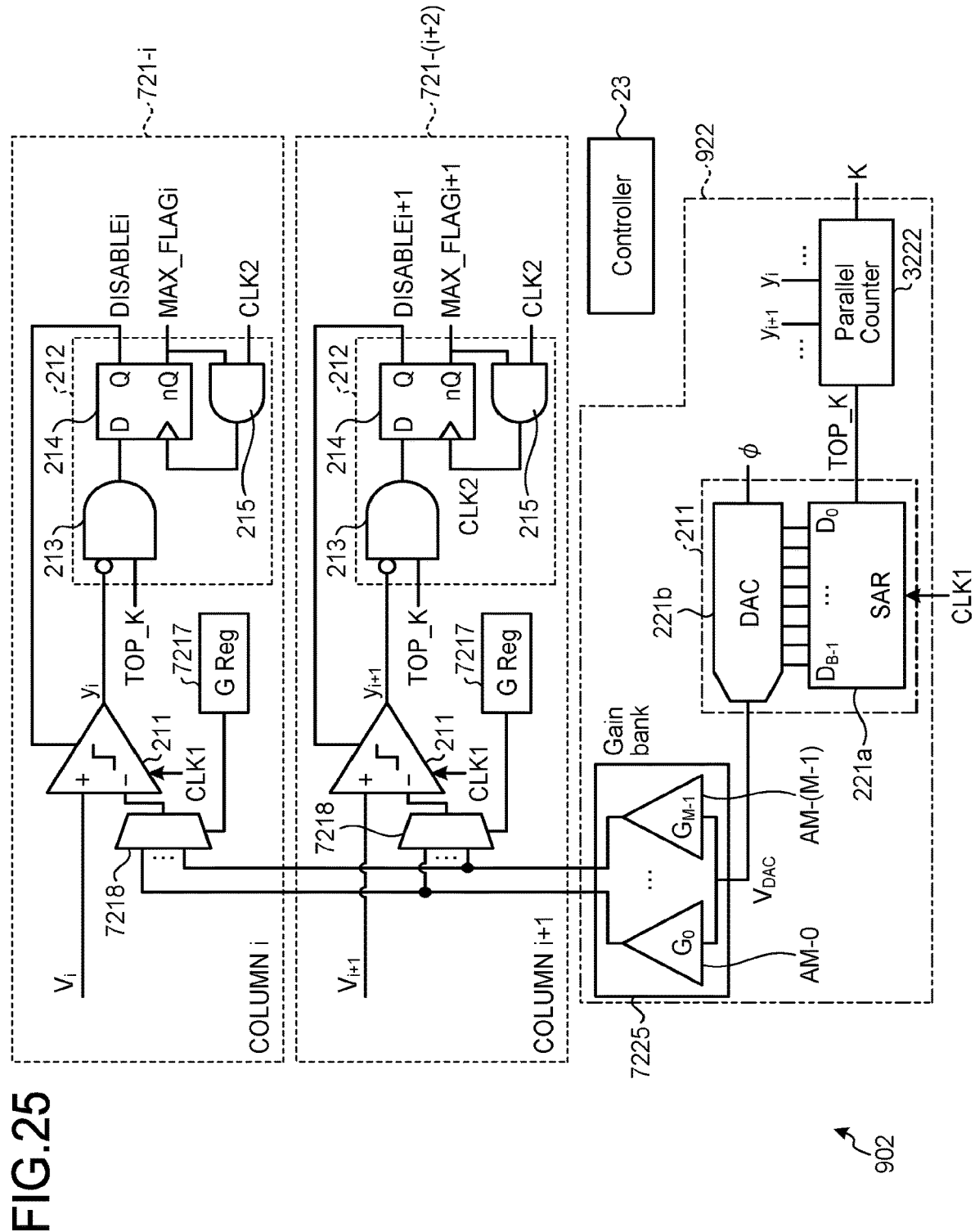
FIG. 25 is a circuit diagram illustrating a configuration of a processing circuit (SARMAXKG circuit) in a fifth embodiment.

Specifically, the processing circuit 702 of the computation system 1 can be configured as illustrated in FIG. 25. The processing circuit 902 is a circuit that searches for top K cosine similarities by performing scaling with a gain while performing the SAR type AD conversion processing, and can be called a SARMAXKG circuit. FIG. 25 is a circuit diagram illustrating a configuration of the processing circuit (SARMAXKG circuit) 902 in the fifth embodiment.

In the processing circuit 902, the global OR gate 222 of the global circuit 722 (see FIG. 21) is replaced with the parallel counter 3222 (see FIG. 9) in a global circuit 922. Similarly to the fourth embodiment, the global circuit 922 performs scaling by outputting a global reference signal $G_mV_{DAC}$ obtained by multiplying $V_{DAC}$ output from a global DAC 221b by a gain $G_m$, passing through a gain bank 7225. A local circuit 721 of each column is similar to that in the fourth embodiment.

Figure 26:
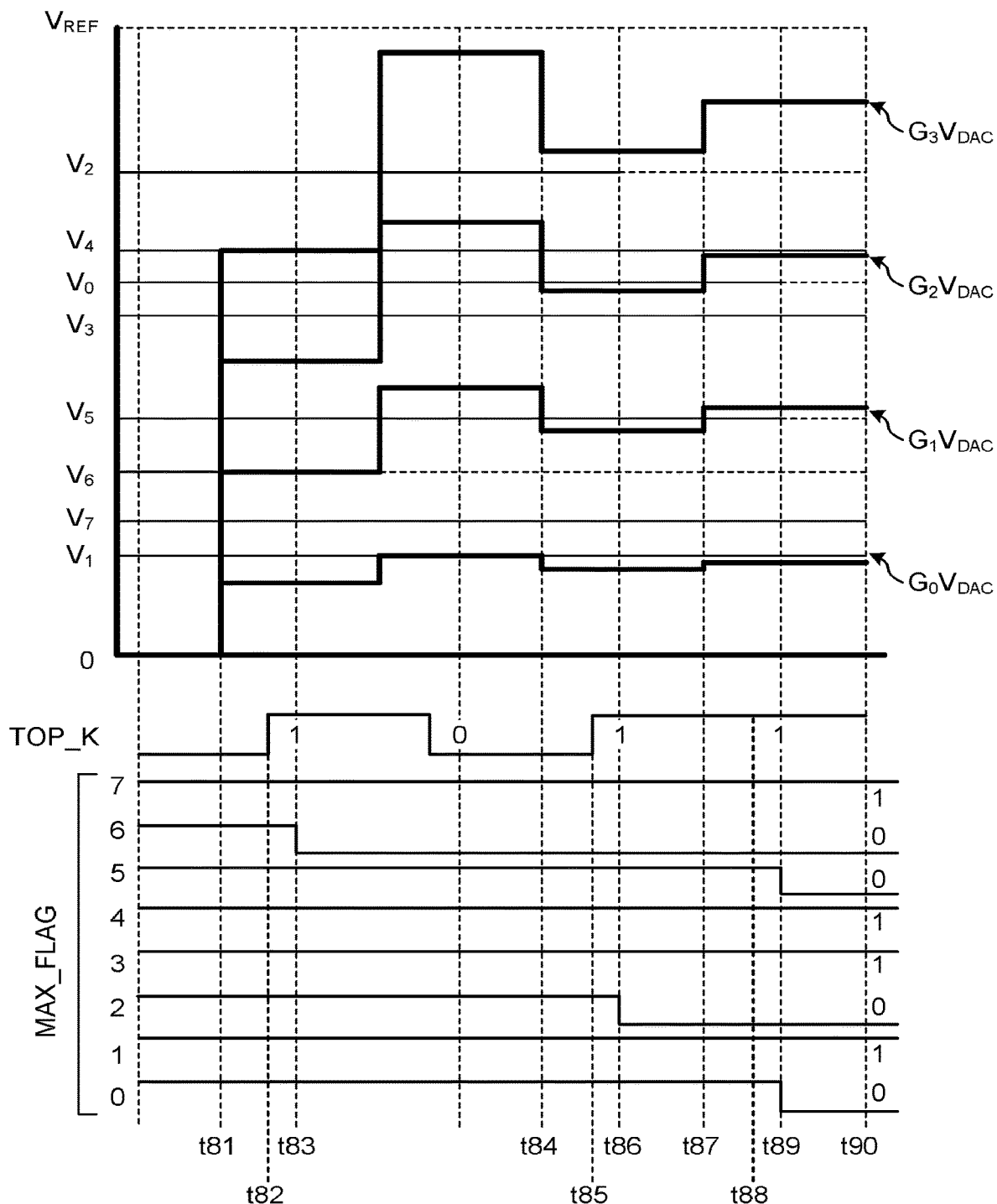
FIG. 26 is a waveform diagram illustrating an operation of the processing circuit (SARMAXKG circuit) in the fifth embodiment.

For example, the processing circuit 902 is operated as illustrated in FIG. 26. FIG. 26 is a waveform diagram illustrating an operation of the processing circuit (SAR-MAXKG circuit) 902 in the fifth embodiment. FIG. 26 illustrates an operation in which the processing circuit 902 that receives signals $V_0$ to $V_7$ of zeroth to seventh columns searches for top K cosine similarities using the scaled global reference signal while performing the AD conversion with a precision of four bits. FIG. 26 illustrates a case where K=4.

In the example of FIG. 26, the gain $G_m$ is assigned as follows. A gain $G_0$ with an index 0 is assigned to the seventh column. A gain $G_1$ with an index 1 is assigned to the first, third, and fifth columns. A gain $G_2$ with an index 2 is assigned to the zeroth, fourth, and sixth columns. A gain $G_3$ with an index 3 is assigned to the second column.

At a timing t81, a global SAR DAC 221 and the gain bank 7225 set a global reference voltage of the seventh column to $G_0V_{DAC}=G_0V_{REF}/2$, set global reference voltages of the first, third, and fifth columns to $G_1V_{DAC}=G_1V_{REF}/2$, set global reference voltages of the zeroth, fourth, and sixth columns to $G_2V_{DAC}=G_2V_{REF}/2$, and set a global reference voltage of the second column to $G_3V_{DAC}=G_3V_{REF}/2$. Comparators 211 of the respective columns (zeroth to seventh columns) compare the signals $V_0$ to $V_7$ with the global reference voltages, and output local signals ($y_0$, $y_1$, $y_2$, $y_3$, $y_4$, $y_5$, $y_6$, and $y_7$) (1, 1, 1, 1, 1, 1, 0, and 1) as the comparison results.

At a timing t82, the parallel counter 3222 counts the number of local signals $y_i$ having a value of 1, and when the count value reaches seven which is equal to or more than K (K=4), the parallel counter 3222 changes the level of a global signal TOP_K from the L level (or 0) to the H level (or 1).

At a timing t83, in a case of a logic circuit 212 of the sixth column (i=6), the local signal $y_i=0$ and the global signal TOP_K=1, and this means that there is no possibility that the signal $V_i$ is one of top K cosine similarities. Therefore, the logic circuit 212 of the sixth column changes a maximum value flag from MAX_FLAG$_i$=H (or 1) to MAX_FLAG$_i$=L (or 0) and changes a disable signal from DISABLE$_i$=L (or 0) to DISABLE$_i$=H (or 1). As a result, as indicated by a dotted line for the waveform of the signal $V_i$, the comparator 211 of the sixth column receives the disable signal DISABLE$_i$=H (or 1) and the operation thereof is disabled, and power consumption by the comparator 211 is stopped (power gating).

On the other hand, in a case of logic circuits 212 of the zeroth to fifth, and seventh columns (i=0 to 5, and 7), the local signal $y_i=1$ and the global signal TOP_K=1, and this means that the signal $V_i$ may correspond to top K cosine similarities. Therefore, the logic circuits 212 of the zeroth to fifth, and seventh columns each maintain the maximum value flag at MAX_FLAG$_i$=H (or 1) and maintain the disable signal at DISABLE$_i$=L (or 0).

At a timing t84, the global SAR DAC 221 and the gain bank 7225 set the global reference voltage of the seventh column to $G_0V_{DAC}=5/8G_0V_{REF}$, set the global reference voltages of the first, third, and fifth columns to $G_1V_{DAC}=5/8G_1V_{REF}$, set the global reference voltages of the zeroth and fourth columns to $G_2V_{DAC}=5/8G_2V_{REF}$, and set the global reference voltage of the second column to $G_3V_{DAC}=5/8G_3V_{REF}$. The comparators 211 of the respective columns (i=0 to 5, and 7) compare the signals $V_0$ to $V_5$, and $V_7$ with the global reference voltages, and output the local signals ($y_0$, $y_1$, $y_2$, $y_3$, $y_4$, $y_5$, and $y_7$)=(1, 1, 0, 1, 1, 1, and 1) as the comparison results.

At a timing t85, the parallel counter 3222 counts the number of local signals $y_i$ having a value of 1, and when the count value reaches six which is equal to or more than K (K=4), the parallel counter 3222 changes the level of a global signal TOP_K from the L level (or 0) to the H level (or 1).

At a timing t86, in a case of the logic circuit 212 of the second column (i=2), the local signal $y_i=0$ and the global signal TOP_K=1, and this means that there is no possibility that the signal $V_i$ corresponds to top K cosine similarities. Therefore, the logic circuit 212 of the second column changes a maximum value flag from MAX_FLAG$_i$=H (or 1) to MAX_FLAG$_i$=L (or 0) and changes a disable signal from DISABLE$_i$=L (or 0) to DISABLE$_i$=H (or 1). As a result, as indicated by a dotted line for the waveform of the signal $V_i$, the comparator 211 of the second column receives the disable signal DISABLE$_i$=H (or 1) and the operation thereof is disabled, and power consumption by the comparator 211 is stopped (power gating).

On the other hand, in a case of the logic circuits 212 of the zeroth, first, third to fifth, and seventh columns (i=0, 1, 3 to 5, and 7), the local signal $y_i=1$ and the global signal TOP_K=1, and this means that the signal $V_i$ may correspond to top K cosine similarities. Therefore, the logic circuits 212 of the zeroth, first, third to fifth, and seventh columns each maintain the maximum value flag at MAX_FLAG$_i$=H (or 1) and maintain the disable signal at DISABLE$_i$=L (or 0).

At a timing t87, the global SAR DAC 221 and the gain bank 7225 set the global reference voltage of the seventh column to $G_0V_{DAC}=11/16G_0V_{REF}$, set the global reference voltages of the first, third, and fifth columns to $G_1V_{DAC}=11/16G_1V_{REF}$, and set the global reference voltages of the zeroth and fourth columns to $G_2V_{DAC}=11/16G_2V_{REF}$. The comparators 211 of the respective columns (i=0, 1, 3 to 5, and 7) compare the signals $V_0$, $V_1$, $V_3$ to $V_5$, and $V_7$ with the global reference voltages, and output the local signals ($y_0$, $y_1$, $y_2$, $y_3$, $y_4$, $y_5$, and $y_7$)=(0, 1, 1, 1, 0, and 1) as the comparison results.

At a timing t88, the parallel counter 3222 counts the number of local signals $y_i$ having a value of 1, and when the count value reaches four which is equal to or more than K (K=4), the parallel counter 3222 maintains the global signal TOP_K at the H level (or 1).

At a timing t89, in a case of the logic circuits 212 of the zeroth and fifth columns (i=0 and 5), the local signal $y_i=0$ and the global signal TOP_K=1, and this means that there is no possibility that the signal $V_i$ is one of top K cosine similarities. Therefore, the logic circuits 212 of the zeroth and fifth columns each change the maximum value flag from MAX_FLAG$_i$=H (or 1) to MAX_FLAG$_i$=L (or 0) and change the disable signal from DISABLE$_i$=L (or 0) to DISABLE$_i$=H (or 1). As a result, as indicated by dotted lines for the waveforms of the signals $V_i$, the comparators 211 of the zeroth and fifth columns receive the disable signal DISABLE$_i$=H (or 1) and the operations thereof are disabled, and power consumption by the comparators 211 is stopped (power gating).

On the other hand, in a case of the logic circuits 212 of the first, third, fourth, and seventh columns (i=1, 3, 4, and 7), the local signal $y_i=1$ and the global signal TOP_K=1, and this means that the signal $V_i$ may correspond to top K cosine similarities. Therefore, the logic circuits 212 of the first, third, fourth, and seventh columns each maintain the maximum value flag at MAX_FLAG$_i$=H (or 1) and maintain the disable signal at DISABLE$_i$=L (or 0).

In a case where the number of bits according to the precision of the conversion is B, at a timing t90 after B cycles (B=4), the processing circuit 902 outputs (MAX_FLAG$_0$, MAX_FLAG$_1$, MAX_FLAG$_2$, MAX_FLAG$_3$, MAX_FLAG$_4$, MAX_FLAG$_5$, MAX_FLAG$_6$, and MAX_FLAG$_7$)=(L, H, L, H, H, L, L, and H) (or (0, 1, 0, 1, 1, 0, 0, and 1)) as a result of searching for top K cosine similarities. In this example, the result of searching for top K cosine similarities indicates that the signals V$_1$, V$_3$, V$_4$, and V$_7$ of the first, third, fourth, and seventh columns are searched for as values corresponding to top K cosine similarities among the signals V$_0$ to V$_7$ of the zeroth to seventh columns.

As described above, in the fifth embodiment, the processing circuit (SARMAXKG circuit) 902 of the computation system 1 uses the common global SAR DAC 221 and the gain bank 7225, and thus, the circuit configuration can be simplified and the circuit area may be reduced as compared with the implementation using the AD converter for each column. In addition, since the number of comparators 211 to be operated is gradually reduced, and the selective AD conversion operation is performed, power consumption may be reduced as compared with the implementation using the AD converter for each column. In addition, since the processing circuit 702 performs a plurality of SAR type AD conversion processings using the scaled global reference signal in parallel on input signals of a plurality of columns by applying binary search, to search for top K cosine similarities in parallel, it is possible to easily increase the operation speed. Therefore, the circuit area and power consumption may be reduced and the operation speed may be increased.

(Modified Example of Fifth Embodiment)

Figure 27:
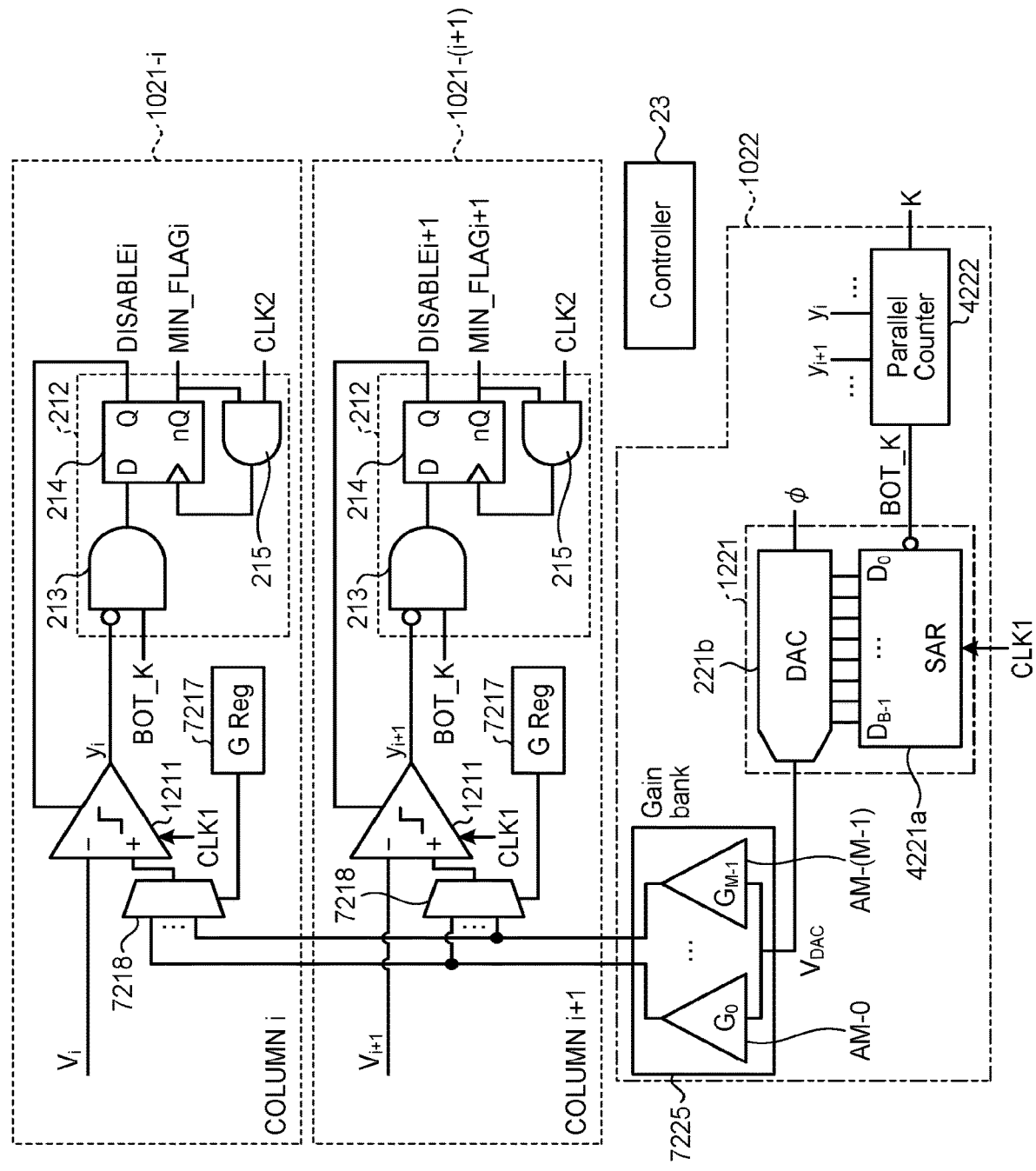
FIG. 27 is a circuit diagram illustrating a configuration of a processing circuit (SARMINKG circuit) in a modified example of the fifth embodiment.

Alternatively, as illustrated in FIG. 27, a processing circuit 1002 configured to search for bottom K cosine similarities may be used. The processing circuit 1002 is a circuit that searches for bottom K cosine similarities by performing scaling with a gain while performing the SAR type AD conversion processing, and may be called a SARMINKG circuit. FIG. 27 is a circuit diagram illustrating a configuration of the processing circuit (SARMINKG circuit) 1002 in a modified example of the fifth embodiment.

Local circuits 1021-$i$ and 1021-($i$+1) of the respective columns each have a comparator 1211 in which two input terminals of the comparator 211 (see FIG. 3) are reversed. The comparator 1211 receives a signal V$_i$ at a non-inverting input terminal (+) and receives a global reference signal V$_{DAC}$ at an inverting input terminal (−). A global SAR DAC 1221 of a global circuit 1022 includes a global SAR register 4221$a$ that logically inverts and receives a global signal BOT_K from a parallel counter 4222. In the global circuit 1022, the global OR gate 222 of the global circuit 822 (see FIG. 23) is replaced with the parallel counter 4222 (see FIG. 12). Similarly to the fourth embodiment, the global circuit 1022 performs scaling by outputting a global reference signal G$_m$V$_{DAC}$ obtained by multiplying V$_{DAC}$ output from a global DAC 221$b$ by a gain G$_m$, passing through a gain bank 7225.

Figure 28:
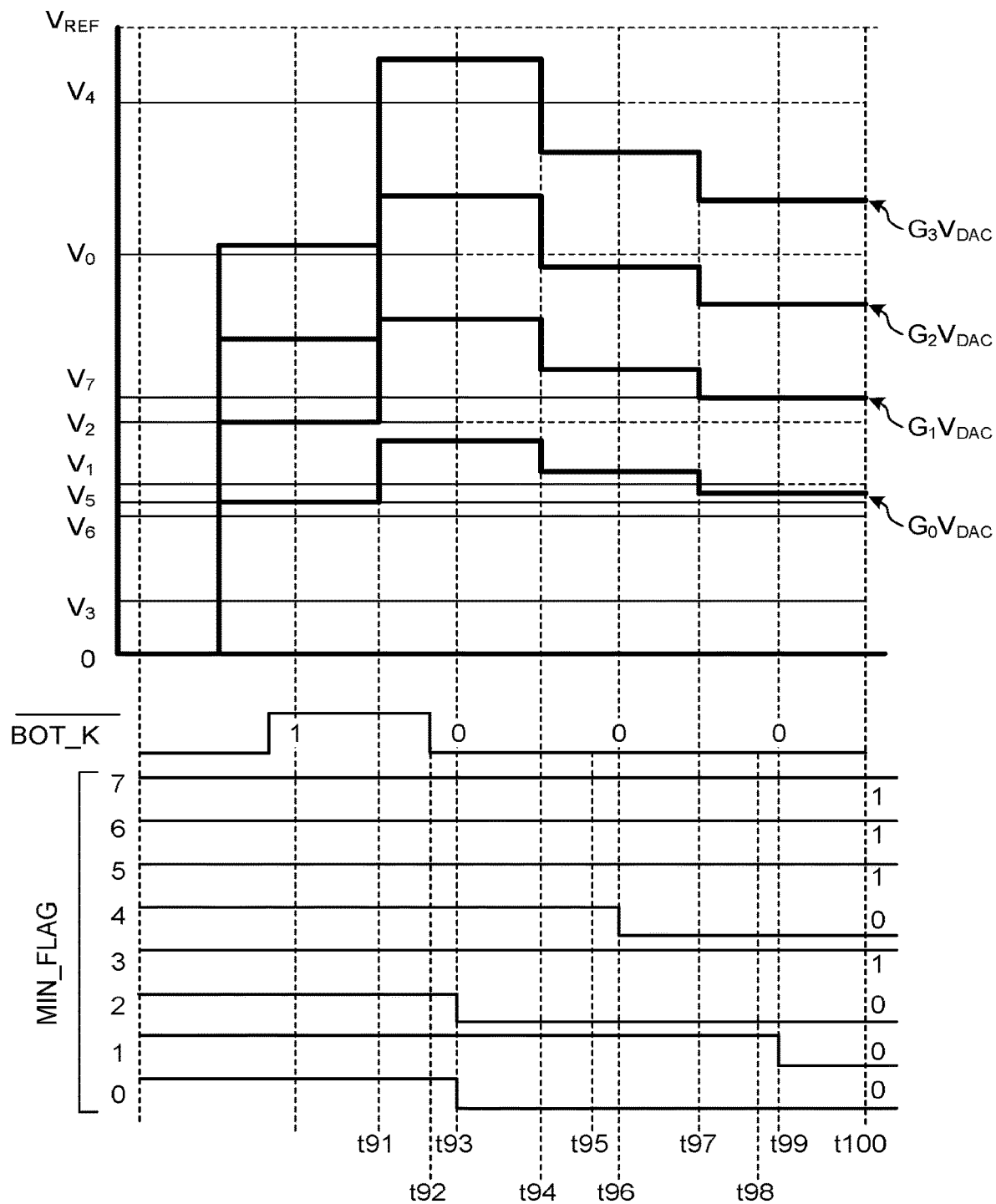
FIG. 28 is a waveform diagram illustrating an operation of the processing circuit (SARMINKG circuit) in the modified example of the fifth embodiment.

With this configuration, as illustrated in FIG. 28, the processing circuit 1002 searches for bottom K cosine similarities using the scaled global reference signal while performing the SAR type AD conversion processing. FIG. 28 is a waveform diagram illustrating an operation of the processing circuit (SARMINKG circuit) 1002 in the modified example of the fifth embodiment.

The comparator 1211 of each column receives the signal V$_i$ at the inverting input terminal (−) and receives the global reference voltage G$_i$V$_{DAC}$ at the non-inverting input terminal (+), and thus, in a case where the signal V$_i$ is lower than the global reference voltage G$_i$V$_{DAC}$, a local signal y$_i$=1 is output, and in a case where the signal V$_i$ is higher than the global reference voltage G$_i$V$_{DAC}$, the local signal y$_i$=0 is output.

In the example of FIG. 28, the gain G$_m$ is assigned as follows. A gain G$_0$ with an index 0 is assigned to first and second columns. A gain G$_1$ with an index 1 is assigned to zeroth and sixth columns. A gain G$_2$ with an index 2 is assigned to fifth and seventh columns. A gain G$_3$ with an index 3 is assigned to third and fourth columns.

At a timing t91, the global SAR DAC 1221 and the gain bank 7225 set global reference voltages of the first and second columns to G$_0$V$_{DAC}$=3/4G$_0$V$_{REF}$, set global reference voltages of the zeroth and sixth columns to G$_1$V$_{DAC}$=3/4G$_1$V$_{REF}$, set global reference voltages of the fifth and seventh columns to G$_2$V$_{DAC}$=3/4G$_2$V$_{REF}$, and set global reference voltages of the third and fourth columns to G$_3$V$_{DAC}$=3/4G$_3$V$_{REF}$. The comparators 211 of the respective columns (zeroth to seventh columns) compare the signals V$_0$ to V$_7$ with the global reference voltages, and output local signals (y$_0$, y$_1$, y$_2$, y$_3$, y$_4$, y$_5$, y$_6$, and y$_7$)=(0, 1, 0, 1, 1, 1, 1, and 1) as the comparison results.

At a timing t92, the parallel counter 4222 counts the number of local signals y$_i$ having a value of 1, and when the count value reaches six which is equal to or more than K (K=4), the parallel counter 4222 changes the level of the global signal BOT_K from the L level (or 0) to the H level (or 1). Accordingly, "0" obtained by logically inverting the global signal BOT_K=1 is stored in a register of the first stage of a global SAR register 221$a$.

At a timing t93, in a case of logic circuits 212 of the zeroth and second columns (i=0 and 2), the local signal y$_i$=0 and the global signal BOT_K=1, and this means that there is no possibility that the signal V$_i$ corresponds to bottom K cosine similarities. Therefore, the logic circuits 212 of the zeroth and second columns each change a minimum value flag from MIN_FLAG$_i$=H (or 1) to MIN_FLAG$_i$=L (or 0) and change a disable signal from DISABLE$_i$=L (or 0) to DISABLE$_i$=H (or 1). As a result, as indicated by dotted lines for the waveforms of the signals V$_i$, the comparators 211 of the zeroth and second columns receive the disable signal DISABLE$_i$=H (or 1) and the operations thereof are disabled, and power consumption by the comparators 211 is stopped (power gating).

On the other hand, in a case of logic circuits 212 of the first, and third to seventh columns (i=1, and 3 to 7), the local signal y$_i$=1 and the global signal BOT_K=1, and this means that the signal V$_i$ may correspond to bottom K cosine similarities. Therefore, the logic circuits 212 of the first, and third to seventh columns each maintain the minimum value flag at MIN_FLAG$_i$=H (or 1) and maintain the disable signal at DISABLE$_i$=L (or 0).

At a timing t94, the global SAR DAC 1221 and the gain bank 7225 set the global reference voltage of the first column to G$_0$V$_{DAC}$=5/8G$_0$V$_{REF}$, set the global reference voltage of the sixth column to G$_1$V$_{DAC}$=5/8G$_1$V$_{REF}$, set the global reference voltages of the fifth and seventh columns to G$_2$V$_{DAC}$=5/8G$_2$V$_{REF}$, and set the global reference voltages of the third and fourth columns to G$_3$V$_{DAC}$=5/8G$_3$V$_{REF}$. The comparators 211 of the respective columns (i=1, and 3 to 7) compare the signals V$_1$, and V$_3$ to V$_7$ with the global reference voltages, and output the local signals (y$_1$, y$_3$, y$_4$, y$_5$, y$_6$, and y$_7$)=(1, 1, 0, 1, 1, and 1) as the comparison results.

At a timing t95, the parallel counter 4222 counts the number of local signals y$_i$ having a value of 1, and when the count value reaches six which is equal to or more than K (K=4), the parallel counter 4222 maintains the global signal BOT_K at the H level (or 1). Accordingly, "0" obtained by logically inverting the global signal BOT_K=1 is stored in a register of the first stage of a global SAR register 221a.

At a timing t96, in a case of the logic circuit 212 of the fourth column (i=4), the local signal $y_i$=0 and the global signal BOT_K, and this means that there is no possibility that the signal $V_i$ corresponds to bottom K cosine similarities. Therefore, the logic circuit 212 of the fourth column changes the minimum value flag from MIN_FLAG$_i$=H (or 1) to MIN_FLAG$_i$=L (or 0) and changes the disable signal from DISABLE$_i$=L (or 0) to DISABLE$_i$=H (or 1). As a result, as indicated by a dotted line for the waveform of the signal $V_i$, the comparator 211 of the fourth column receives the disable signal DISABLE$_i$=H (or 1) and the operation thereof is disabled, and power consumption by the comparator 211 is stopped (power gating).

On the other hand, in a case of the logic circuits 212 of the first, third, and fifth to seventh columns (i=1, 3, and 5 to 7), the local signal $y_i$=1 and the global signal BOT_K=1, and this means that the signal $V_i$ may correspond to bottom K cosine similarities. Therefore, the logic circuits 212 of the first, third, and fifth to seventh columns each maintain the minimum value flag at MIN_FLAG$_i$=H (or 1) and maintain the disable signal at DISABLE$_i$=L (or 0).

At a timing t97, the global SAR DAC 1221 and the gain bank 7225 set the global reference voltage of the first column to $G_0V_{DAC}$=9/16$G_0V_{REF}$, set the global reference voltage of the sixth column to $G_1V_{DAC}$=9/16$G_1V_{REF}$, set the global reference voltages of the fifth and seventh columns to $G_2V_{DAC}$=9/16$G_2V_{REF}$, and set the global reference voltage of the third column to $G_3V_{DAC}$=9/16$G_3V_{REF}$. The comparators 211 of the respective columns (i=1, 3, and 5 to 7) compare the signals $V_1$, $V_3$, and $V_5$ to $V_7$ with the global reference voltages, and output the local signals ($y_1$, $y_3$, $y_5$, $y_6$, and $y_7$)=(0, 1, 1, 1, and 1) as the comparison results.

At a timing t98, the parallel counter 4222 counts the number of local signals $y_i$ having a value of 1, and when the count value reaches four which is equal to or more than K (K=4), the parallel counter 4222 maintains the global signal BOT_K at the H level (or 1). Accordingly, "0" obtained by logically inverting the global signal BOT_K=1 is stored in a register of the first stage of a global SAR register 221a.

At a timing t99, in a case of the logic circuit 212 of the first column (i=1), the local signal $y_i$=0 and the global signal BOT_K, and this means that there is no possibility that the signal $V_i$ corresponds to bottom K cosine similarities. Therefore, the logic circuit 212 of the first column changes the minimum value flag from MIN_FLAG$_i$=H (or 1) to MIN_FLAG$_i$=L (or 0) and changes the disable signal from DISABLE$_i$=L (or 0) to DISABLE$_i$=H (or 1). As a result, as indicated by a dotted line for the waveform of the signal $V_i$, the comparator 211 of the first column receives the disable signal DISABLE$_i$=H (or 1) and the operation thereof is disabled, and power consumption by the comparator 211 is stopped (power gating).

On the other hand, in a case of the logic circuits 212 of the third, and fifth to seventh columns (i=3, and 5 to 7), the local signal $y_i$=1 and the global signal BOT_K=1, and this means that the signal $V_i$ may correspond to bottom K cosine similarities. Therefore, the logic circuits 212 of the third, and fifth to seventh columns each maintain the minimum value flag at MIN_FLAG$_i$=H (or 1) and maintain the disable signal at DISABLE$_i$=L (or 0).

In a case where the number of bits according to the precision of the conversion is B, at a timing t100 after B cycles (B=4), the processing circuit 1002 outputs (MIN_FLAG$_0$, MIN_FLAG$_1$, MIN_FLAG$_2$, MIN_FLAG$_3$, MIN_FLAG$_4$, MIN_FLAG$_5$, MIN_FLAG$_6$, and MIN_FLAG$_7$)=(L, L, L, L, L, L, L, and H) (or (0, 0, 0, 1, 0, 1, 1, and 1)) as a result of searching for bottom K cosine similarities. In this example, the result of searching for bottom K cosine similarities indicates that the signals $V_3$, and $V_5$ to $V_7$ of the third, and fifth to seventh columns are searched for as values corresponding to bottom K cosine similarities among the signals $V_0$ to $V_7$ of the zeroth to seventh columns.

Also with such a configuration, the processing circuit (SARMINKG circuit) 1002 uses the common global SAR DAC 1221, and thus, the circuit configuration can be simplified and the circuit area can be reduced as compared with the implementation using the AD converter for each column. In addition, since the number of comparators 1211 to be operated is gradually reduced, and the selective AD conversion operation is performed, power consumption can be reduced as compared with the implementation using the AD converter for each column. In addition, since the processing circuit 1002 performs a plurality of SAR type AD conversion processings using the scaled global reference signal in parallel on input signals of a plurality of columns by applying binary search, to searc for bottom K cosine similarities in parallel, it is possible to easily increase the operation speed. Therefore, the circuit area and power consumption may be reduced and the operation speed can be increased.

Sixth Embodiment

Next, a computation system 1 according to a sixth embodiment will be described. In the following, the parts different from the first to fifth embodiments will be mainly described.

In the second embodiment, the third embodiment, and the fifth embodiment, the specific configuration in the parallel counter 3222 is not mentioned, but in the sixth embodiment, an example of the specific configuration in the parallel counter 3222 will be described.

The parallel counter 3222 receives a local signal $y_i$ from a comparator 211 of each column, counts the number of local signals $y_i$ having a value of 1, outputs, in a case where the count value is K or more, a global signal TOP_K=H level (or 1), and outputs, in a case where the count value is less than K, the global signal TOP_K=L level (or 0). K is an arbitrary integer of 2 or more, and represents the number of top values to be searched for.

Figure 29:
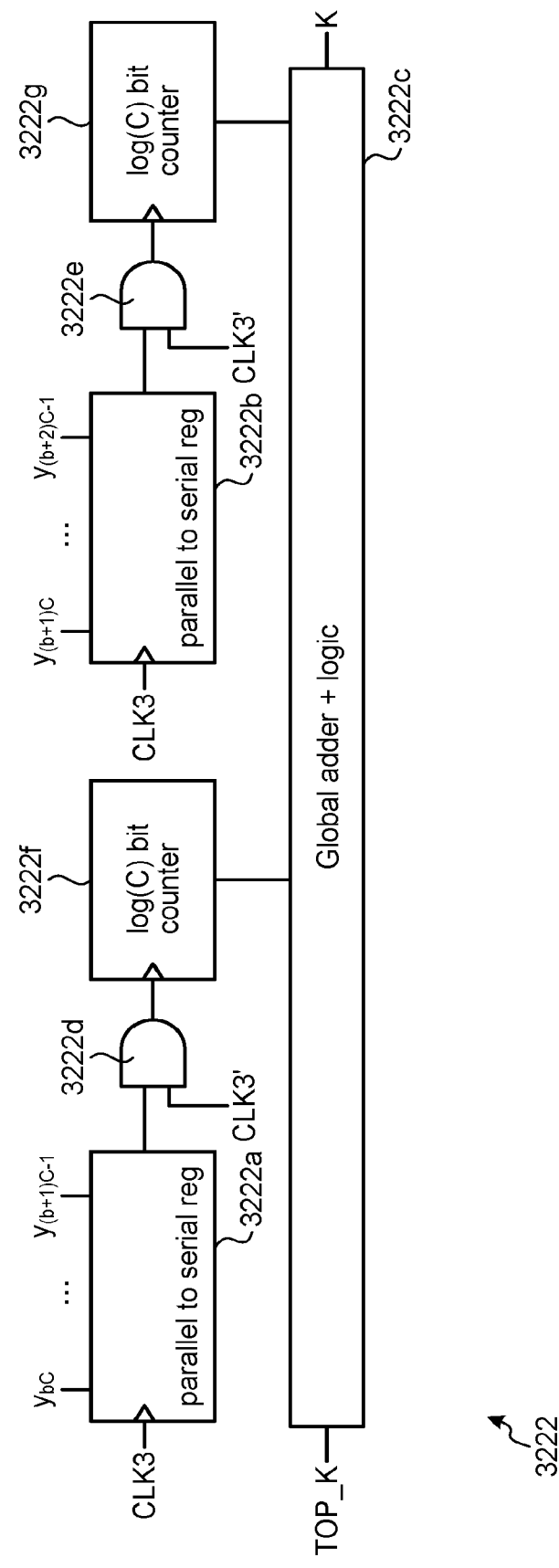
FIG. 29 is a circuit diagram illustrating a configuration of a parallel counter in a sixth embodiment.

The parallel counter 3222 may be configured in a digital domain, for example, as illustrated in FIG. 29. FIG. 29 is a circuit diagram illustrating a configuration of the parallel counter 3222 in the sixth embodiment. FIG. 29 illustrates a case where all columns in an array of a plurality of multiplication elements are divided into B banks, and each bank corresponds to C columns.

In the parallel counter 3222, shift registers 3222a and 3222b are provided for each bank. FIG. 29 illustrates a configuration in which the number of banks is two. The shift registers 3222a and 3222b each receive the local signal $y_i$ in parallel from a comparator 211 of each column of a corresponding bank. The shift registers 3222a and 3222b each have a plurality of stages of registers, shift a bit value of each stage as a serial bit pattern in synchronization with a clock CLK3, and supply the serial bit pattern to AND gates 3222d and 3222e. The AND gates 3222d and 3222e transfer the transferred serial bit pattern to bit counters 3222f and 3222g, respectively, at a timing delayed by a clock CLK3' which is different from the clock CLK3. Each of the bit counters 3222f and 3222g has a size of log$_2$ C, and counts the number of 1 in the serial bit pattern. A count value of each of the bit counters 3222*f* and 3222*g* is supplied to a global adder/logic circuit 3222*c*.

In an initial state, K (K is an arbitrary integer of 2 or more) is supplied to the global adder/logic circuit 3222*c*. Once the local signal $y_i$ is supplied from the comparator 211 of each column to the shift registers 3222*a* and 3222*b*, the shift registers 3222*a* and 3222*b* each shift a bit of each stage in synchronization with the clock CLK3, and once a serial bit pattern is supplied accordingly, each of the bit counters 3222*f* and 3222*g* starts the counting operation. Each of the bit counters 3222*f* and 3222*g* does not count up when 0 is supplied, but counts up when 1 is supplied. When all bits are shifted and count values of all bits are supplied to the global adder/logic circuit 3222*c*, the global adder/logic circuit 3222*c* adds the count value of each of the bit counters 3222*f* and 3222*g* and compares the addition result with K. The global adder/logic circuit 3222*c* outputs the H level (or 1) in a case where the addition result is equal to or more than K, and outputs the L level (or 0) in a case where the addition result is less than K.

As described above, according to the configuration illustrated in FIG. 29, the parallel counter 3222 may generate and output a global signal TOP_K indicating whether or not the number of local signals $y_i$ having a value of 1 is equal to or more than K.

Figure 30:
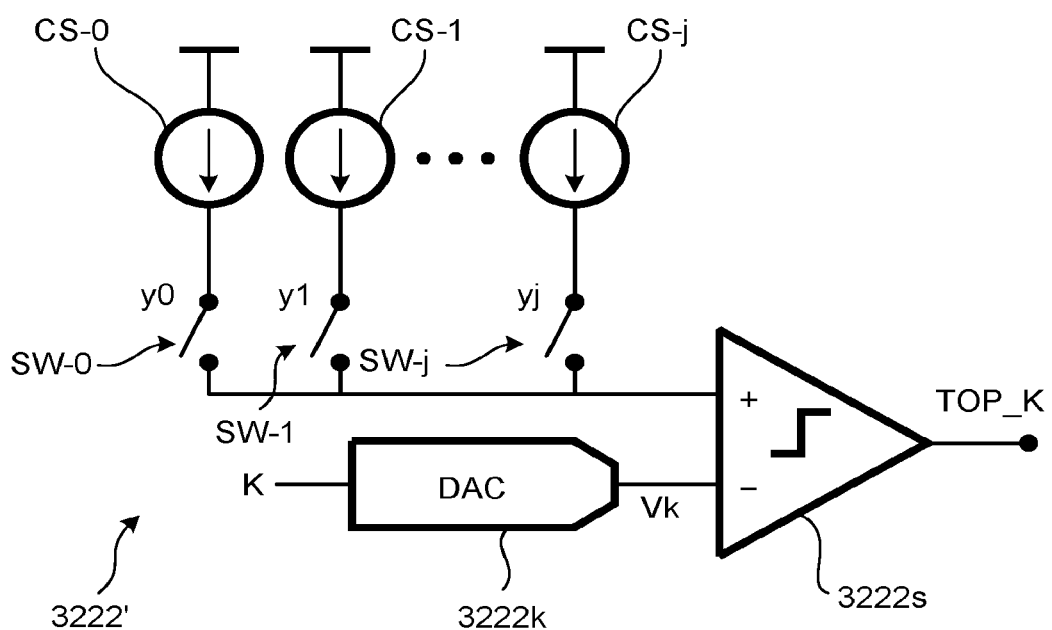
FIG. 30 is a circuit diagram illustrating a configuration of a parallel counter in a modified example of the sixth embodiment.

Note that a parallel counter 3222' may be configured in the analog domain, for example, as illustrated in FIG. 30. In a comparator 3222*s*, a non-inverting input terminal (+) is connected to a plurality of constant current sources CS-0 to CS-j via a plurality of switches SW-0 to SW-j, and an inverting input terminal (−) is connected to a DAC 3222*k*. The DAC 3222*k* performs DA conversion on K (K is an arbitrary integer of 2 or more) and supplies K as an analog voltage $V_K$ to the comparator 3222*s*. The plurality of switches SW-0 to SW-j correspond to local signals $y_0$ to $y_j$ of the respective columns. Each switch SW is maintained at a turned-on state when a value of a corresponding local signal y is 1, and each switch SW is maintained at a turned-off state when the value of the corresponding local signal y is 0. When the number of switches SW to be turned on among the plurality of switches SW-0 to SW-j is less than K, the voltage of the non-inverting input terminal (+) becomes lower than the analog voltage $V_K$, and the comparator 3222*s* outputs the L level. When the number of switches SW to be turned on among the plurality of switches SW-0 to SW-j is equal to or more than K, the voltage of the non-inverting input terminal (+) becomes higher than the analog voltage $V_K$, and the comparator 3222*s* outputs the H level.

As described above, according to the configuration illustrated in FIG. 30, the parallel counter 3222' may generate and output the global signal TOP_K indicating whether or not the number of local signals $y_i$ having a value of 1 is equal to or more than K.

Further, the parallel counters 4222 in the modified example of the second embodiment, the modified example of the third embodiment, and the modified example of the fifth embodiment may also be configured as illustrated in FIG. 29, or as illustrated in FIG. 30. The above description may be similarly applied by replacing TOP_K with BOT_K in the description.

(Appendix 1)

A computation system including:

a plurality of multiplication elements that are arranged so as to form a plurality of rows and a plurality of columns, and multiply a plurality of first signals by weights to generate a plurality of calculation results;

a plurality of addition elements that calculate the sum of calculation results of each column among the plurality of calculation results for each of the plurality of columns to generate a plurality of second signals; and a processing circuit that receives the plurality of second signals generated by the addition elements and extracts values corresponding to some of the plurality of second signals, in which the processing circuit includes:

a plurality of comparators that correspond to the respective columns, and each include a first input node, a second input node, and an output node, the first input node receiving any one of the second signals, the second input node receiving a signal corresponding to a global reference signal provided to each second input node, and the output node outputting a local signal; and a global circuit that is provided common to the plurality of comparators, generates a global signal according to a plurality of the local signals, and generates the global reference signal by an SAR method according to the global signal, and the processing circuit disables some of the plurality of comparators according to the local signals and the global signal.

(Appendix 2)

The computation system according to Appendix 1, in which the processing circuit further includes a plurality of logic circuits that correspond to the plurality of comparators, each determine whether or not any one of the second signals is a processing target according to the local signal and the global signal, and each generate a disable signal for disabling a corresponding comparator in a case where any one of the second signals is not the processing target.

(Appendix 3)

The computation system according to Appendix 1 or 2, in which the processing circuit processes, as part of the second signals, a second signal with the maximum level among the plurality of second signals.

(Appendix 4)

The computation system according to Appendix 2, in which in the plurality of comparators, the first input node is a non-inverting input node, and the second input node is an inverting input node, and each of the plurality of logic circuits generates a maximum flag value indicating whether or not the received second signal is a second signal with the maximum level, and the disable signal for disabling the comparator in a case where the received second signal is not the second signal with the maximum level.

(Appendix 5)

The computation system according to Appendix 1 or 2, in which the processing circuit processes, as part of the second signals, a second signal with the minimum level among the plurality of second signals.

(Appendix 6)

The computation system according to Appendix 2, in which in the plurality of comparators, the first input node is an inverting input node, and the second input node is a non-inverting input node, and each of the plurality of logic circuits generates a minimum flag value indicating whether or not the received second signal is a second signal with the minimum level, and the disable signal to disable the comparator in a case where the received second signal is not the second signal with the minimum level.
(Appendix 7)
The computation system according to Appendix 1 or 2, in which
the processing circuit processes, as the some second signals, second signals with top K levels among the plurality of second signals, K being an integer of 2 or more.
(Appendix 8)
The computation system according to Appendix 2, in which
in the plurality of comparators, the first input node is a non-inverting input node, and the second input node is an inverting input node, and
each of the plurality of logic circuits generates a high-order flag value indicating whether or not the second signal is one of second signals with top K levels, and the disable signal to disable the comparator in a case where the second signal is not one of the second signals with top K levels.
(Appendix 9)
The computation system according to Appendix 1 or 2, in which
the processing circuit processes, as the some second signals, second signals with bottom K levels among the plurality of second signals, K being an integer of 2 or more.
(Appendix 10)
The computation system according to Appendix 2, in which
in the plurality of comparators, the first input node is a non-inverting input node, and the second input node is an inverting input node, and
each of the plurality of logic circuits generates a low-order flag value indicating whether or not the second signal is one of second signals with bottom K levels, and the disable signal for disabling the comparator in a case where the second signal is not one of the second signals with bottom K levels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A computation system comprising:
a plurality of memories configured to arrange so as to form a plurality of rows and a plurality of columns, and to multiply a plurality of first signals by weights to generate a plurality of calculation results;
a plurality of lines configured to calculate a sum of calculation results of each column among the plurality of calculation results for each of the plurality of columns to generate a plurality of second signals; and
a processing circuit configured to receive the plurality of second signals generated by the lines and to extract values corresponding to some of the plurality of second signals, wherein
the processing circuit includes:
a plurality of comparators corresponding to the respective columns, each including a first input node, a second input node, and an output node, the first input node receiving any one of the second signals, the second input node receiving a signal corresponding to a global reference signal provided to each second input node, the output node outputting a local signal; and
a global circuit provided common to the plurality of comparators, the global circuit being configured to generate a global signal according to a plurality of the local signals and to generate the global reference signal by an SAR (Successive Approximation Register) method according to the global signal, and
wherein the processing circuit is configured to disable some of the plurality of comparators according to the local signals and the global signal.

2. The computation system according to claim 1, wherein the processing circuit further includes
a plurality of logic circuits corresponding to the plurality of comparators, each being configured to determine whether or not the any one second signal is a processing target according to the local signal and the global signal, and to generate a disable signal for disabling a corresponding comparator in a case where the any one second signal is not the processing target.

3. The computation system according to claim 2, wherein
in the plurality of comparators, the first input node is a non-inverting input node, and the second input node is an inverting input node, and
each of the plurality of logic circuits is configured to generate a maximum flag value indicating whether or not the second signal is a second signal having a maximum level, and the disable signal to disable the comparator in a case where the second signal is not the second signal having the maximum level.

4. The computation system according to claim 2, wherein
in the plurality of comparators, the first input node is an inverting input node, and the second input node is a non-inverting input node, and
each of the plurality of logic circuits is configured to generate a minimum flag value indicating whether or not the second signal is a second signal having a minimum level, and the disable signal to disable the comparator in a case where the second signal is not the second signal having the minimum level.

5. The computation system according to claim 2, wherein
in the plurality of comparators, the first input node is an inverting input node, and the second input node is a non-inverting input node, and
each of the plurality of logic circuits is configured to generate a high-order flag value indicating whether or not the second signal is one of second signals with top K levels, and the disable signal to disable the comparator in a case where the second signal is not one of the second signals with top K levels.

6. The computation system according to claim 2, wherein
in the plurality of comparators, the first input node is a non-inverting input node, and the second input node is an inverting input node, and
each of the plurality of logic circuits is configured to generate a low-order flag value indicating whether or not the second signal is one of second signals with bottom K levels, and the disable signal to disable the comparator in a case where the second signal is not one of the second signals with bottom K levels.

7. The computation system according to claim 1, wherein the processing circuit is further configured to process, as part of the second signals, a second signal having a maximum level among the plurality of second signals.

8. The computation system according to claim 1, wherein the processing circuit is further configured to process, as part of the second signals, a second signal having a minimum level among the plurality of second signals.

9. The computation system according to claim 1, wherein the processing circuit is further configured to process, as part of the second signals, second signals with top K levels among the plurality of second signals, K being an integer of 2 or more.

10. The computation system according to claim 1, wherein the processing circuit is further configured to process, as part of the second signals, second signals with bottom K levels among the plurality of second signals, K being an integer of 2 or more.

11. The computation system according to claim 1, wherein the processing circuit is further configured to process, as part of the second signals, a second signal having a maximum cosine similarity among the plurality of second signals.

12. The computation system according to claim 1, wherein the processing circuit is further configured to process, as part of the second signals, a second signal having a minimum cosine similarity among the plurality of second signals among the plurality of second signals.

13. The computation system according to claim 1, wherein the processing circuit is further configured to process, as part of the second signals, second signals with top K cosine similarities among the plurality of second signals, K being an integer of 2 or more.

14. The computation system according to claim 1, wherein the processing circuit is further configured to process, as part of the second signals, second signals with bottom K cosine similarities among the plurality of second signals, K being an integer of 2 or more.

15. The computation system according to claim 1, wherein
the global circuit is further configured to generate a plurality of the global reference signals, and
each of the plurality of comparators is configured to receive any one of the plurality of global reference signals at the second input node.

16. The computation system according to claim 1, wherein
the global circuit includes a global logical sum gate configured to compute a logical sum of a plurality of local signals to generate the global signal.

17. The computation system according to claim 1, wherein
the global circuit includes a counter configured to generate a top K signal indicating whether or not a number of local signals having a level higher than that of the global reference signal among a plurality of local signals is equal to or more than K.

18. The computation system according to claim 1, wherein
the global circuit includes a counter configured to generate a bottom K signal indicating whether or not a number of local signals having a level lower than that of the global reference signal among a plurality of local signals is equal to or more than K.

19. The computation system according to claim 1, wherein
the global circuit includes a plurality of gain amplifiers, each being configured to multiply the global reference signal with a gain and output a multiplication result to a local circuit of the column.

20. The computation system according to claim 19, wherein
the plurality of gain amplifiers are configured to perform multiplication of the global reference signal by a plurality of different gains and output a plurality of multiplication results,
each of the plurality of gains corresponds to any one of the plurality of comparators, and
the processing circuit includes a plurality of selectors, each being configured to select a multiplication result obtained by performing multiplication by a gain corresponding to the comparator among the plurality of multiplication results and to supply the selected multiplication result to the comparator.

* * * * *